(12) United States Patent
Fife et al.

(10) Patent No.: US 11,590,532 B2
(45) Date of Patent: Feb. 28, 2023

(54) ULTRASOUND TRANSDUCER DEVICES AND METHODS FOR FABRICATING ULTRASOUND TRANSDUCER DEVICES

(71) Applicant: BFLY OPERATIONS, INC., Burlington, MA (US)

(72) Inventors: Keith G. Fife, Palo Alto, CA (US); Jianwei Liu, Fremont, CA (US)

(73) Assignee: BFLY OPERATIONS, INC., Burlington, MA (US)

( * ) Notice: Subject to any disclaimer, the term of this patent is extended or adjusted under 35 U.S.C. 154(b) by 978 days.

(21) Appl. No.: 16/296,476

(22) Filed: Mar. 8, 2019

(65) Prior Publication Data

US 2019/0275561 A1    Sep. 12, 2019

Related U.S. Application Data

(60) Provisional application No. 62/641,160, filed on Mar. 9, 2018.

(51) Int. Cl.
*B06B 1/00*    (2006.01)
*B06B 1/02*    (2006.01)

(52) U.S. Cl.
CPC .......... *B06B 1/0292* (2013.01); *B06B 1/0207* (2013.01)

(58) Field of Classification Search
CPC ................ B06B 1/0292; B06B 1/0207; B81B 2201/0271; B81B 2203/0127;
(Continued)

(56) References Cited

U.S. PATENT DOCUMENTS 9,067,779 B1    6/2015 Rothberg et al.
9,242,275 B2    1/2016 Rothberg et al.
(Continued)

FOREIGN PATENT DOCUMENTS

CN    104620603 A    5/2015

OTHER PUBLICATIONS

Extended European Search Report for European Application No. 19763234.2, dated Oct. 26, 2021.
(Continued)

*Primary Examiner* — Matthew A Eason
(74) *Attorney, Agent, or Firm* — Osha Bergman Watanabe & Burton LLP

(57) ABSTRACT

Aspects of the technology described herein relate to ultrasound transducer devices including capacitive micromachined ultrasonic transducers (CMUTs) and methods for forming CMUTs in ultrasound transducer devices. Some embodiments include forming a cavity of a CMUT by forming a first layer of insulating material on a first substrate, forming a second layer of insulating material on the first layer of insulating material, and then etching a cavity in the second insulating material. A second substrate may be bonded to the first substrate to seal the cavity. The first layer of insulating material may include, for example, aluminum oxide. The first substrate may include integrated circuitry. Some embodiments include forming through-silicon vias (TSVs) in the first substrate prior to forming the first and second insulating layers (TSV-Middle process) or subsequent to bonding the first and second substrates (TSV-Last process).

19 Claims, 77 Drawing Sheets

(58) Field of Classification Search
CPC ...... B81B 2207/096; B81C 2203/0792; B81C 1/00238; H05K 1/115; H05K 3/4697
See application file for complete search history.

(56) References Cited

U.S. PATENT DOCUMENTS

| | | | |
|---|---|---|---|
| 9,394,162 B2 | 7/2016 | Rothberg et al. | |
| 9,499,392 B2 | 11/2016 | Rothberg et al. | |
| 9,596,528 B2 | 3/2017 | Shim et al. | |
| 9,910,017 B2 | 3/2018 | Rothberg et al. | |
| 9,910,018 B2 | 3/2018 | Rothberg et al. | |
| 10,175,206 B2 | 1/2019 | Rothberg et al. | |
| 10,228,353 B2 | 3/2019 | Rothberg et al. | |
| 10,247,708 B2 | 4/2019 | Rothberg et al. | |
| 2008/0139946 A1* | 6/2008 | Adachi | B06B 1/0292 600/463 |
| 2009/0122651 A1 | 5/2009 | Kupnik et al. | |
| 2011/0055447 A1 | 3/2011 | Costa | |
| 2014/0239769 A1 | 8/2014 | Johnson et al. | |
| 2014/0264660 A1* | 9/2014 | Rothberg | G01N 29/2406 438/51 |
| 2015/0145374 A1 | 5/2015 | Xu et al. | |
| 2016/0009544 A1 | 1/2016 | Rothberg et al. | |
| 2016/0009549 A1 | 1/2016 | Rothberg et al. | |
| 2016/0043660 A1* | 2/2016 | Wang | H02N 1/00 310/300 |
| 2016/0280538 A1 | 9/2016 | Rothberg et al. | |
| 2016/0290969 A1 | 10/2016 | Rothberg et al. | |
| 2016/0290970 A1 | 10/2016 | Rothberg et al. | |
| 2017/0050841 A1* | 2/2017 | Liu | B81B 7/02 |
| 2017/0117872 A1 | 4/2017 | Morton et al. | |
| 2017/0225196 A1* | 8/2017 | Rothberg | B06B 1/02 |
| 2017/0315099 A1 | 11/2017 | Rothberg et al. | |
| 2017/0360397 A1 | 12/2017 | Rothberg et al. | |
| 2018/0003678 A1 | 1/2018 | Rothberg et al. | |
| 2018/0065148 A1 | 3/2018 | Beckers et al. | |
| 2018/0364201 A1 | 12/2018 | Rothberg et al. | |
| 2018/0369862 A1 | 12/2018 | Alie et al. | |
| 2019/0142387 A1 | 5/2019 | Chen et al. | |

OTHER PUBLICATIONS

International Search Report and Written Opinion dated May 10, 2019 in connection with International Application No. PCT/US2019/021316.

International Preliminary Report on Patentability dated Sep. 24, 2020 in connection with International Application No. PCT/US2019/021316.

* cited by examiner

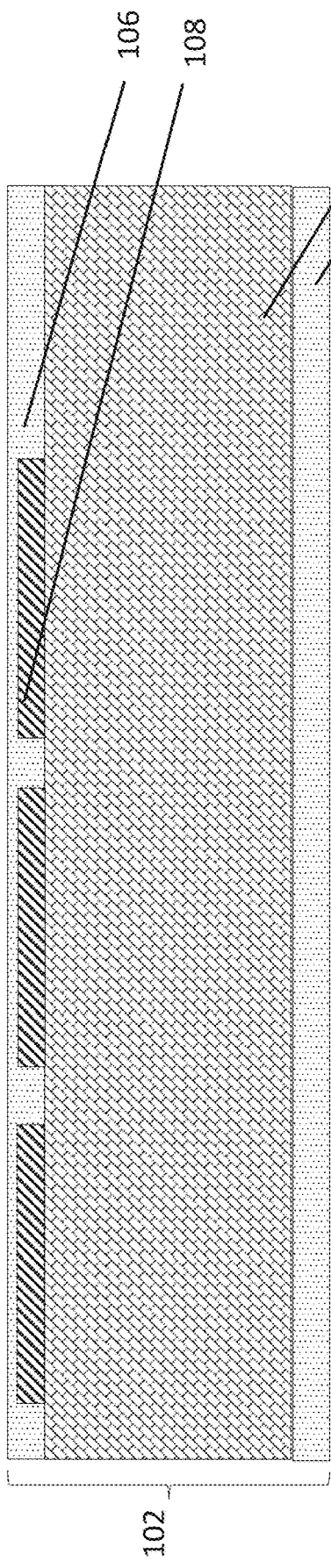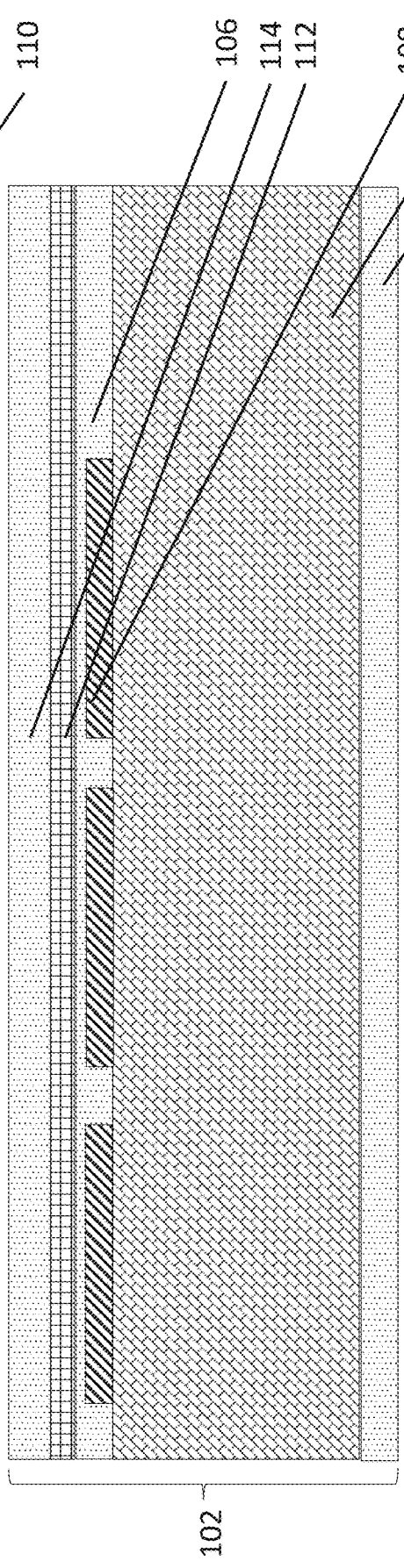

ULTRASOUND TRANSDUCER DEVICES AND METHODS FOR FABRICATING ULTRASOUND TRANSDUCER DEVICES

CROSS-REFERENCE TO RELATED APPLICATIONS

This application claims the benefit under 35 U.S.C. § 119(e) of U.S. Patent Application Ser. No. 62/641,160, filed Mar. 9, 2018, and entitled "ULTRASOUND DEVICES AND METHODS FOR FABRICATING ULTRASOUND DEVICES," which is hereby incorporated herein by reference in its entirety.

FIELD

Generally, the aspects of the technology described herein relate to ultrasound transducer devices and methods for fabricating ultrasound transducer devices.

BACKGROUND

Ultrasound transducer devices may be used to perform diagnostic imaging and/or treatment, using sound waves with frequencies that are higher with respect to those audible to humans. Ultrasound imaging may be used to see internal soft tissue body structures, for example to find a source of disease or to exclude any pathology. When pulses of ultrasound are transmitted into tissue (e.g., by using a probe), sound waves are reflected off the tissue with different tissues reflecting varying degrees of sound. These reflected sound waves may then be recorded and displayed as an ultrasound image to the operator. The strength (amplitude) of the sound signal and the time it takes for the wave to travel through the body provide information used to produce the ultrasound image. Many different types of images can be formed using ultrasound transducer devices, including real-time images. For example, images can be generated that show two-dimensional cross-sections of tissue, blood flow, motion of tissue over time, the location of blood, the presence of specific molecules, the stiffness of tissue, or the anatomy of a three-dimensional region.

SUMMARY

According to one aspect, a method of fabricating an ultrasound transducer device includes forming first and second insulating layers on a first substrate that includes an integrated circuit, with a first cavity in the second insulating layer, and bonding a second substrate to the first substrate to seal the first cavity. In some embodiments, the method further includes forming a through-silicon via (TSV) in the first substrate using a TSV-Middle process prior to forming the first and second insulating layers. In some embodiments, the method further includes forming a through-silicon via (TSV) in the first substrate using a TSV-Last subsequent to bonding the second substrate to the first substrate. In some embodiments, the second substrate comprises a silicon-on-insulator (SOI) substrate.

According to another aspect, a method of fabricating an ultrasound transducer device includes forming a first insulating layer on a first substrate; forming a second insulating layer on the first insulating layer; forming a first cavity in the second insulating layer; and bonding a second substrate to the first substrate to seal the first cavity, where the second substrate comprises integrated circuitry. In some embodiments, the method further includes forming a through-silicon via (TSV) in the second substrate using a TSV-Middle process prior to bonding the second substrate to the first substrate. In some embodiments, the method further includes forming a through-silicon via (TSV) in the second substrate using a TSV-Last subsequent to bonding the second substrate to the first substrate. In some embodiments, the first substrate comprises a silicon-on-insulator (SOI) substrate.

Some embodiments of any of the above methods include the following. In some embodiments, the first insulating layer comprises aluminum oxide. In some embodiments, the second insulating layer comprises silicon oxide. In some embodiments, the second substrate comprises a silicon oxide layer, and bonding the second substrate to the first substrate comprises forming a silicon oxide-silicon oxide bond between the silicon oxide layer on the second substrate and the second insulating layer on the first substrate.

In some embodiments, the method further includes forming a third insulating layer on the second substrate, where the third insulating layer comprises aluminum oxide. In some embodiments, the second insulating layer comprises silicon oxide, and bonding the second substrate to the first substrate comprises forming an aluminum oxide-silicon oxide bond between the third insulating layer on the second substrate and the second insulating layer on the first substrate.

In some embodiments, the method further includes forming a fourth insulating layer on the third insulating layer on the second substrate and forming a second cavity in the fourth insulating layer. In some embodiments, the fourth insulating layer comprises silicon oxide. In some embodiments, the second substrate comprises a silicon oxide layer, and bonding the second substrate to the first substrate comprises forming a silicon oxide-silicon oxide bond between the fourth insulating layer on the second substrate and the second insulating layer on the first substrate. In some embodiments, bonding the second substrate to the first substrate comprises aligning the first cavity with the second cavity.

In some embodiments, forming the first cavity in the second insulating layer comprises etching the second insulating layer down to the first insulating layer, and the first insulating layer serves as an etch stop layer for the etching. In some embodiments, the method further includes forming a fifth insulating layer on the first substrate, and forming the first insulating layer on the first substrate comprises forming the first insulating layer on the fifth insulating layer. In some embodiments, the fifth insulating layer comprises silicon oxide. In some embodiments, a thickness of the first insulating layer is between approximately 0.005 to 0.100 microns. In some embodiments, the method further includes forming a self-assembled monolayer (SAM) on the first insulating layer within the first cavity. In some embodiments, forming the first insulating layer comprises using atomic layer deposition (ALD). In some embodiments, forming the second insulating layer comprises using atomic layer deposition (ALD).

According to another aspect, an ultrasound transducer device includes a first substrate comprising integrated circuitry, a first insulating layer formed on the first substrate, a second insulating layer formed on the first insulating layer, a first cavity formed in the second insulating layer, and a second substrate bonded to the first substrate such that the second substrate seals the first cavity. In some embodiments, the ultrasound transducer device further includes a through-silicon via (TSV) in the first substrate. In some embodiments, the second substrate comprises a silicon-on-insulator (SOI) substrate.

According to another aspect, an ultrasound transducer device includes a first substrate, a first insulating layer formed on the first substrate, a second insulating layer formed on the first insulating layer, a first cavity formed in the second insulating layer, and a second substrate bonded to the first substrate such that the second substrate seals the first cavity, wherein the second substrate comprises integrated circuitry. In some embodiments, the ultrasound transducer device further includes a through-silicon via (TSV) in the second substrate. In some embodiments, the first substrate comprises a silicon-on-insulator (SOI) substrate.

Some embodiments of any of the above ultrasound transducer devices include the following. In some embodiments, the first insulating layer comprises aluminum oxide. In some embodiments, the second insulating layer comprises silicon oxide. In some embodiments, the second substrate comprises a silicon oxide layer, and a bond between the second substrate and the first substrate comprises a silicon oxide-silicon oxide bond between the silicon oxide layer on the second substrate and the second insulating layer on the first substrate.

In some embodiments, the ultrasound transducer device includes a third insulating layer formed on the second substrate, wherein the third insulating layer comprises aluminum oxide. In some embodiments, the second insulating layer comprises silicon oxide, and a bond between the second substrate and the first substrate comprises an aluminum oxide-silicon oxide bond between the third insulating layer on the second substrate and the second insulating layer on the first substrate.

In some embodiments, the ultrasound transducer device further includes a fourth insulating layer formed on the third insulating layer on the second substrate, and a second cavity formed in the fourth insulating layer. In some embodiments, the fourth insulating layer comprises silicon oxide. In some embodiments, the second substrate comprises a silicon oxide layer, and a bond between the second substrate and the first substrate comprises a silicon oxide-silicon oxide bond between the fourth insulating layer on the second substrate and the second insulating layer on the first substrate. In some embodiments, the first cavity is aligned with the second cavity.

In some embodiments, the ultrasound transducer device further includes a fifth insulating layer formed on the first substrate such that the first insulating layer is formed on the third insulating layer. In some embodiments, the fifth insulating layer comprises silicon oxide. In some embodiments, a thickness of the first insulating layer is between approximately 0.005 to 0.100 microns. In some embodiments, the ultrasound transducer device further includes a self-assembled monolayer (SAM) formed on the first insulating layer within the first cavity.

BRIEF DESCRIPTION OF THE DRAWINGS

Various aspects and embodiments will be described with reference to the following exemplary and non-limiting figures. It should be appreciated that the figures are not necessarily drawn to scale. Items appearing in multiple figures are indicated by the same or a similar reference number in all the figures in which they appear.

FIGS. 1-25 illustrate example cross-sections of an ultrasound transducer device during a fabrication sequence for forming the ultrasound transducer device in accordance with certain embodiments described herein. The fabrication sequence includes fabricating cavities for capacitive micromachined ultrasonic transducers (CMUTs) in a substrate that also includes integrated circuitry. The fabrication sequence further includes fabricating openings for wirebonding to metallization in the substrate that includes the integrated circuitry.

DETAILED DESCRIPTION

Figure 3:
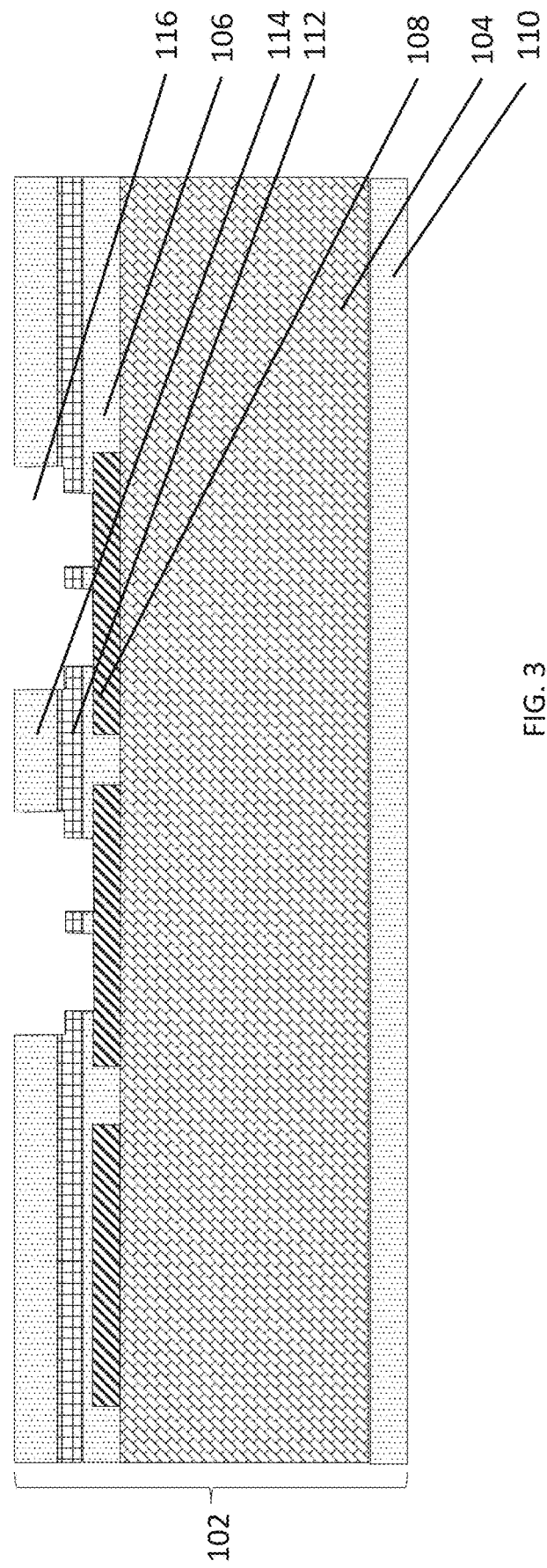

Described herein are ultrasound transducer devices including capacitive micromachined ultrasonic transducers (CMUTs) and methods for forming CMUTs in ultrasound transducer devices. A CMUT may include a cavity, a bottom electrode, and a top membrane. Due to electrical signals applied between the bottom electrode and the top membrane, the top membrane may vibrate and transmit ultrasonic signals. Additionally, received ultrasonic signals may cause the top membrane to vibrate and the vibration may generate an electrical signal between the bottom electrode and the top membrane. Some embodiments include forming a cavity of a CMUT by forming a first layer of insulating material on a first substrate, forming a second layer of insulating material on the first layer of insulating material, and then etching a cavity in the second insulating material. The first substrate may be a complementary metal-oxide-semiconductor (CMOS) substrate including integrated circuitry. A second substrate may be bonded to the first substrate to seal the cavity, and that second substrate may include the top membrane of the CMUT. The second substrate may be a silicon-on-insulator (SOI) substrate.

The first layer of insulating material may include, for example, aluminum oxide, and the second layer of insulating material may include, for example, silicon oxide. Thus, aluminum oxide material from the first insulating layer may be disposed at the bottom of the cavity and may help to reduce charging of the membrane if the membrane contacts the bottom of the cavity during device operation (e.g., during a "collapse mode" of transducer operation) which can negatively affect device performance. For example, the charging at the bottom of the cavity may counteract electrical signals applied or generated between the bottom electrode and the top membrane.

Some embodiments include forming an insulating layer, such as aluminum oxide, on the second substrate, such that the top of the cavity includes aluminum oxide that can reduce charging at the top of the cavity. Some embodiments include forming a first layer of insulating material (e.g., aluminum oxide) on the second substrate, forming a second layer of insulating material (e.g., silicon oxide) on the first layer of insulating material, and then etching a cavity in the second insulating material. The cavities on the top and bottom substrates may then be aligned and the two substrates may be bonded together. This may enable the bond between the two substrates to be a silicon oxide-silicon oxide bond, which may be a stronger and/or more reliable bond that bonds between different types of oxides. Some embodiments include just forming a cavity in the manner described above on the second substrate.

The methods described herein for forming cavities of CMUTs may provide an acceptably low amount of parasitic capacitance, which may improve sensing of ultrasonic signals; enable production with acceptably low cost and high volume; and provide a contact surface for bonding the first and second substrates with an acceptably high level of performance and reliability.

Some embodiments include forming through-silicon vias (TSVs) in the first substrate for transmitting electrical signals to and from integrated circuitry in the first substrate. Disclosed herein are methods for forming TSVs prior to bonding the first and second substrates (TSV-Middle process) or subsequent to bonding the first and second substrates (TSV-Last process). TSVs in an ultrasound transducer device may be helpful for the following reasons:

1. Compared with other interconnect for electrically connecting the ultrasound transducer device to the external environment that may require longer electrical paths, TSVs may present lower parasitic inductance and resistance, leading to higher power efficiency and less heating of the ultrasound transducer device.

2. Using TSVs may facilitate using a surface mount technology (SMT) process for coupling the ultrasound transducer device to an interposer. It may be possible to solder bond most or all of the solder bumps of the interposer to the solder bumps of the ultrasound transducer device at once, and it may be possible to use a single machine to solder bond multiple ultrasound transducer devices to multiple interposers at once. In other words, using TSVs may facilitate a high throughput packaging process that may be better suited for packaging high volumes of ultrasound transducer devices.

3. During ultrasound imaging, the upper face of the ultrasound transducer device may be pressed against a subject. (It should be noted that one or more structures, such as an acoustic lens, may be disposed between the upper face of the ultrasound transducer device and the subject during imaging.) The TSVs are not disposed near the upper face of the ultrasound transducer device and accordingly may be less subject to damage due to this pressure.

4. Other interconnect structures for electrically connecting to the ultrasound transducer device may extend laterally from the upper face of the ultrasound transducer device. Accordingly, the upper face of the packaged ultrasound transducer device may be larger in size than the upper face of the ultrasound transducer device itself due to this lateral extension. (To measure these sizes, one may look downwards from a bird's-eye view at the packaged ultrasound transducer device. The size of the upper face of the packaged ultrasound transducer device may be the total area of the packaged ultrasound transducer device visible from a bird's-eye view when looking downwards at the ultrasound transducer device. The size of the upper face of the ultrasound transducer device may be the area of just the ultrasound transducer device visible from a bird's-eye view when looking downwards at the ultrasound transducer device, excluding any interconnect or other packaging.) As discussed above, TSVs are not disposed near the upper face of the ultrasound transducer device, and therefore do not contribute significantly to the size of the upper face of the ultrasound transducer device. In some embodiments, the size of the upper face of the packaged ultrasound transducer device may be approximately the same as the size of the upper face of the unpackaged ultrasound on a chip. (For example, the size of the upper face of the packaged ultrasound transducer device may between or including 100%-101%, 100%-105%, 100%-110%, 100%-120%, 100%-125%, 100%-130%, 100%-140%, or 100%-150% of the size of the upper face of the unpackaged ultrasound transducer device).

Avoiding increasing the size of the upper face of the packaged ultrasound transducer device with interconnect may help to reduce the overall size of the ultrasound transducer device and enable form factors for the ultrasound transducer device such as ultrasound patches. Reducing the overall size of the ultrasound transducer device may also reduce costs in producing the ultrasound transducer device. Additionally, avoiding increasing the size of the upper face of the packaged ultrasound transducer device with interconnect may, for example, help the upper face of the packaged ultrasound transducer device fit between a subject's ribs during imaging. This may be especially helpful for cardiac imaging. Additionally, avoiding increasing the size of the upper face of the packaged ultrasound transducer device with interconnect may help to reduce the amount of acoustic lens material that is deposited on the upper face of the packaged ultrasound transducer device. In particular, reducing the thickness of the acoustic lens material may help to reduce attenuation of pressure waves generated by the ultrasound transducer device.

It should be appreciated that as used in the description and the claims, forming a first layer "on" a second layer may mean that the first layer is formed directly on the second layer or that the first layer is formed on one or more other layers that are between the first layer and the second layer. Forming a first layer "on" a substrate may mean that the first layer is formed directly on the substrate or that the first layer is formed on one or more other layers that are between the first layer and the substrate.

It should be appreciated that the embodiments described herein may be implemented in any of numerous ways. Examples of specific implementations are provided below for illustrative purposes only. It should be appreciated that these embodiments and the features/capabilities provided may be used individually, all together, or in any combination of two or more, as aspects of the technology described herein are not limited in this respect.

FIGS. 1-25 illustrate example cross-sections of an ultrasound transducer device during a fabrication sequence for forming the ultrasound transducer device in accordance with certain embodiments described herein. The fabrication sequence includes fabricating cavities for capacitive micromachined ultrasonic transducers (CMUTs) in a substrate that also includes integrated circuitry. The fabrication sequence further includes fabricating openings for wirebonding to metallization in the substrate that includes the integrated circuitry. It will be appreciated that the fabrication sequence shown is not limiting, and some embodiments may include additional steps and/or omit certain shown steps.

As shown in FIG. 1, a first substrate 102 includes a base layer (e.g., a bulk silicon wafer) 104, an insulating layer 106, and metallization 108. An insulating layer 110 is formed on the backside of the base layer 104. The metallization 108 may be formed of aluminum, copper, or any other suitable metallization material, and may represent at least part of an integrated circuit formed in the second substrate 102. For example, the metallization 108 may serve as routing layers, may be patterned to form one or more electrodes, or may be used for other functions. In some embodiments, the metallization 108 may be electrically connected to other metallization (e.g., routing layers) within the base layer 104. In some embodiments, the metallization 108 may be a redistribution layer (which may be post-processed, and may be made of an aluminum-copper alloy) that is electrically connected to other metallization within the base layer 104. Thus, in practice, the first substrate 102 may include more than one metallization layer and/or redistribution layer (which may be post-processed), but for simplicity only one metallization is illustrated. The first substrate 102 may be a complementary metal oxide semiconductor (CMOS) substrate fabricated at a commercial foundry. Semiconductor structures (not specifically shown in FIG. 1) such as transistors may be formed in the base layer 104 as part of front-end-of-line (FEOL) processes. The metallization 108 may be formed as part of back-end-of-line (BEOL) processes.

As shown in FIG. 2, layers 112 and 114 are formed on the first substrate 102. The layer 112 may be, for example, a nitride layer and may be formed by plasma enhanced chemical vapor deposition (PECVD). The layer 114 may be an oxide layer, for example formed by PECVD of oxide.

In FIG. 3, openings 116 are formed from the layer 114 to the metallization 108. Such openings are formed, for example, by patterning a photoresist layer (not shown) followed by etching exposed regions of layers 114 and 112 in preparation for forming electrodes.

Figure 4:
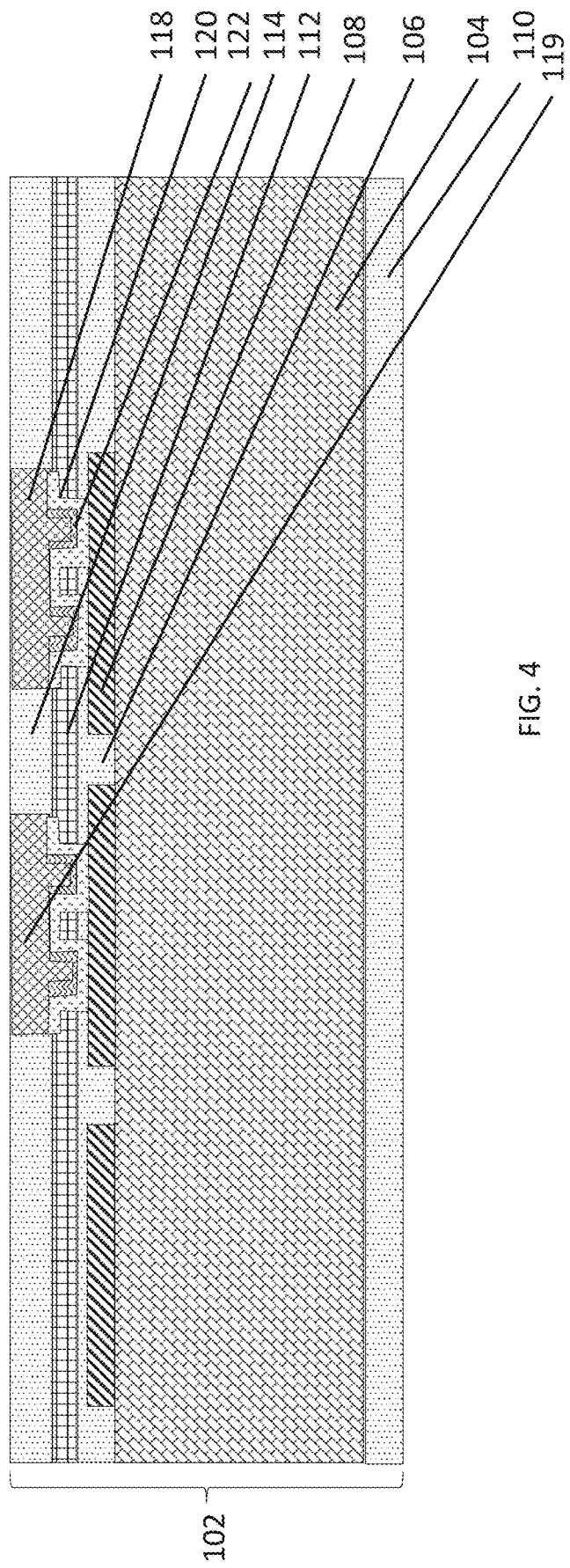

In FIG. 4, electrodes 118 and 119 are formed on the first substrate 102 (by suitable deposition and patterning). The electrodes 118 and 119 are shown adhered to the metallization 108 through adhesion structures 120 and 122. The electrodes 118 and 119 may include any suitable material (e.g., Al/Cu, Cu, Ti, TiN, W). The electrodes 118 and 119 may not be shown to scale, for example, downward protrusions shown in the electrodes 118 and 119 may be substantially smaller in height than the height of the rest of the electrodes 118 and 119. Chemical mechanical planarization (CMP) may be performed (e.g., to achieve roughness of the layer 114 that is less than 5 angstroms).

Figure 5:
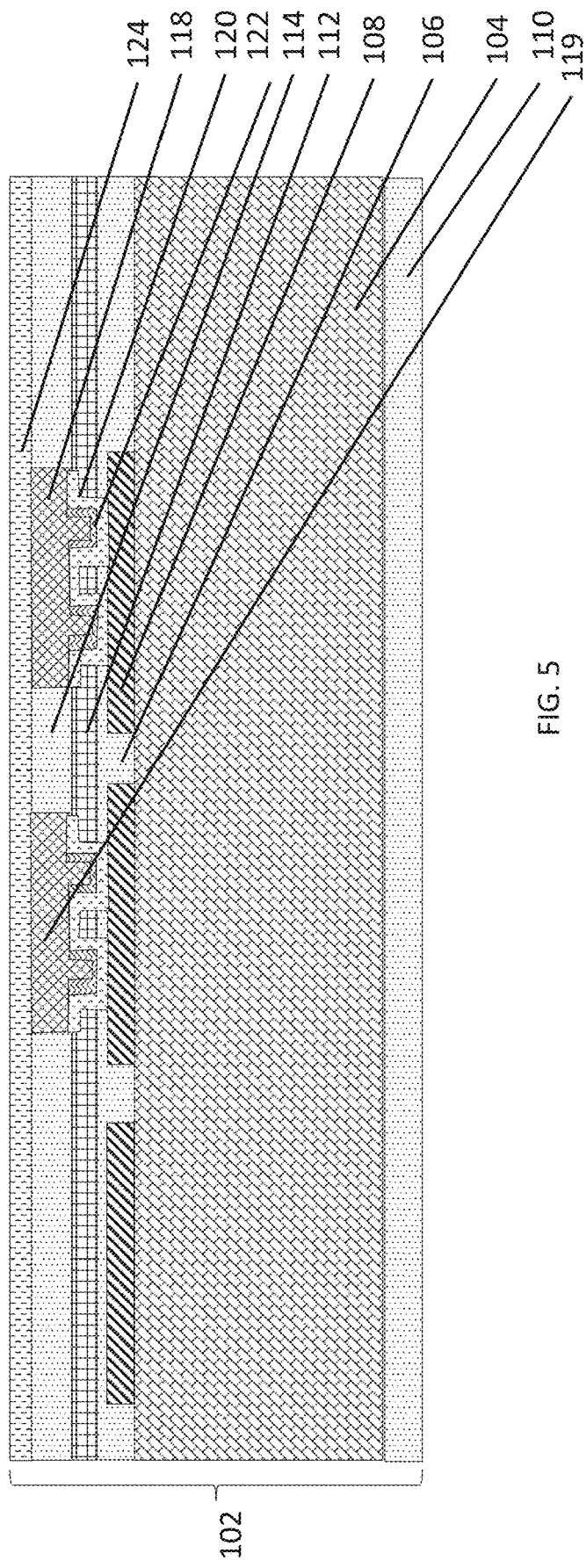

In FIG. 5, a first insulating layer 124 is formed on the first substrate 102. The first insulating layer 124 may include, for example, a high quality silicon oxide formed using atomic layer deposition (ALD). The first insulating layer 124 may be, for example, about 0.001 to 0.100 microns in thickness. For example, the first insulating layer 218 may be about 0.02 microns in thickness.

Figure 6:
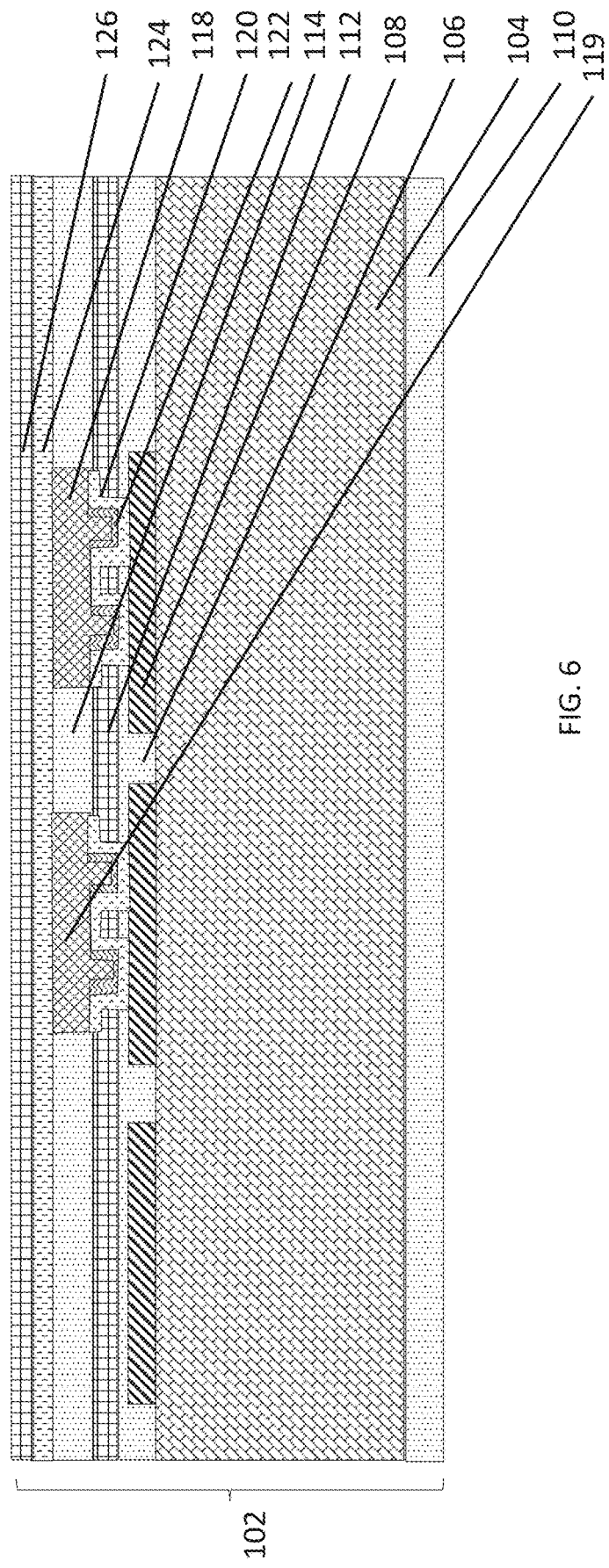

In FIG. 6, a second insulating layer 126 is formed on the first insulating layer 124. The second insulating layer 126 may include aluminum oxide ($Al_2O_3$) formed, for example, by atomic layer deposition (ALD). The second insulating layer 126 may be, for example, about 0.005 to 0.100 microns in thickness. For example, the second insulating layer 126 may be about 0.3 microns in thickness.

Figure 7:
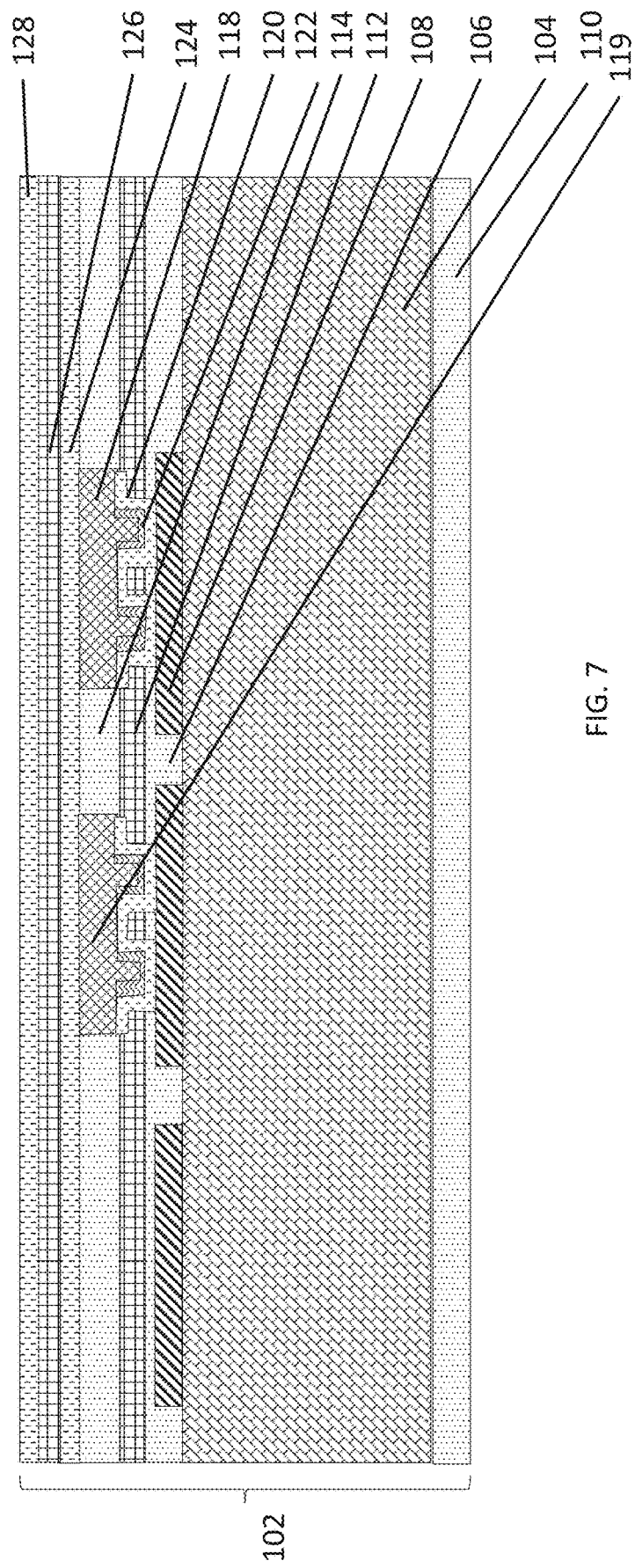

In FIG. 7, a third insulating layer 128 is formed on the second insulating layer 126. In one embodiment, the third insulating layer 128 has an etch selectivity with respect to the second insulating layer 126 and may include, for example, silicon oxide formed using plasma-enhanced chemical vapor deposition (PECVD). The third insulating layer 128 may be, for example, about 0.001 to 0.3 microns in thickness. For example, the third insulating layer 128 may be about 0.2 microns in thickness.

Figure 8:
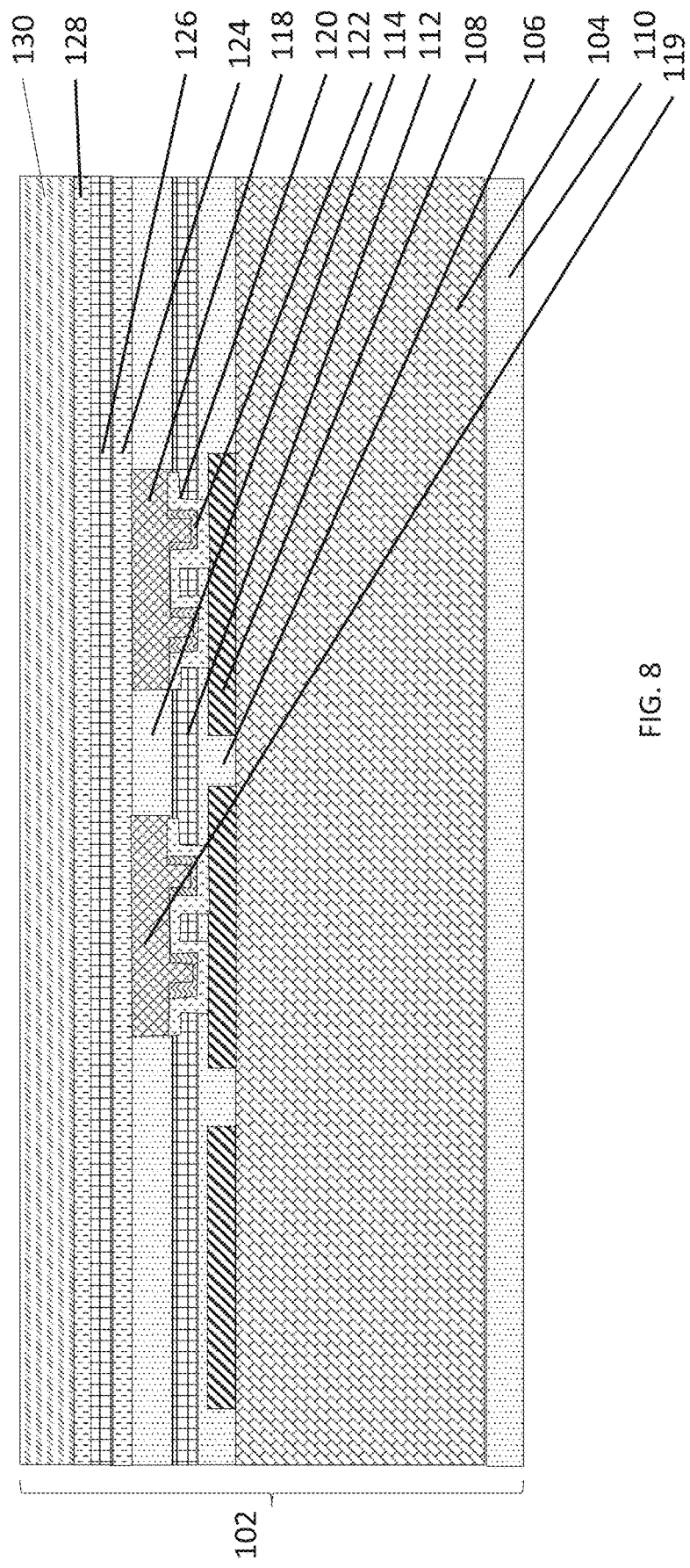
Figure 9:
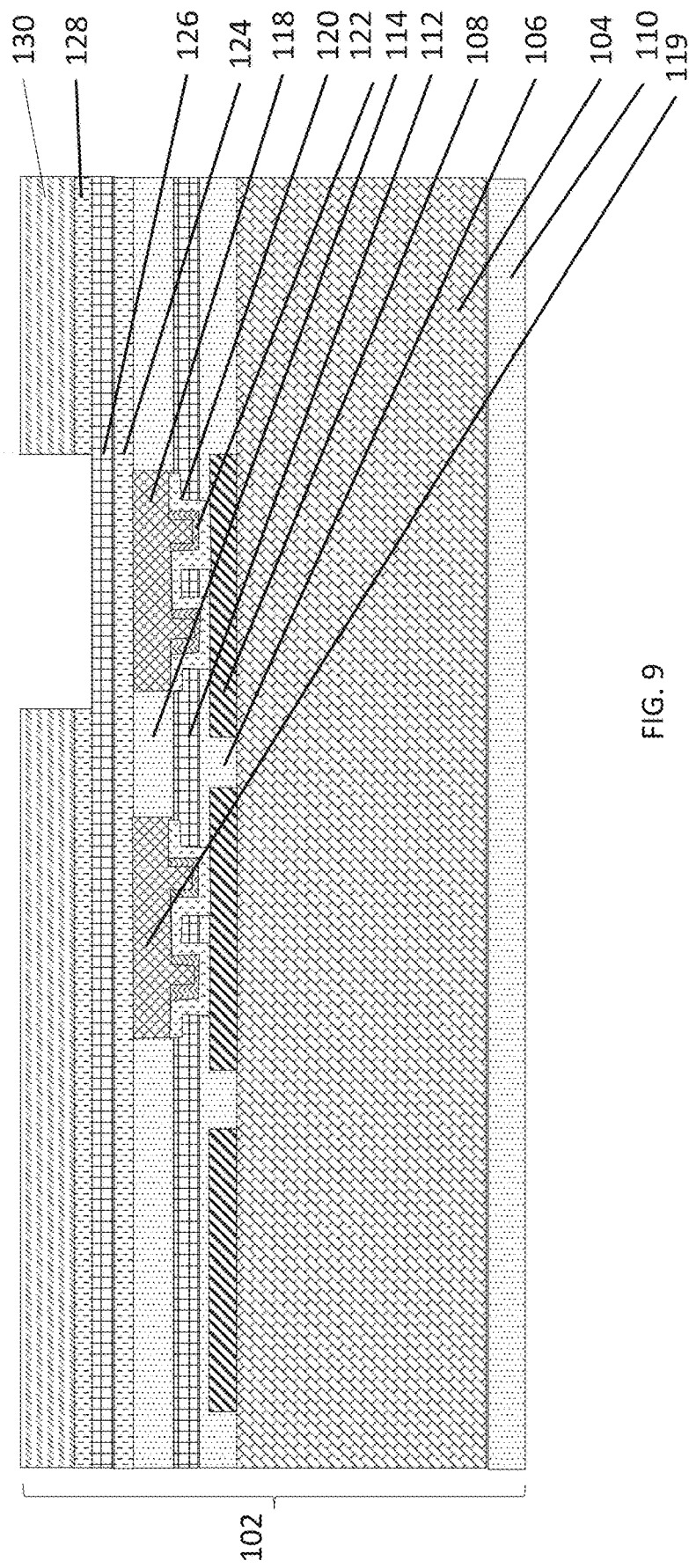

In FIG. 8, a resist layer 130 (e.g., photoresist) is formed over the third insulating layer 128 of the first substrate 102. In FIG. 9, the resist layer 130 is patterned (e.g., using a mask and optical exposure). The portions of the third insulating layer 128 exposed by the patterning are then etched (using any suitable etching agent), with the second insulating layer 126 serving as an etch stop layer. As will be described below, the patterned third insulating layer 128 may form cavities that are part of capacitive micromachined ultrasonic transducers (CMUTs). The CMUTs may include top membranes (described in further detail below) that vibrate within the cavities. Aluminum oxide material from the second insulating layer 126 present at the bottom of the cavities may help to reduce charging of the top membranes if the top membranes contact the bottom of the cavities during device operation (e.g., during a "collapse mode" of transducer operation).

Figure 10:
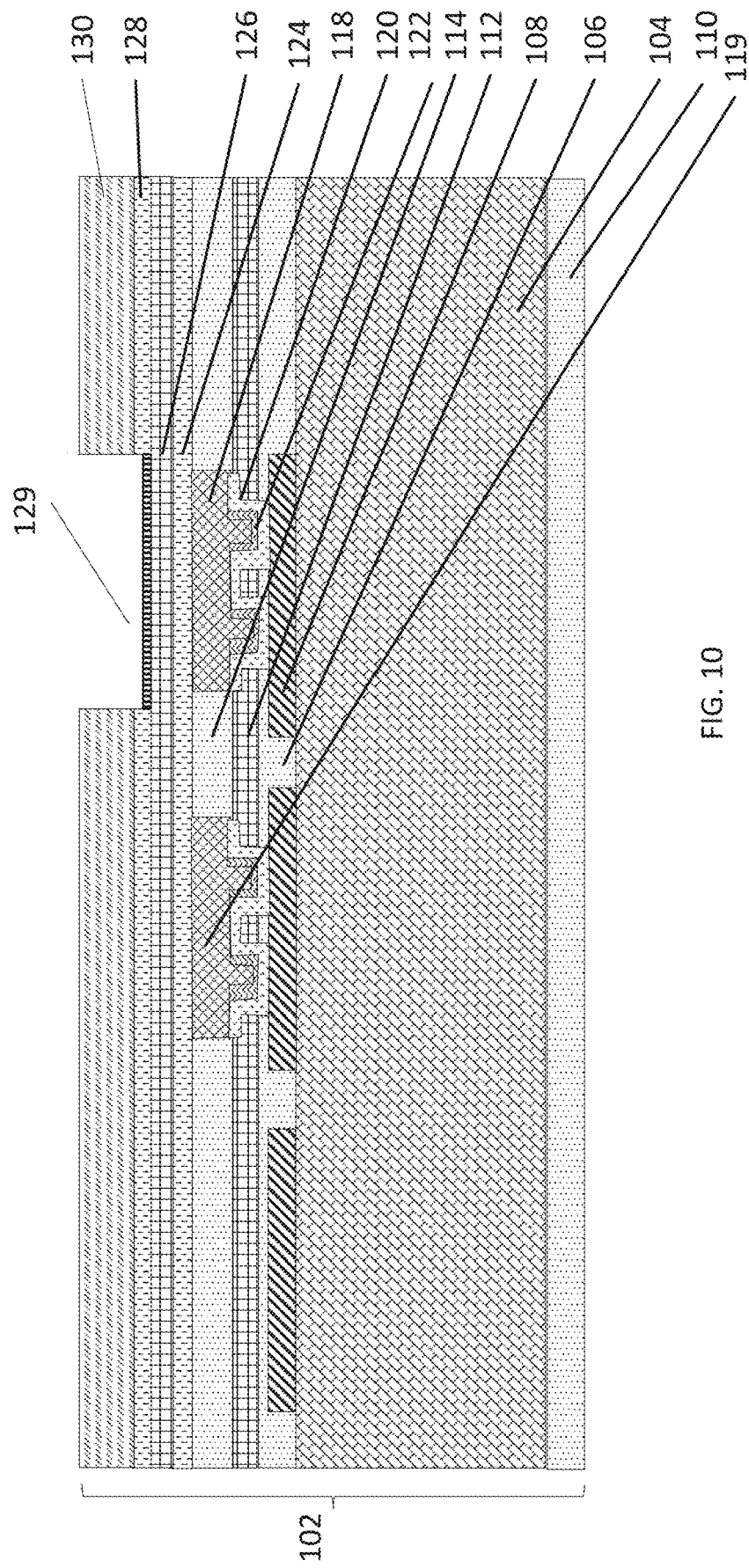

FIG. 10 illustrates an optional step in which a thin layer of aluminum oxide and then a thin layer of self-assembled monolayer (SAM) 129 (e.g., a SAM layer with heptadecafluoro tetrahydrodecyl trichlorosilane or dodecyltrichlorosilane as a precursor) is formed on the second insulating layer 126 after the patterning. (The thin layer of aluminum oxide is not shown individually as the second insulating layer 126 may also be aluminum oxide.) The self-assembled monolayer formed at the bottom of the cavities may help to reduce stiction of the top membranes to the bottom of the cavities if the top membranes contact the bottom of the cavities during device operation (e.g., during a "collapse mode" of transducer operation). Figures shown hereinafter do not shown the optional self-assembled monolayer 129, but it should be appreciated that the self-assembled monolayer 129 may be present in certain embodiments. In some embodiments, the thickness of the self-assembled monolayer 129 may be approximately 1 nanometer.

Figure 11:
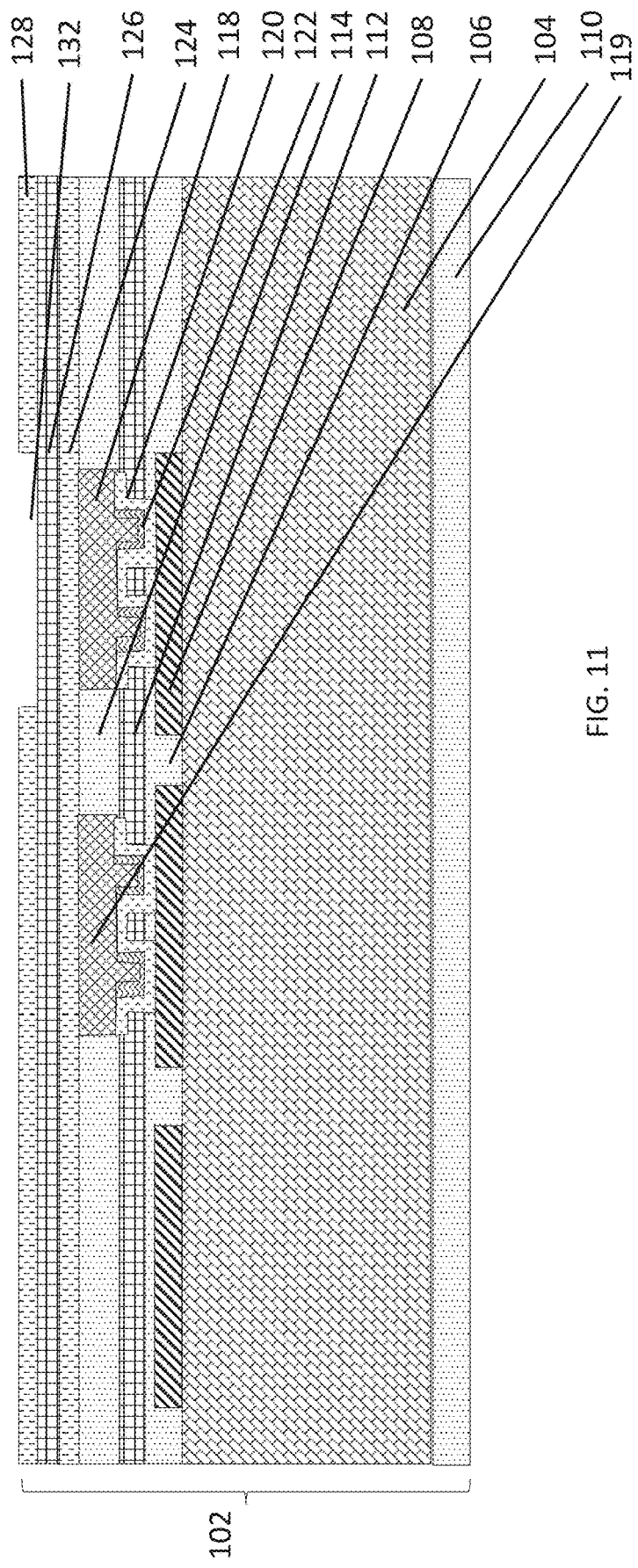

FIG. 11 illustrates the removal of the resist layer 130 (using any suitable stripping agent), and a resulting cavity 132 defined in the third insulating layer 128. Any suitable number and configuration of cavities 132 may be formed, as the aspects of the application are not limited in this respect. Thus, while only one cavity 132 is illustrated in the non-limiting cross-sectional view of FIG. 11, it should be appreciated that many more may be formed in some embodiments. For example, an array of cavities 132 may include hundreds of cavities, thousands of cavities, tens of thousands of cavities, or more to form an ultrasonic transducer array of a desired size.

The cavity 132 may take one of various shapes (viewed from a top side) to provide a desired membrane shape when the ultrasonic transducers are ultimately formed. For example, the cavity 132 may have a circular contour or a multi-sided contour (e.g., a rectangular contour, a hexagonal contour, an octagonal contour).

Figure 12:
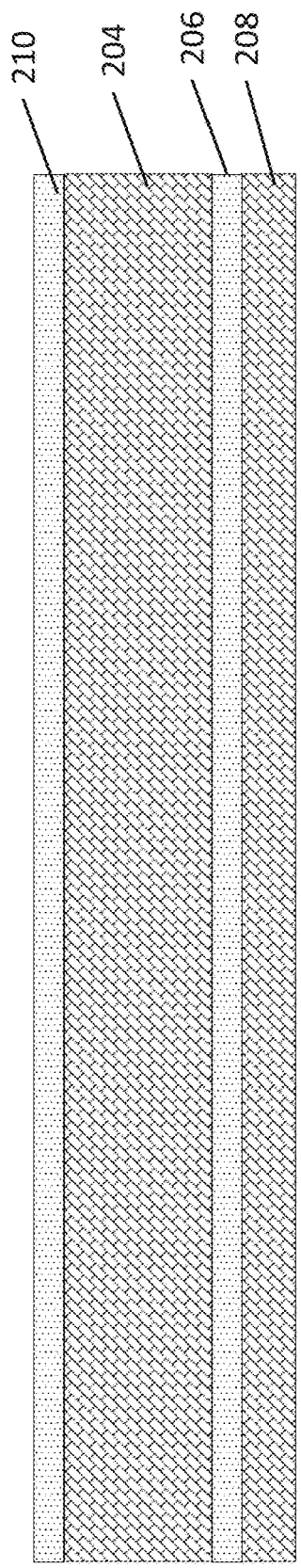

Referring now to FIG. 12, a second substrate 202 (which will provide a top membrane to seal the cavity 132 of the first substrate 102) is illustrated. The second substrate 202 may be, for example, a silicon-on-insulator (SOI) substrate that includes a handle layer 204 (e.g., a silicon handle layer), a buried oxide (BOX) layer 206, and a silicon device layer 208. An oxide layer 210 is provided on the backside of the handle layer 204. In some embodiments, the oxide layer 210 may be absent. The silicon device layer 208 may be formed of single crystal silicon and may be doped in some embodiments. In some embodiments, the silicon device layer 208 may be highly doped P-type, although N-type doping may alternatively be used. When doping is used, the doping may be uniform or may be patterned (e.g., by implanting in patterned regions). The silicon device layer 208 may already be doped when the SOI wafer is procured, or may be doped by ion implantation, as the manner of doping is not limiting. In some embodiments, the silicon device layer 208 may be formed of polysilicon or amorphous silicon. In either case the silicon device layer 208 may be doped or undoped.

Figure 13:
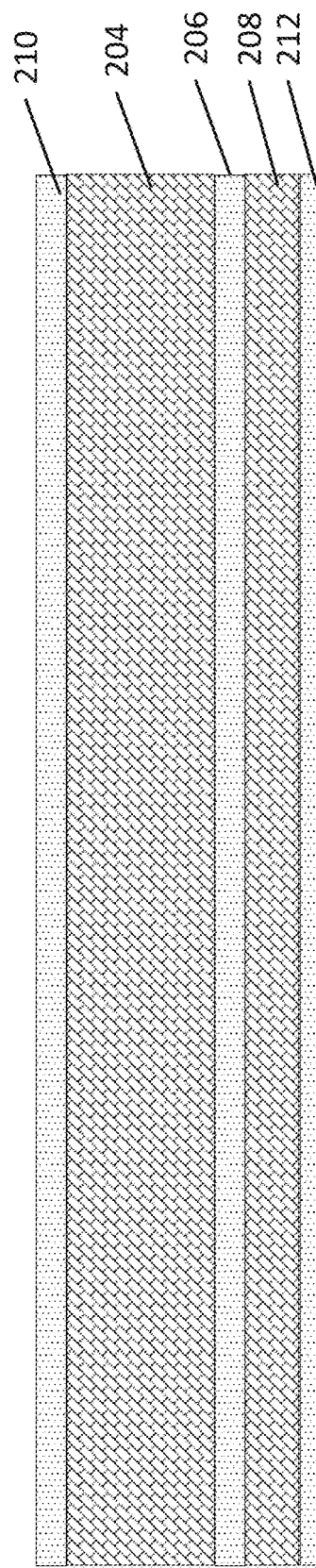

As shown in FIG. 13, an oxide layer 212 is formed on the second substrate 202. The oxide layer 212 may be a thermal silicon oxide, but it should be appreciated that oxides other than thermal oxide may alternatively be used.

Figure 14:
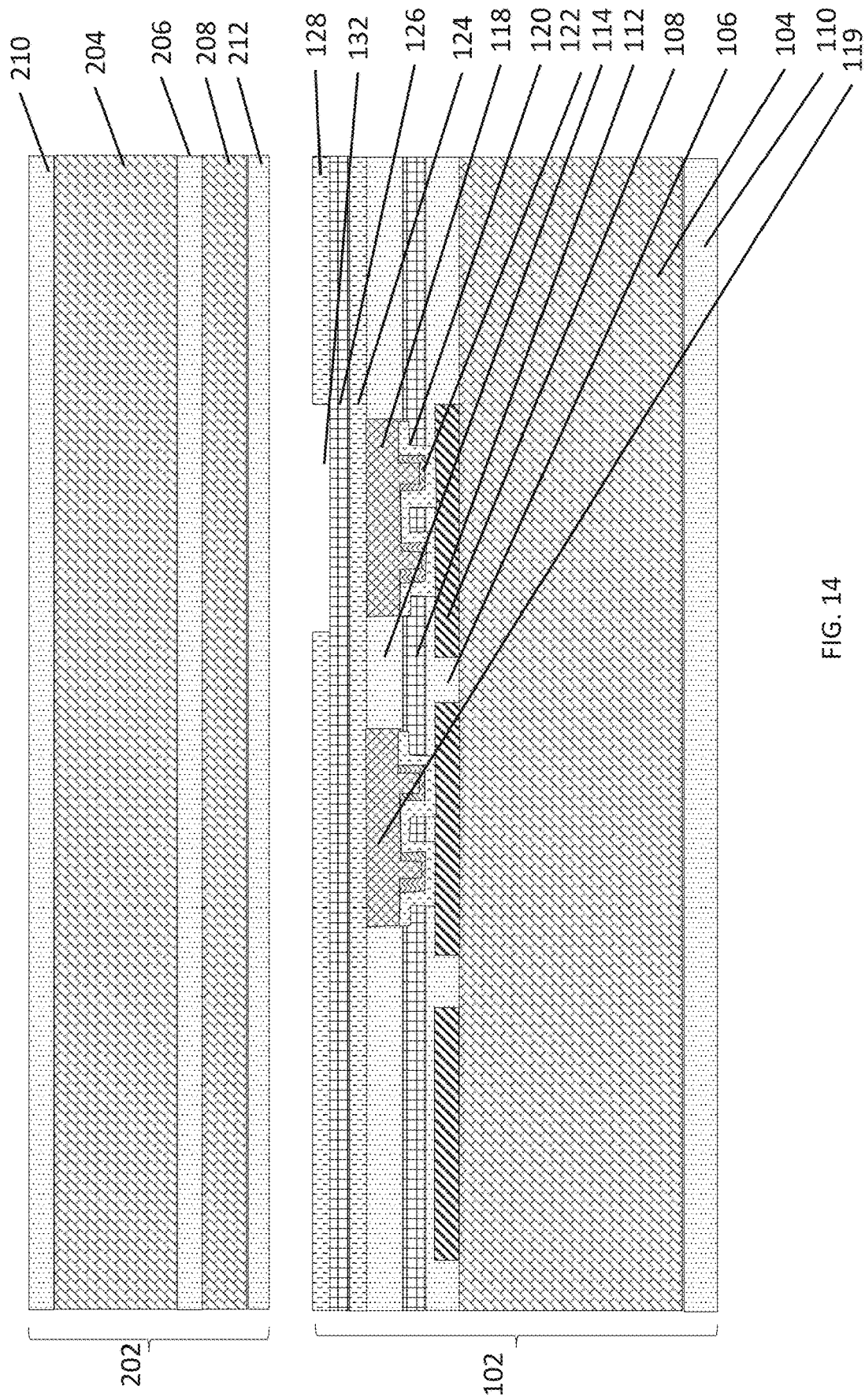
Figure 15:
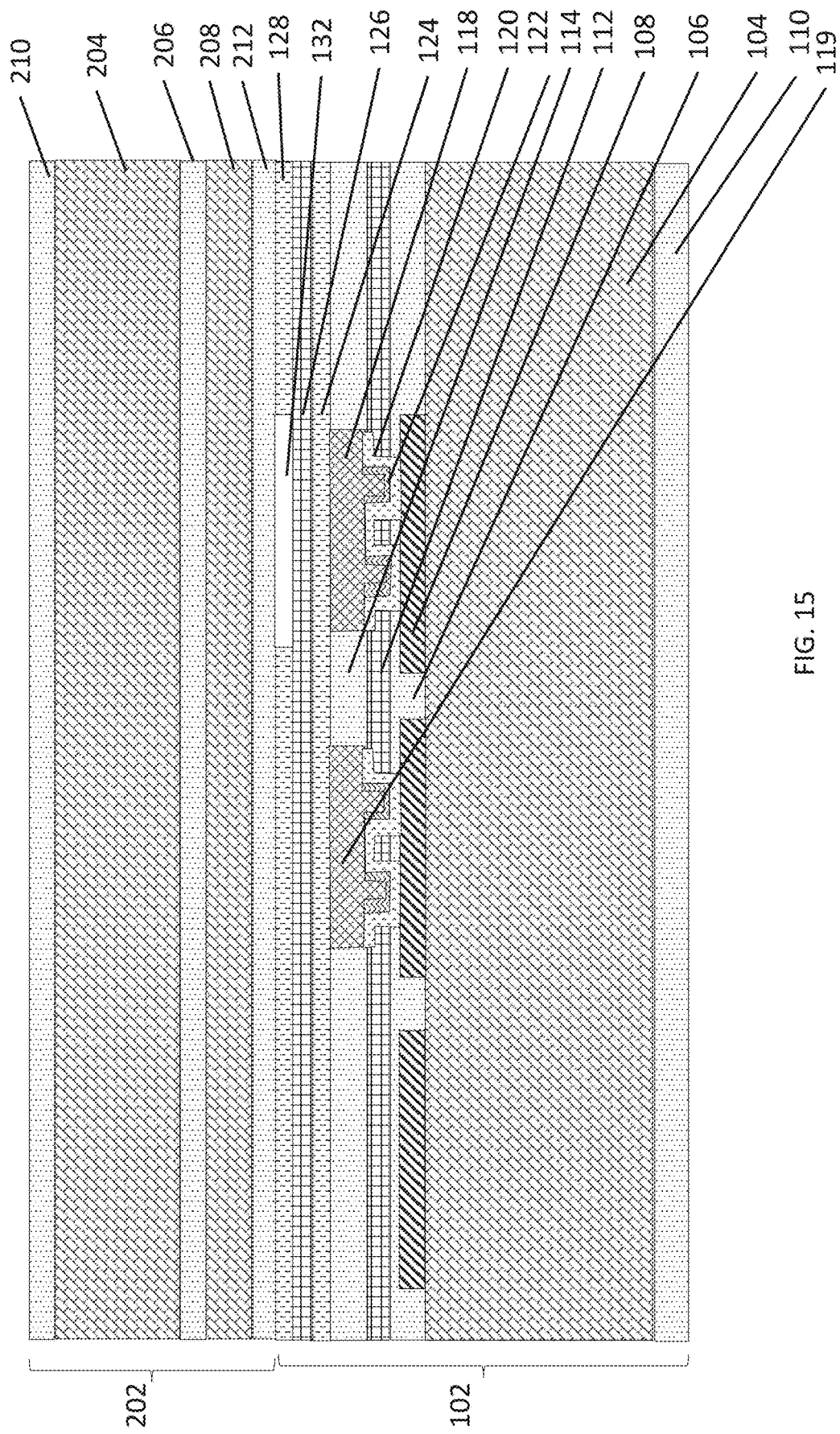

As shown in FIGS. 14-15, the first substrate 102 and the second substrate 202 are then bonded together. Such bonding may, in some embodiments, involve only the use of low temperature (e.g., below 450° C.) which may prevent damage to circuitry on the first substrate 102. In embodiments in which the third insulating layer 128 includes an oxide, the bond may be an oxide-oxide bond, namely a bond between the third insulating layer 128 (i.e., oxide) and the oxide layer 212. For example, in embodiments in which the third insulating layer 128 includes silicon oxide and the oxide layer 212 includes silicon oxide, the bond may be a silicon oxide-silicon oxide bond.

Figure 16:
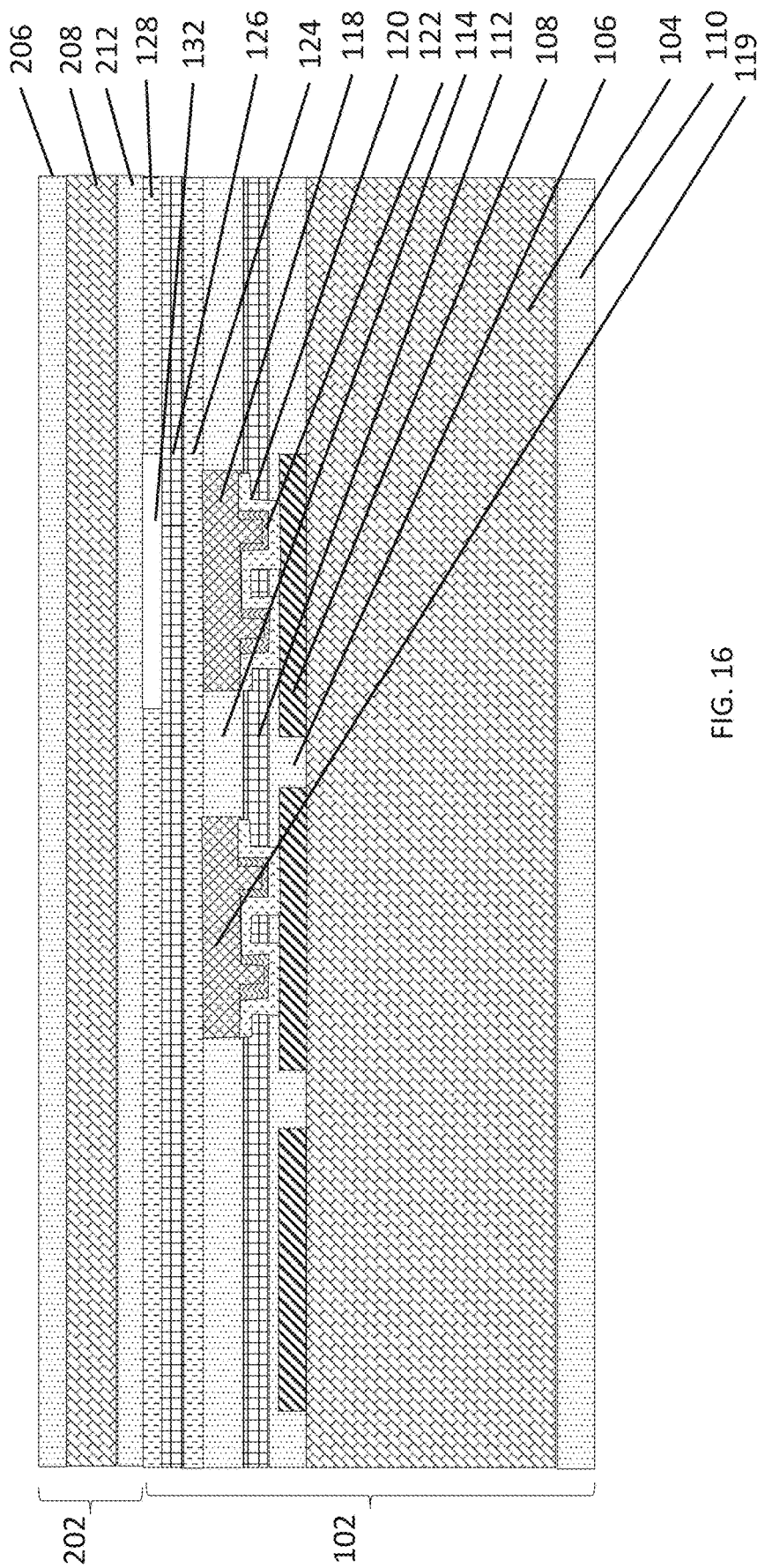

In FIG. 16, the oxide layer 210 and the handle layer 204 of the second substrate 202 are removed. For example, grinding, etching, or any other suitable technique or combination of techniques may be used. As will be discussed below, the remaining silicon device layer 208 and oxide layer 212 may define the top membrane(s) of one or more capacitive micromachined ultrasonic transducers (CMUTs).

Figure 17:
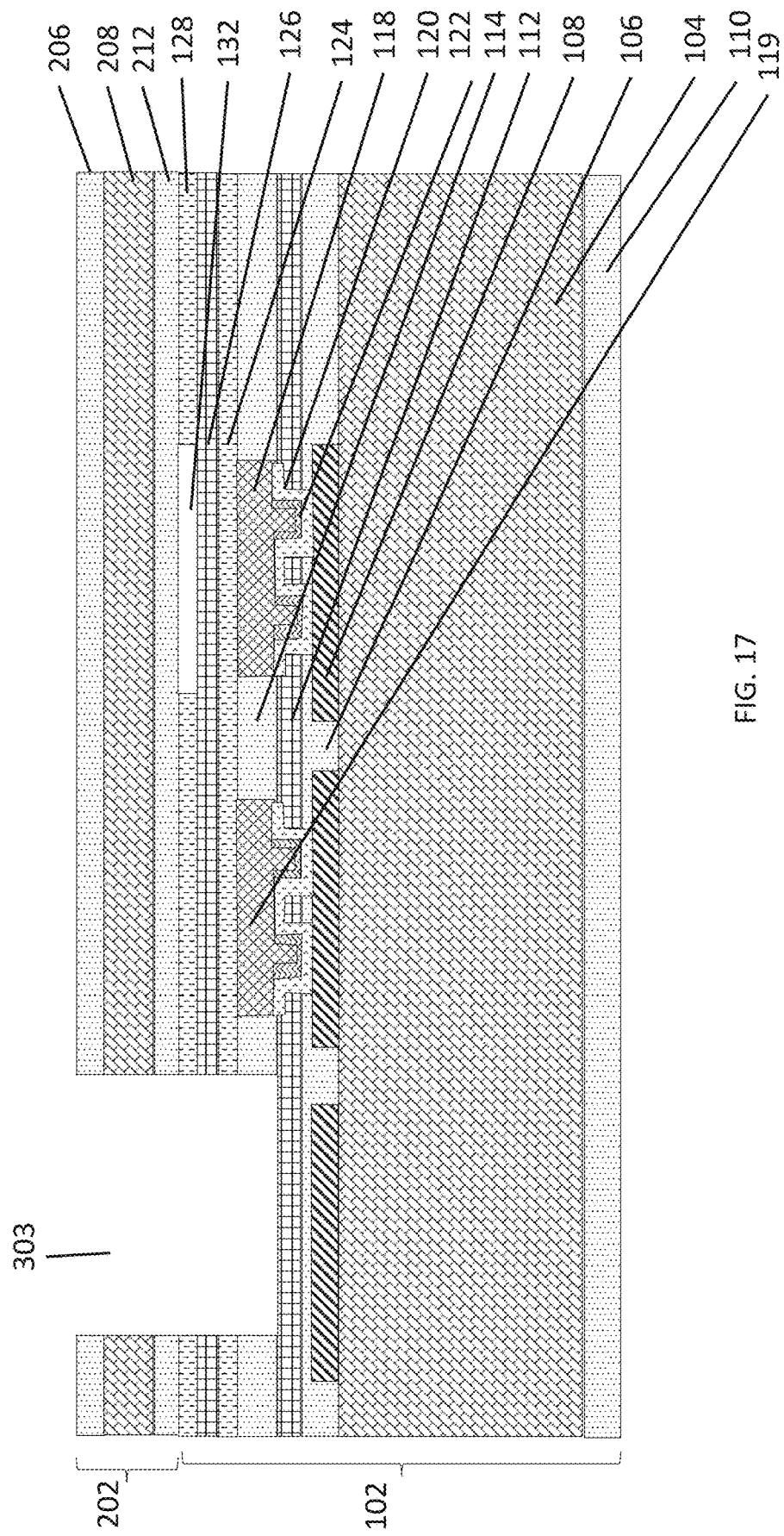

In FIG. 17, an opening 303 is formed in the silicon device layer 208, the oxide layer 212, the third insulating layer 128, the second insulating layer 126, the first insulating layer 124, and the layer 114. The opening 303 may be formed using any suitable patterning and etching agents.

Figure 18:
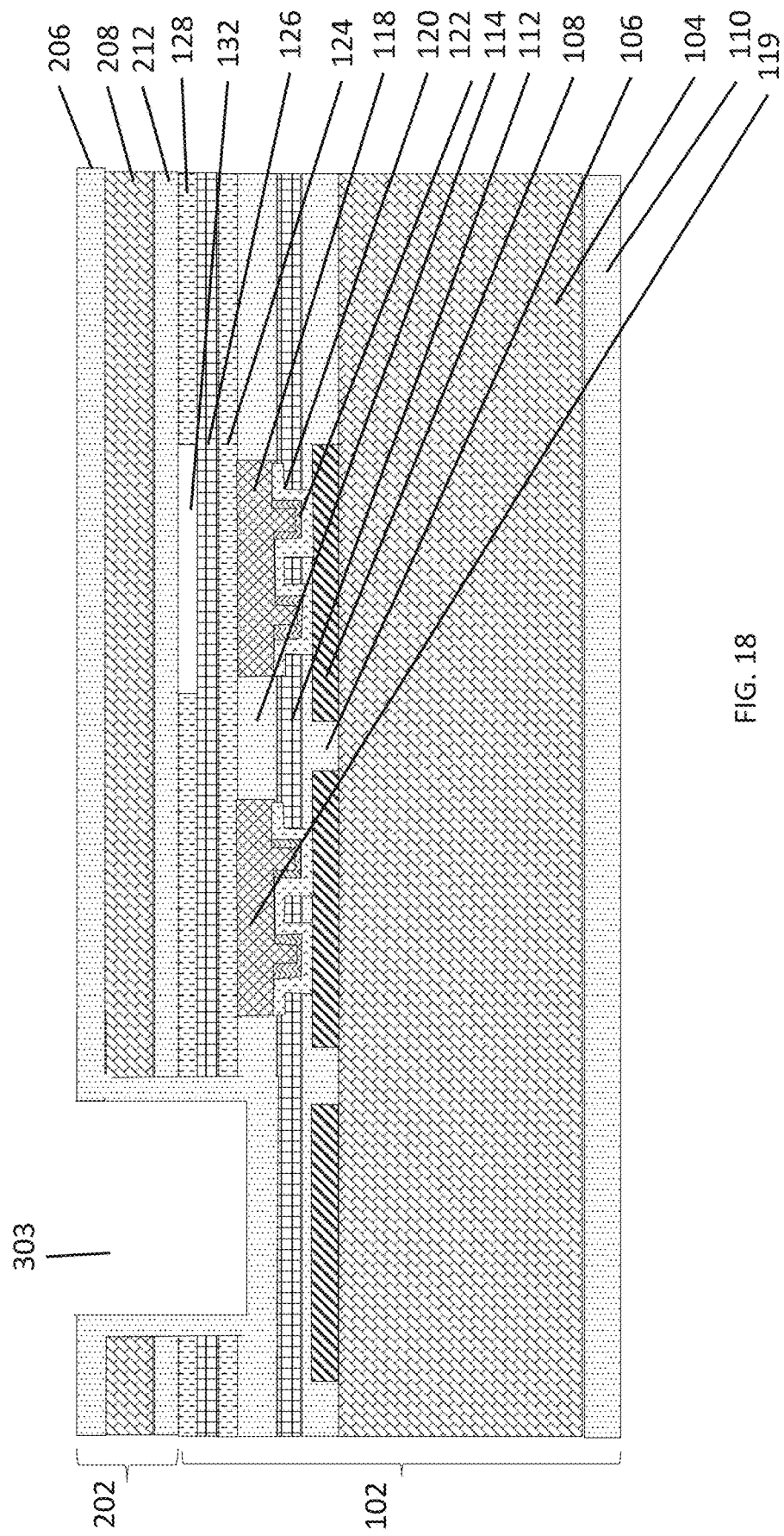

In FIG. 18, further material is added to the insulating layer 206 (e.g., silicon oxide) is formed on the second substrate 202. The insulating layer 206 lines the opening 303.

Figure 19:
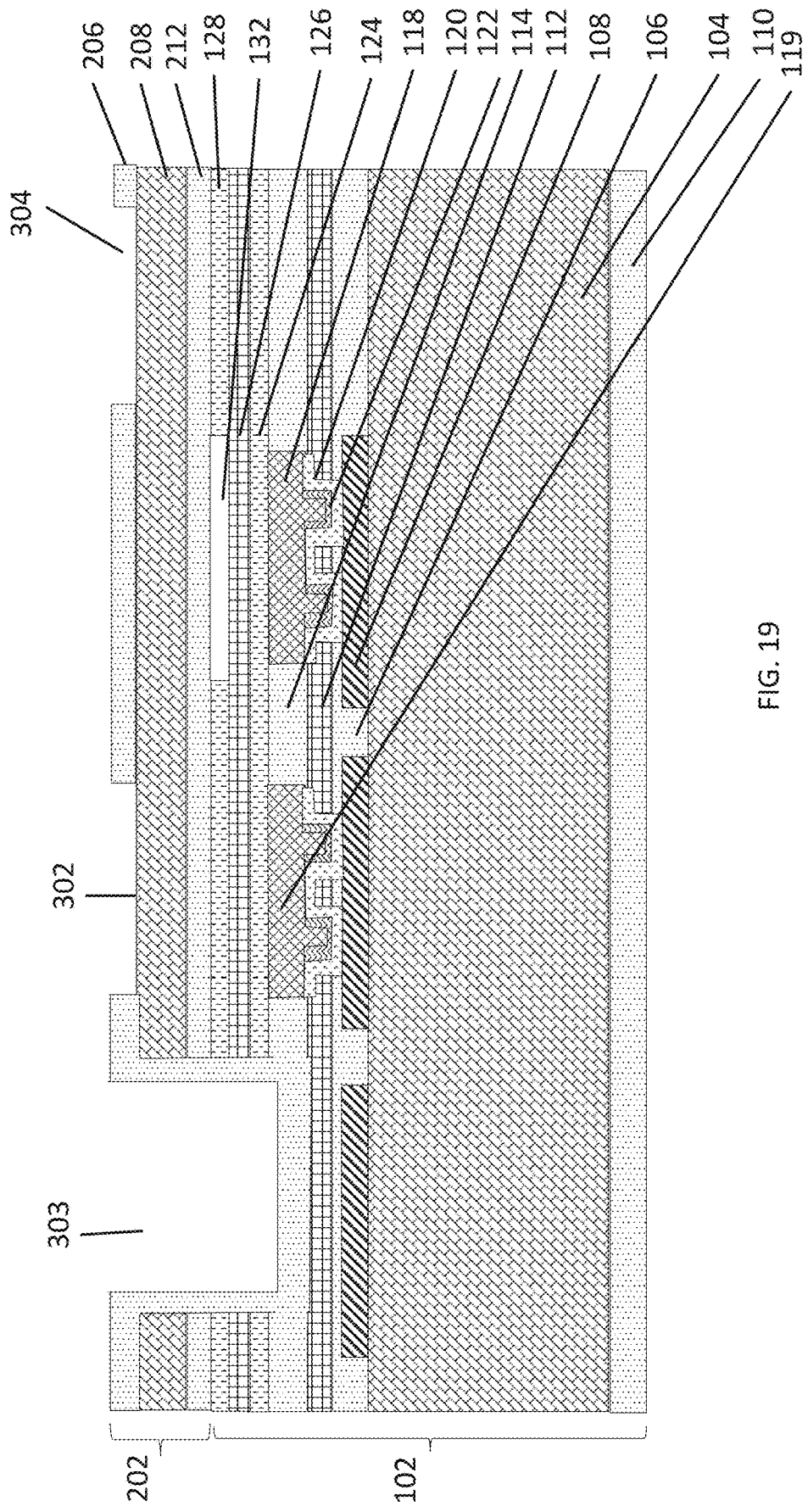
Figure 20:
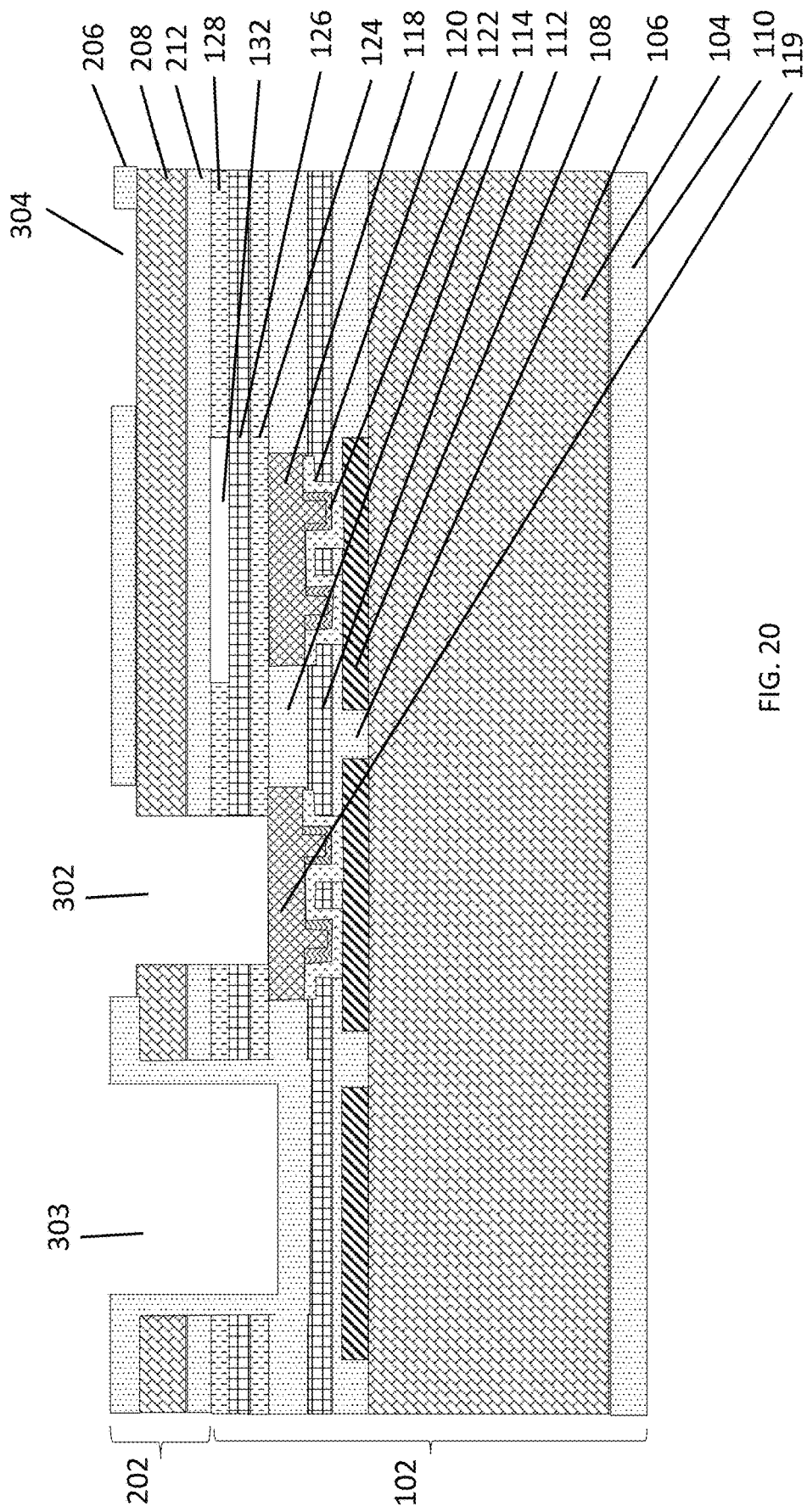

In FIGS. 19-20, an opening 302 is formed in the insulating layer 206, the silicon device layer 208, the oxide layer 212, the third insulating layer 128, the second insulating layer 126, and the first insulating layer 124. An opening 304 is formed in the insulating layer 206. The opening 302 and the opening 304 may be formed using any suitable patterning and etching agents. As will be described further below, the opening 302 and the opening 304 may be used to facilitate electrical contact between the first substrate 102 and top membranes of CMUTs.

Figure 21:
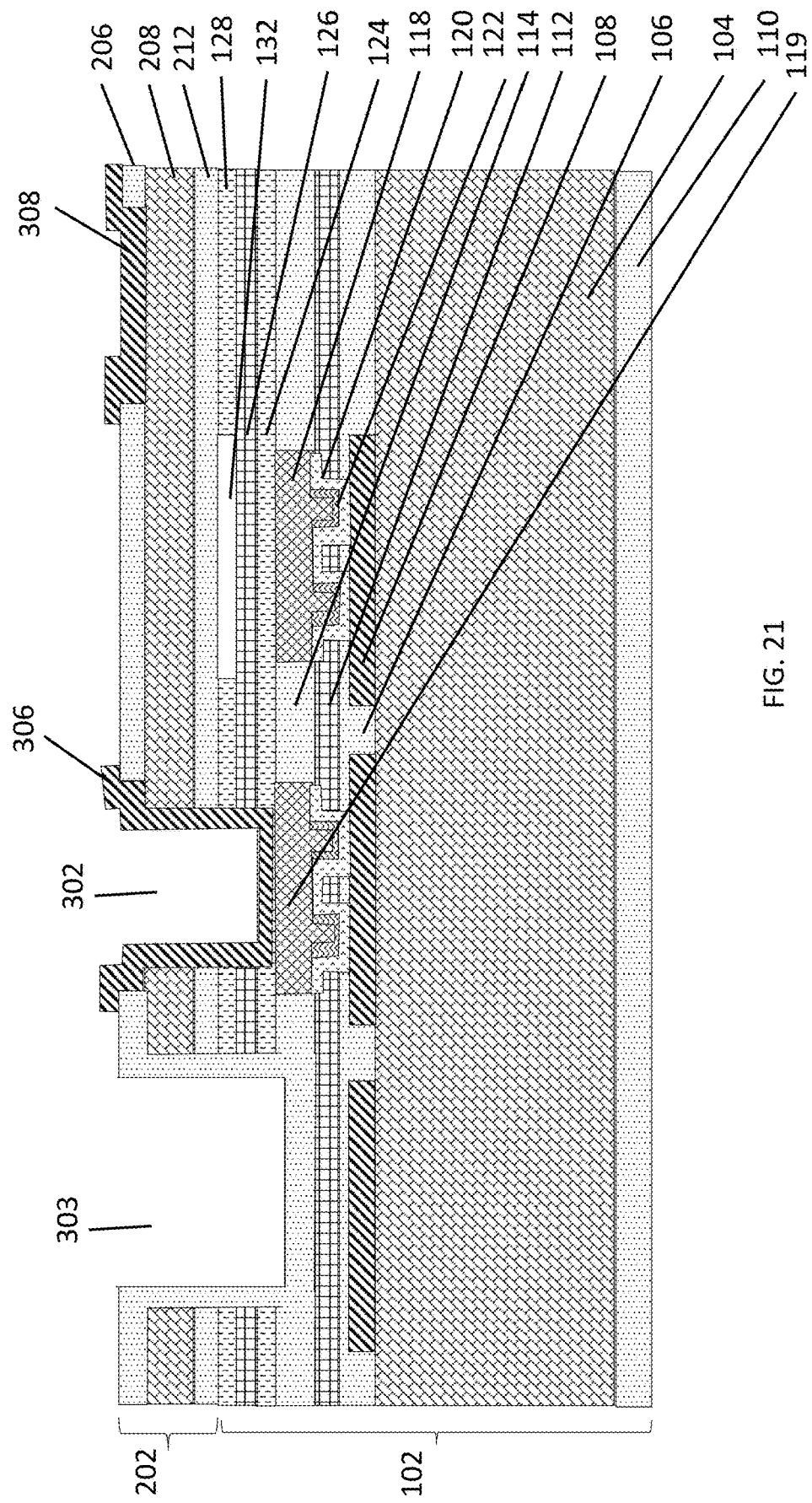

In FIG. 21, metal 306 is deposited inside the opening 302 such that the metal 306 lines the opening 302 and is deposited on portions of the silicon device layer 208 adjacent to the opening 302. Metal 308 is deposited on the opening 304 such that the metal 308 fills the opening 304 and is deposited on portions of the silicon device layer 208 adjacent to the opening 304. The metal 308 and metal 306 may include, for example, aluminum.

Figure 22:
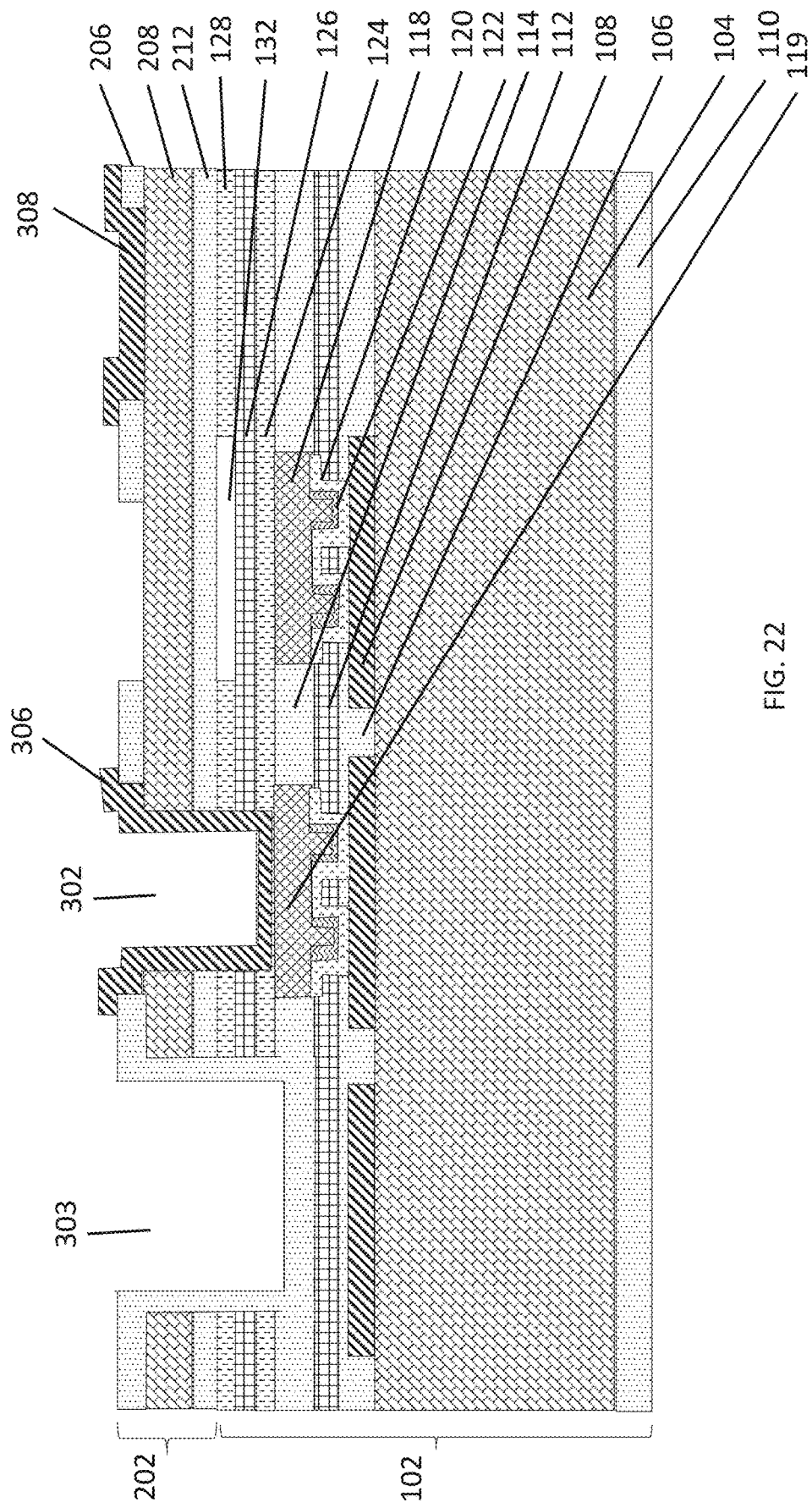

In FIG. 22, a portion of the insulating layer 206 above the cavity 132 is etched using any suitable etching agent.

Figure 23:
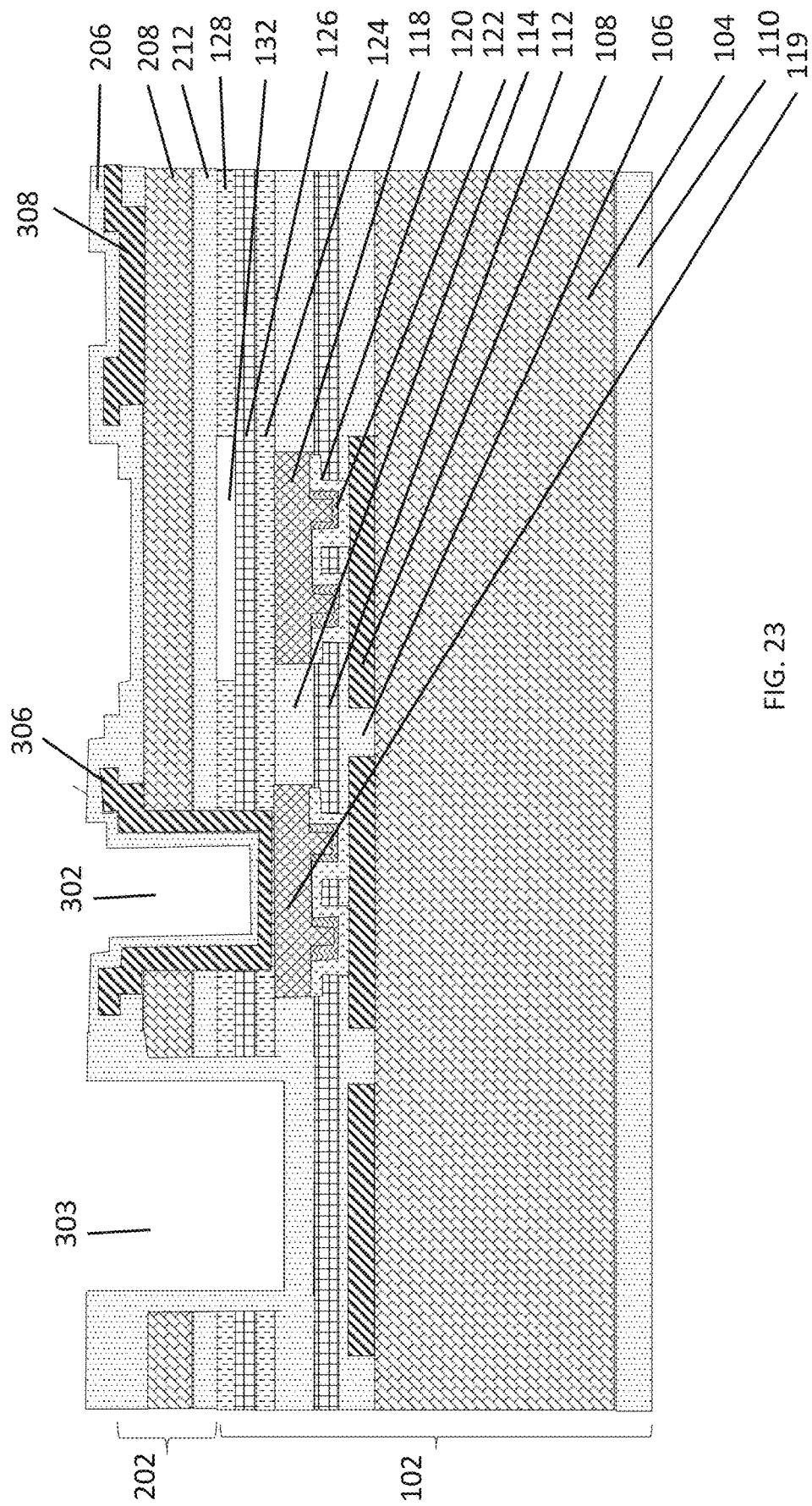

In FIG. 23, further material is added to the insulating layer 206. The material is formed on the metal 306 and the metal 308 and lines the opening 302. Etching the insulating layer 206 (as shown in FIG. 22) above the cavity 132 before this addition of material may help to reduce how much material is disposed above the cavity 132 and improve the acoustic performance of the ultrasonic transducer that includes the cavity 132. For example, the thickness of material above the cavity 132 may be controlled to be approximately 6 microns.

Figure 24:
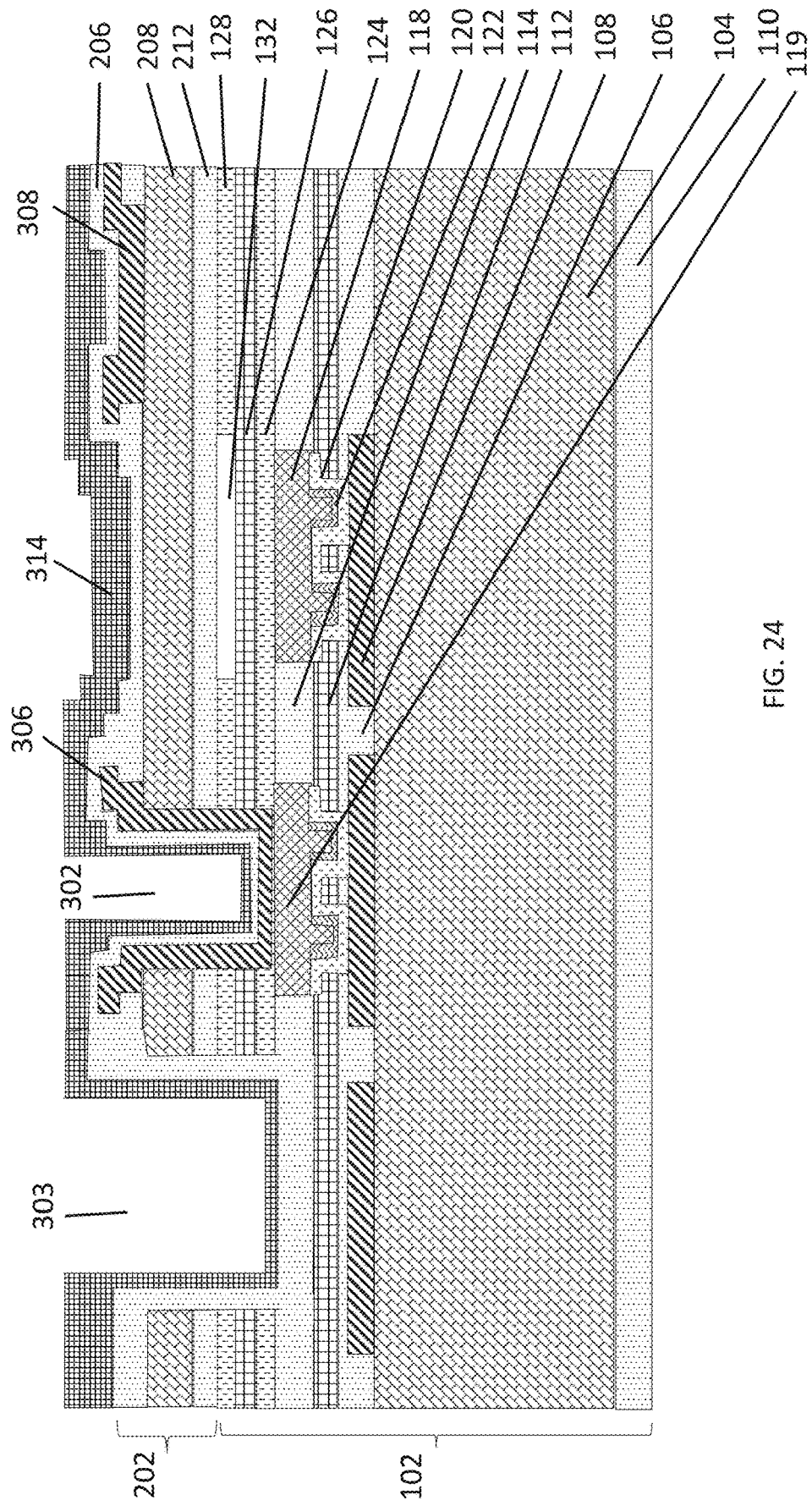

In FIG. 24, passivation material 314 (e.g., dual layer SiOx/SiN) is formed on the second substrate 202. The passivation material 314 is formed on the insulating layer 206 and lines the opening 302 and the opening 303.

Figure 25:
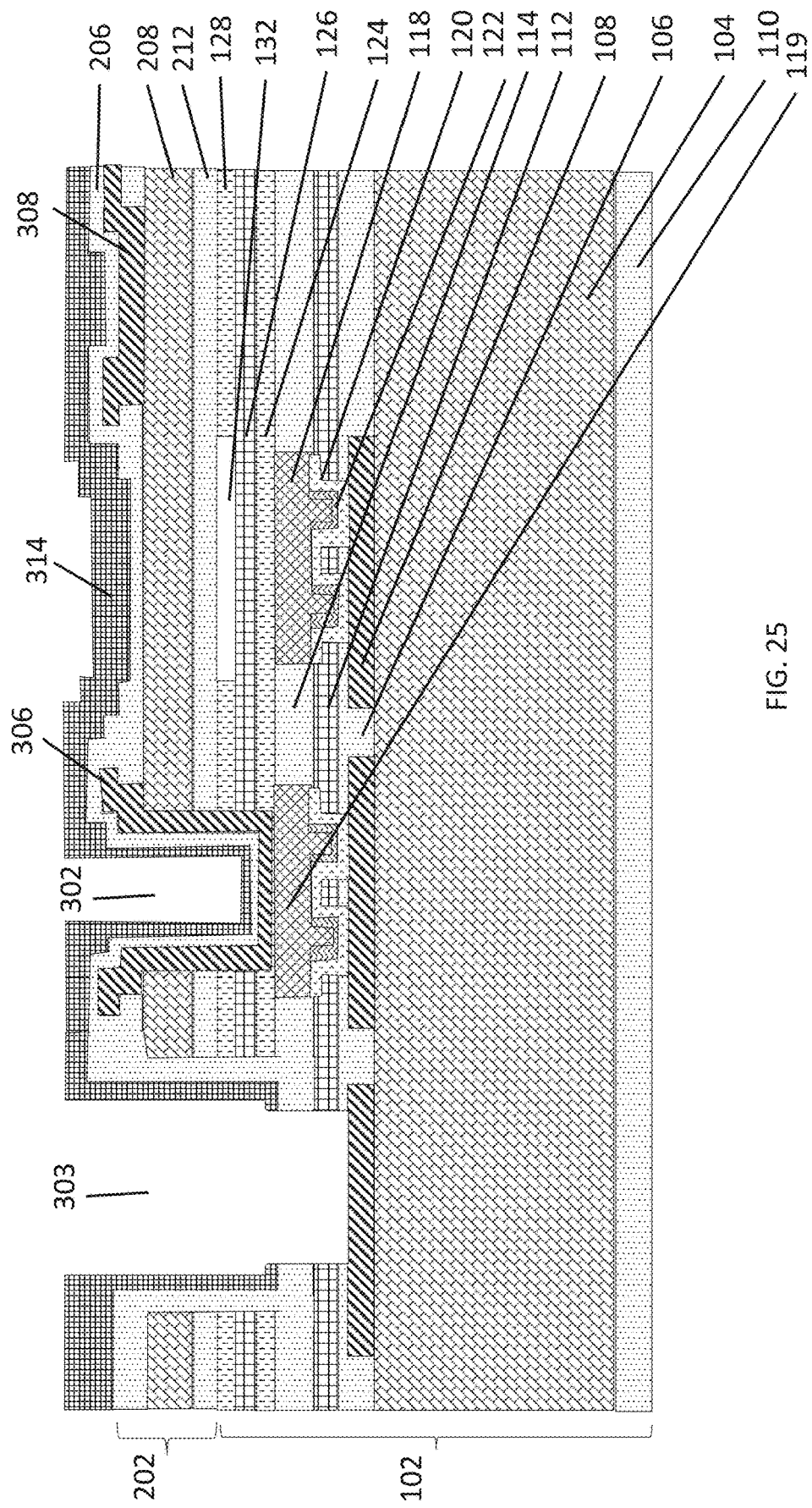

In FIG. 25, the opening 303 is further etched down to the metallization 108. The opening 303 may constitute an access point for wirebonding to the first substrate, and in particular to the metallization 108. Such a wirebond may constitute an electrical connection from an external device (not shown) to the circuitry of the first substrate 102.

The process described above may be used to produce a capacitive micromachined ultrasonic transducer (CMUT). The cavity 132 may be the micromachined cavity of the CMUT, the silicon device layer 208 (and layer 212) above the cavity 132 may be the top membrane of the CMUT, and the electrode 118 below the cavity 132 may be the bottom electrode of the CMUT. Circuitry within the first substrate 102 may transmit electrical signals to the bottom electrode of the CMUT (namely, the electrode 118) through the metallization 108 and the adhesion structures 120 and 122 that are electrically connected to the electrode 118. Circuitry within the first substrate 102 may transmit electrical signals to the top membrane of the CMUT (namely the silicon device layer 208) though the metallization 108, the adhesion structures 120 and 122, the electrode 119, and the metal 306 that is electrically connected to the silicon device layer 208. The metal 306 may electrically connect to the metal 308 and other metal structures on the silicon device layer 208 in order to distribute an electrical signal throughout portions of the silicon device layer 208 that may serve as top membranes for multiple CMUTs. For further discussion of the metal 306 and the metal 308, see FIG. 82. The above discussion of the CMUTs and the metal connections also apply to the processes shown in FIGS. 26-38 and FIGS. 39-42.

FIGS. 26-38 illustrate example cross-sections of an ultrasound transducer device during a fabrication sequence for forming the ultrasound transducer device in accordance with certain embodiments described herein. The fabrication sequence includes fabricating cavities for capacitive micromachined ultrasonic transducers (CMUTs) in a substrate that also includes integrated circuitry. The fabrication sequence of this exemplary embodiment eliminates the need for wirebond formation and further includes fabricating through-silicon vias (TSVs) in the substrate that includes the integrated circuitry using a "TSV-Middle" process. It will be appreciated that the fabrication sequence shown is not limiting, and some embodiments may include additional steps and/or omit certain shown steps.

Figure 26:
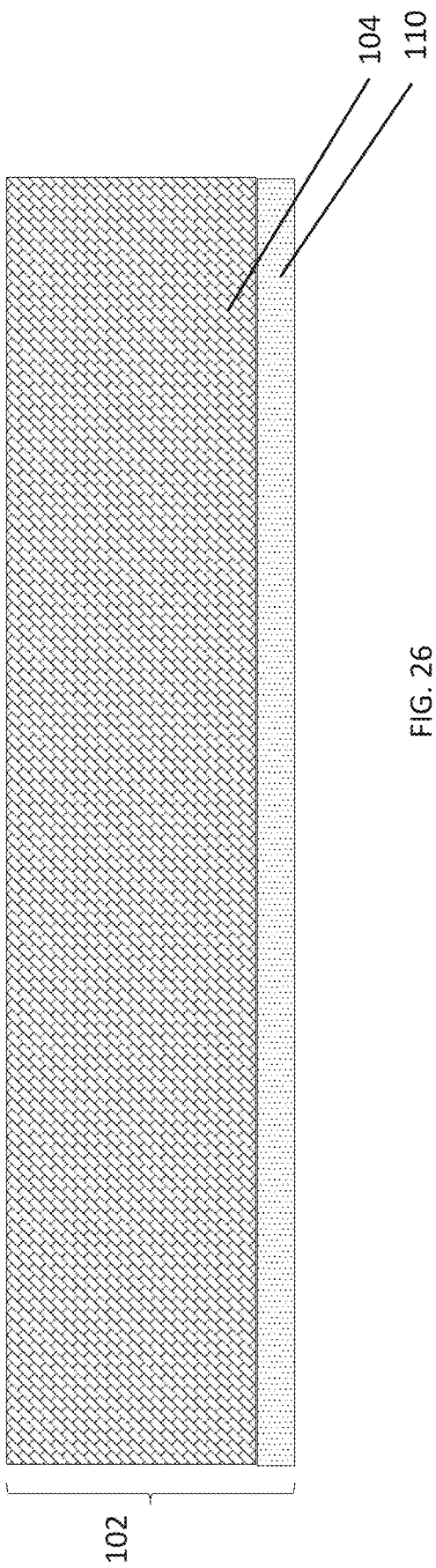
FIGS. 26-38 illustrate example cross-sections of an ultrasound transducer device during a fabrication sequence for forming the ultrasound transducer device in accordance with certain embodiments described herein. The fabrication sequence includes fabricating cavities for CMUTs in a substrate that also includes integrated circuitry. The fabrication sequence further includes fabricating through-silicon vias (TSVs) in the substrate that includes the integrated circuitry using a "TSV-Middle" process.

As shown in FIG. 26, a first substrate 102 includes a base layer (e.g., a bulk silicon wafer) 104 and an insulating layer 110 formed on the backside of the base layer 104. The first substrate 102 may be a complementary metal oxide semiconductor (CMOS) substrate. Semiconductor structures (not specifically shown in FIG. 26) such as transistors may be formed in the base layer 104 as part of front-end-of-line (FEOL) processes.

Figure 27:
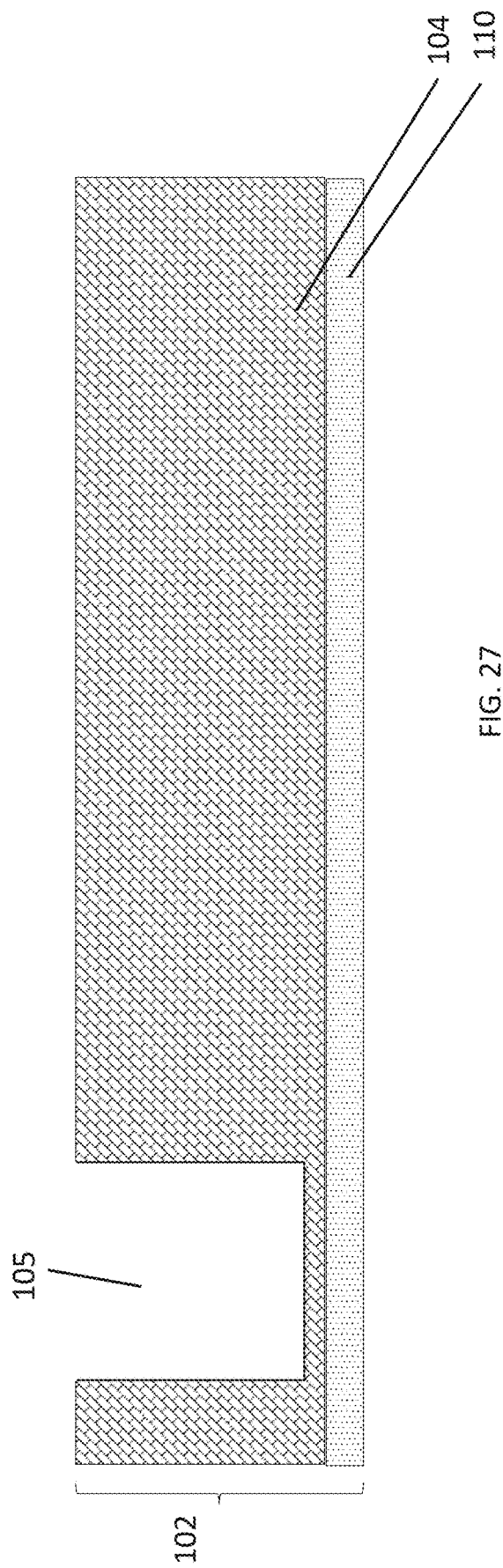

In FIG. 27, a trench 105 is etched (using any suitable etching agent) in the base layer 104. For example, dry reactive-ion etching (DRIE) may be used, with the depth of the trench 105 controlled by the number of DRIE cycles used and the etch rate at each cycle.

Figure 28:
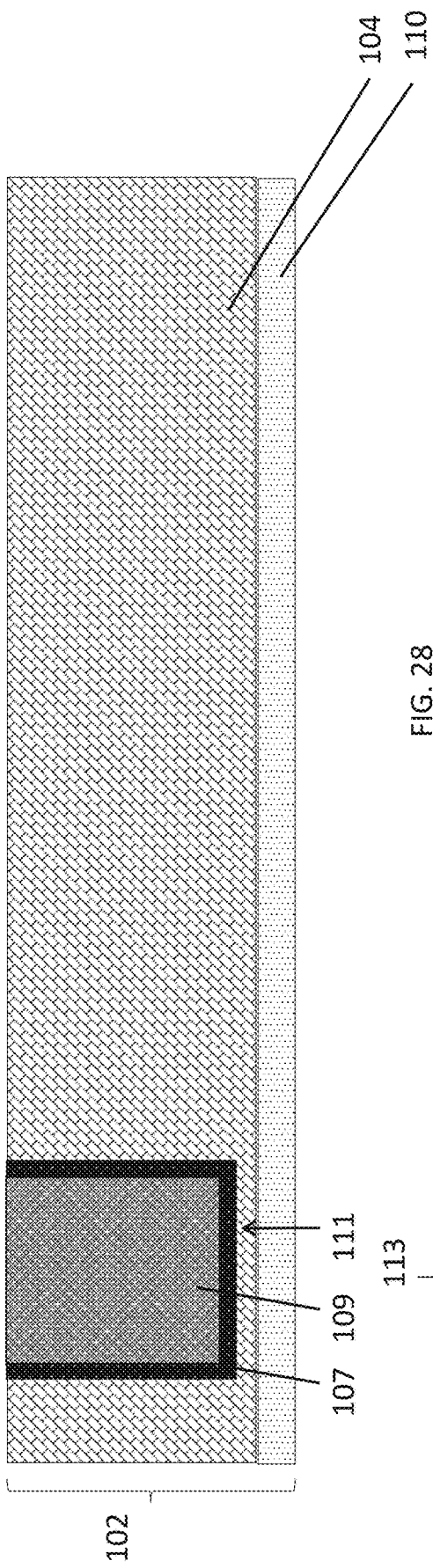

In FIG. 28, a liner material 107 (e.g., a silicon oxide layer, a barrier layer such as titanium or tantalum, and/or a seed layer such as copper) and a via material 109 (e.g., copper, doped polysilicon, or tungsten) is deposited in the trench 105 to form a through-silicon via (TSV) 111. This may be accomplished in three steps: blanket deposition of the liner material 107, followed by blanket deposition of the via material 109, followed by CMP down to the top of the first substrate 102.

Figure 29:
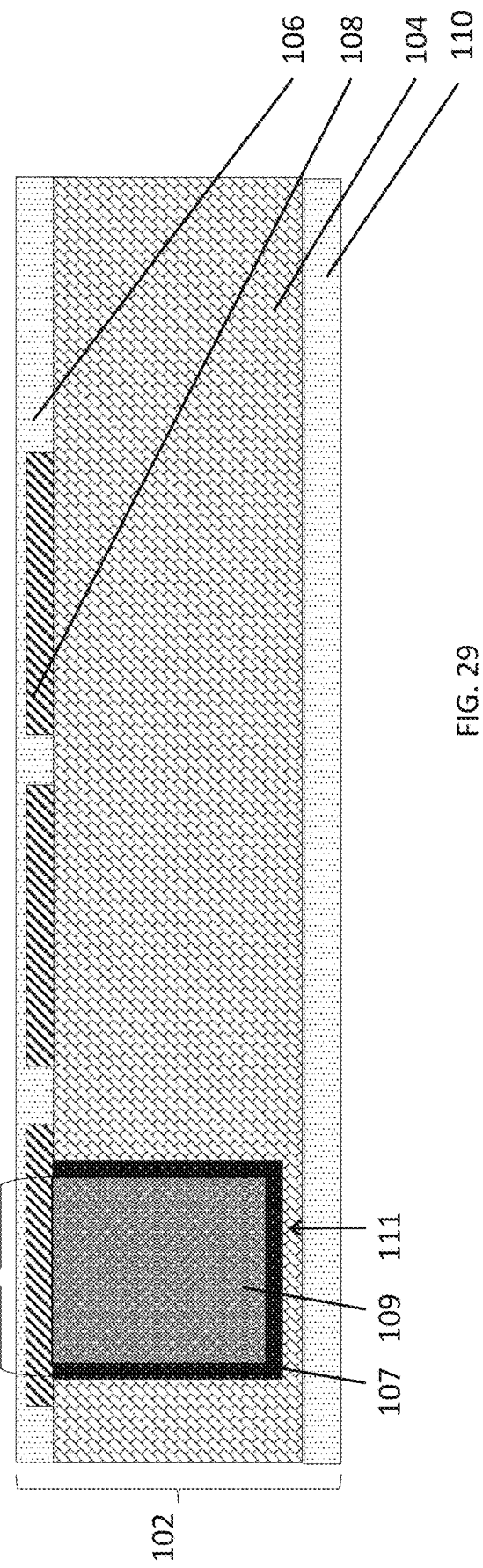

In FIG. 29, metallization 108 and an insulating layer 106 are formed on the first substrate 102 as part of back-end-of-line (BEOL) processes. The metallization 108 may be formed of aluminum, copper, or any other suitable metallization material, and may represent at least part of an integrated circuit formed in the second substrate 102. For example, the metallization 108 may serve as routing layers, may be patterned to form one or more electrodes, or may be used for other functions. In practice, the first substrate 102 may include more than one metallization layer and/or post-processed redistribution layer, but for simplicity only one metallization is illustrated. A portion 113 of the metallization 108 is formed in contact with the TSV 111. The steps shown in FIGS. 26-29 for forming the first substrate 102 may be performed at a commercial foundry. The TSV 111 is formed after FEOL processes but before BEOL processes. This may be considered a "TSV-Middle" process.

Figure 30:
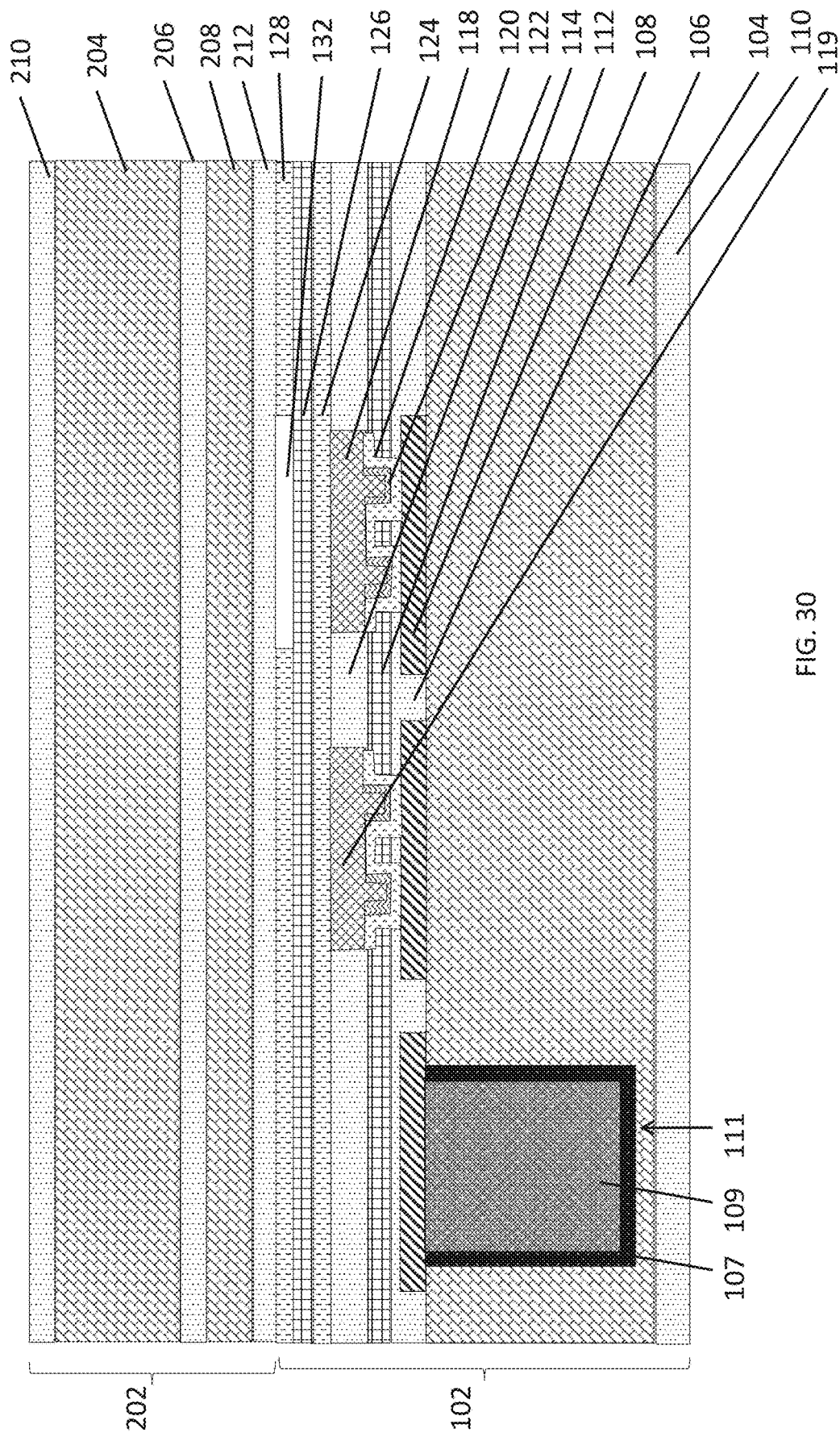
Figure 31:
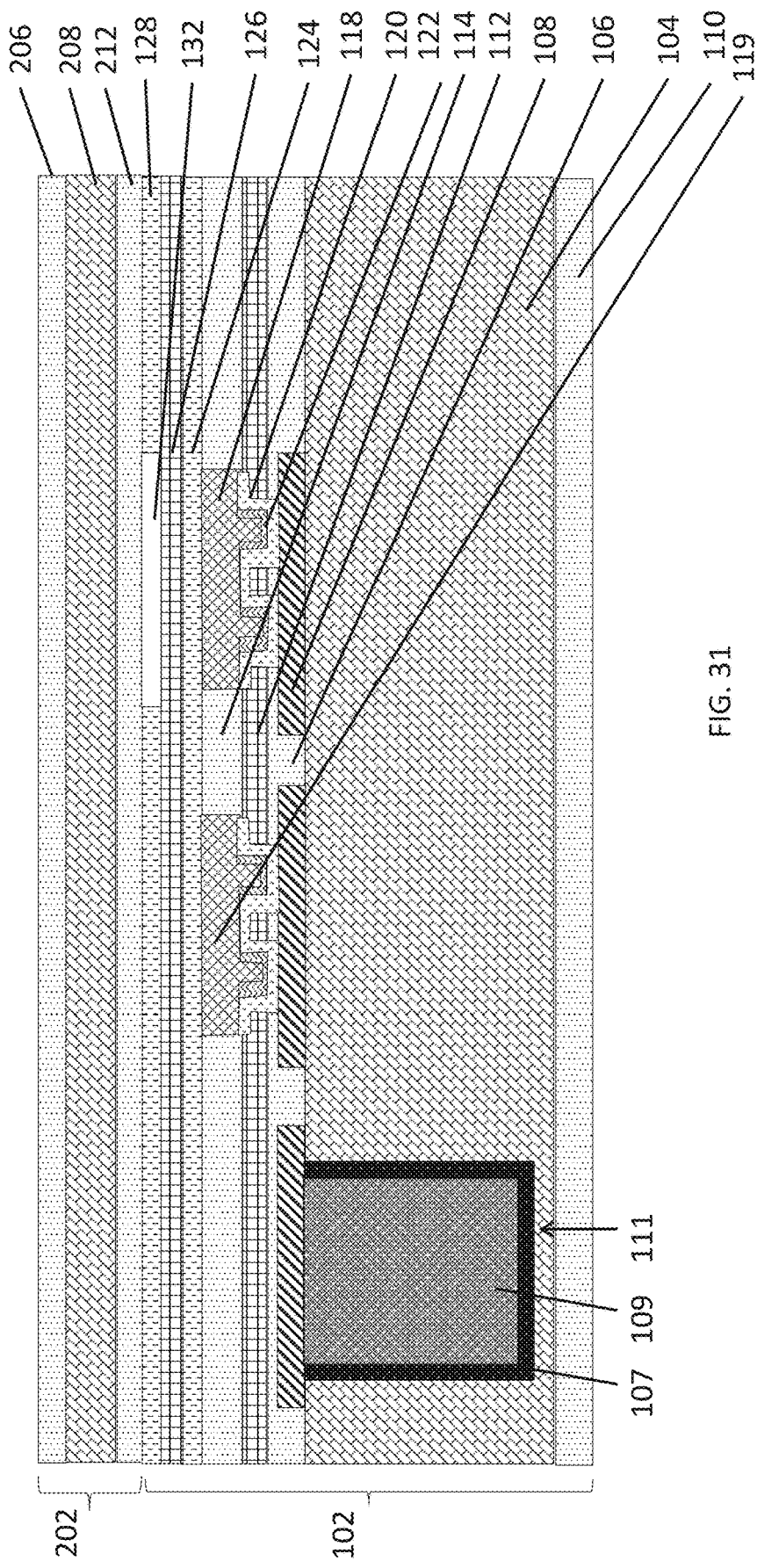

At this point, the processing steps outlined in FIGS. 2-15 of the first embodiment may be performed on the intermediate structure of FIG. 29 so as to result in the structure depicted in FIG. 30. That is, the structure of FIG. 30 comprises bonded first and substrates 102 and 202 similar to the structure shown in FIG. 15, with the exception that the structure of FIG. 30 also includes a TSV 111 in lieu of the clear out opening 303 (FIG. 17) for wirebonding purposes. Then, similar to FIG. 16, the oxide layer 210, the handle layer 204, and the BOX layer 206 of the second substrate are removed, as shown in FIG. 31.

Figure 32:
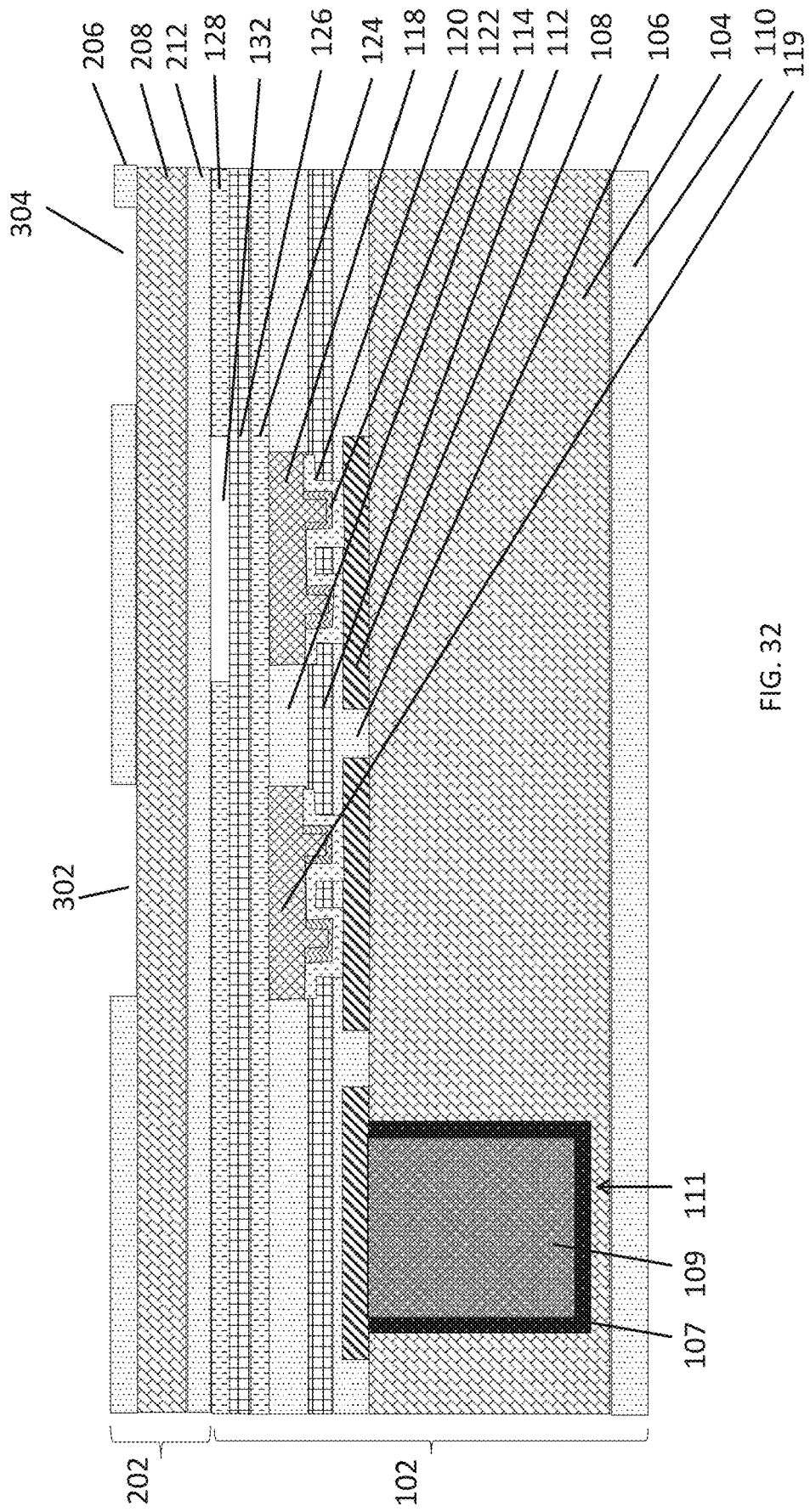
Figure 33:
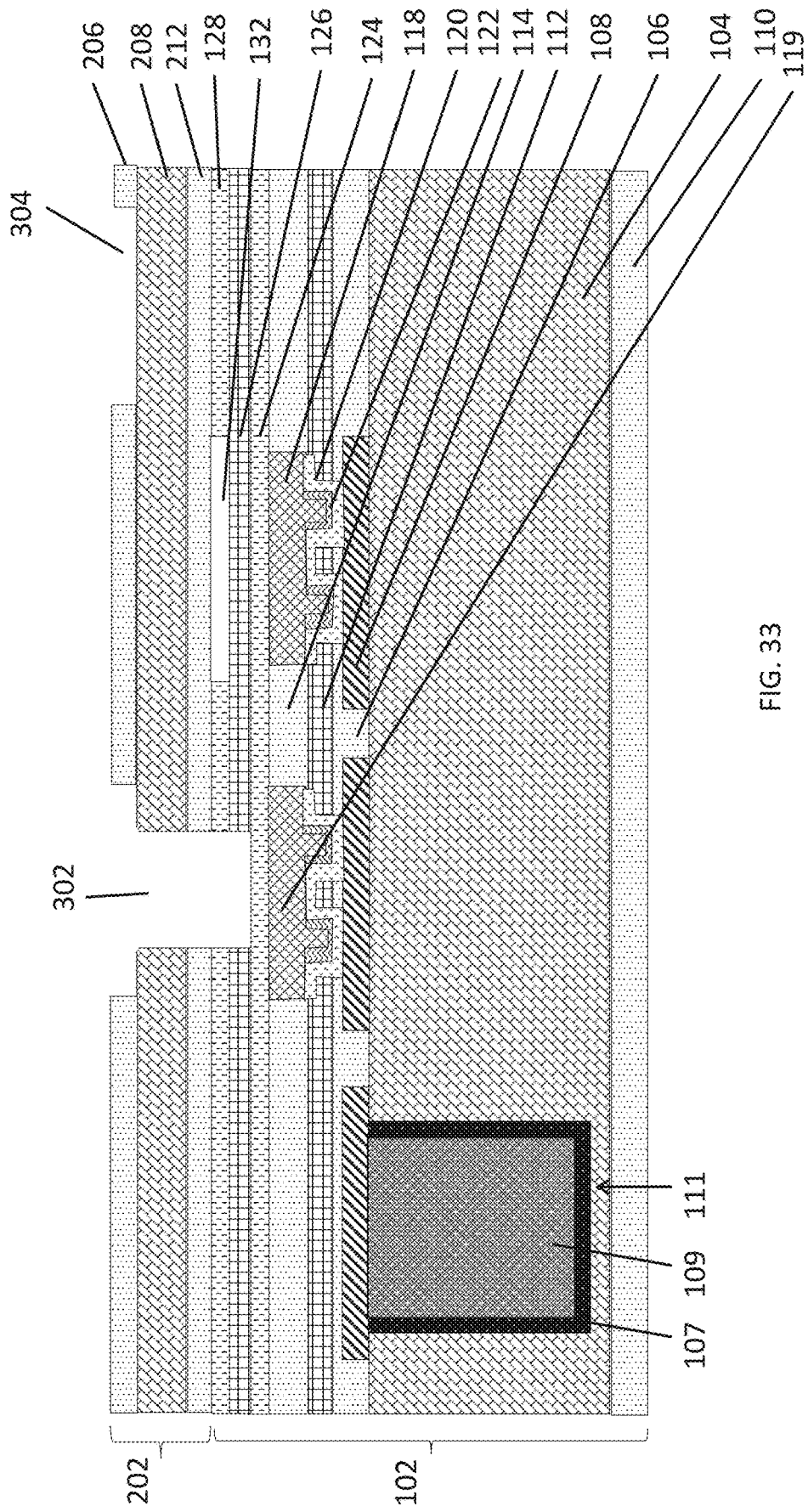

In FIGS. 32-33, an opening 302 is formed in the BOX layer 206, the silicon device layer 208, the oxide layer 212, the third insulating layer 128, the second insulating layer 126, and the first insulating layer 124. An opening 304 is formed in the BOX layer 206. The opening 302 and the opening 304 may be formed using any suitable patterning and etching agents. As will be described further below, the opening 302 and the opening 304 will be used to facilitate electrical contact between the first substrate 102 and top membranes of CMUTs.

Figure 34:
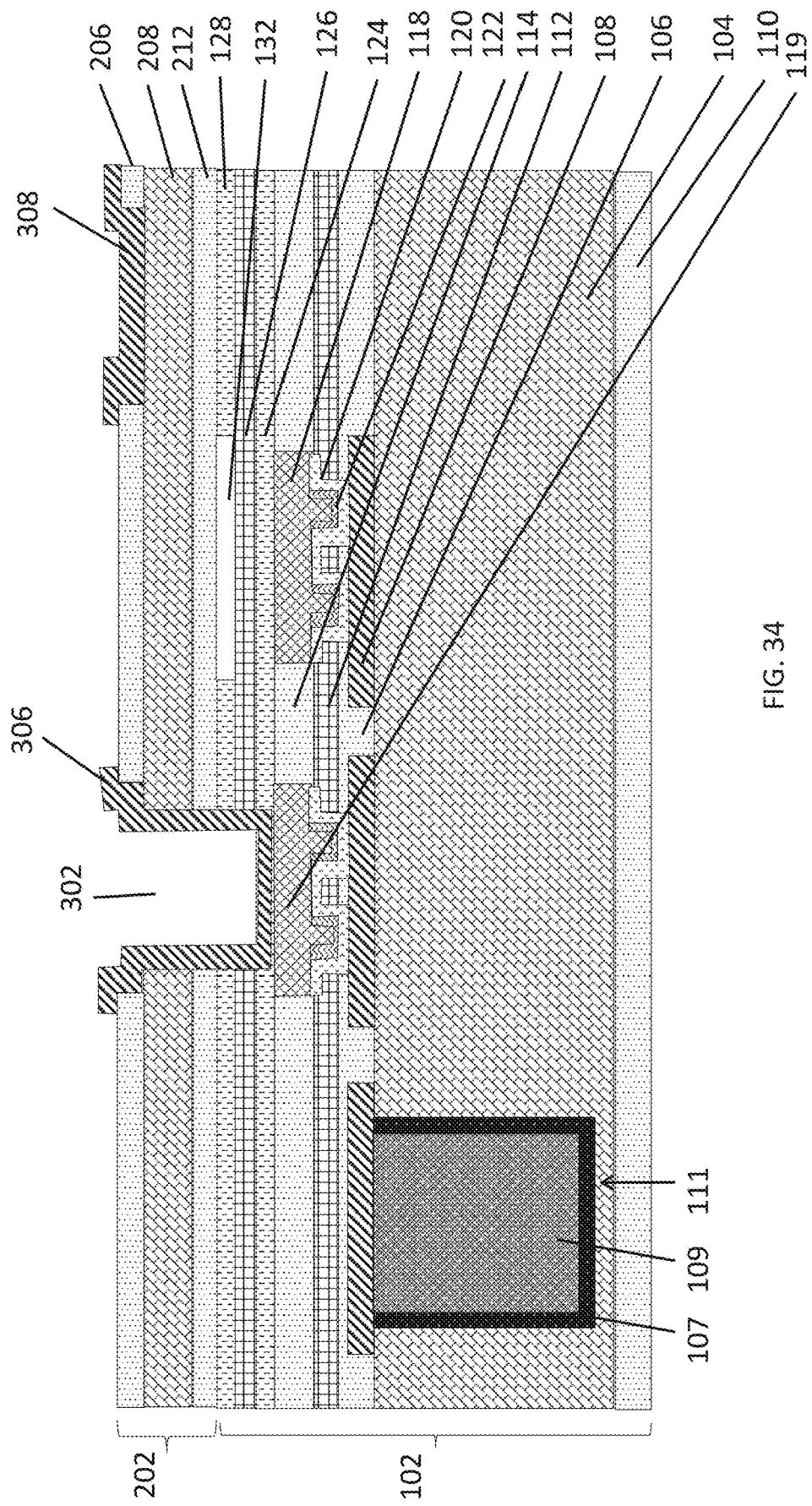

In FIG. 34, metal 306 is deposited inside the opening 302 such that the metal 306 lines the opening 302 and is deposited on portions of the silicon device layer 208 adjacent to the opening 302. Metal 308 is deposited on the opening 304 such that the metal 308 fills the opening 304 and is deposited on portions of the silicon device layer 208 adjacent to the opening 304. The metal 308 and metal 306 may include, for example, aluminum.

Figure 35:
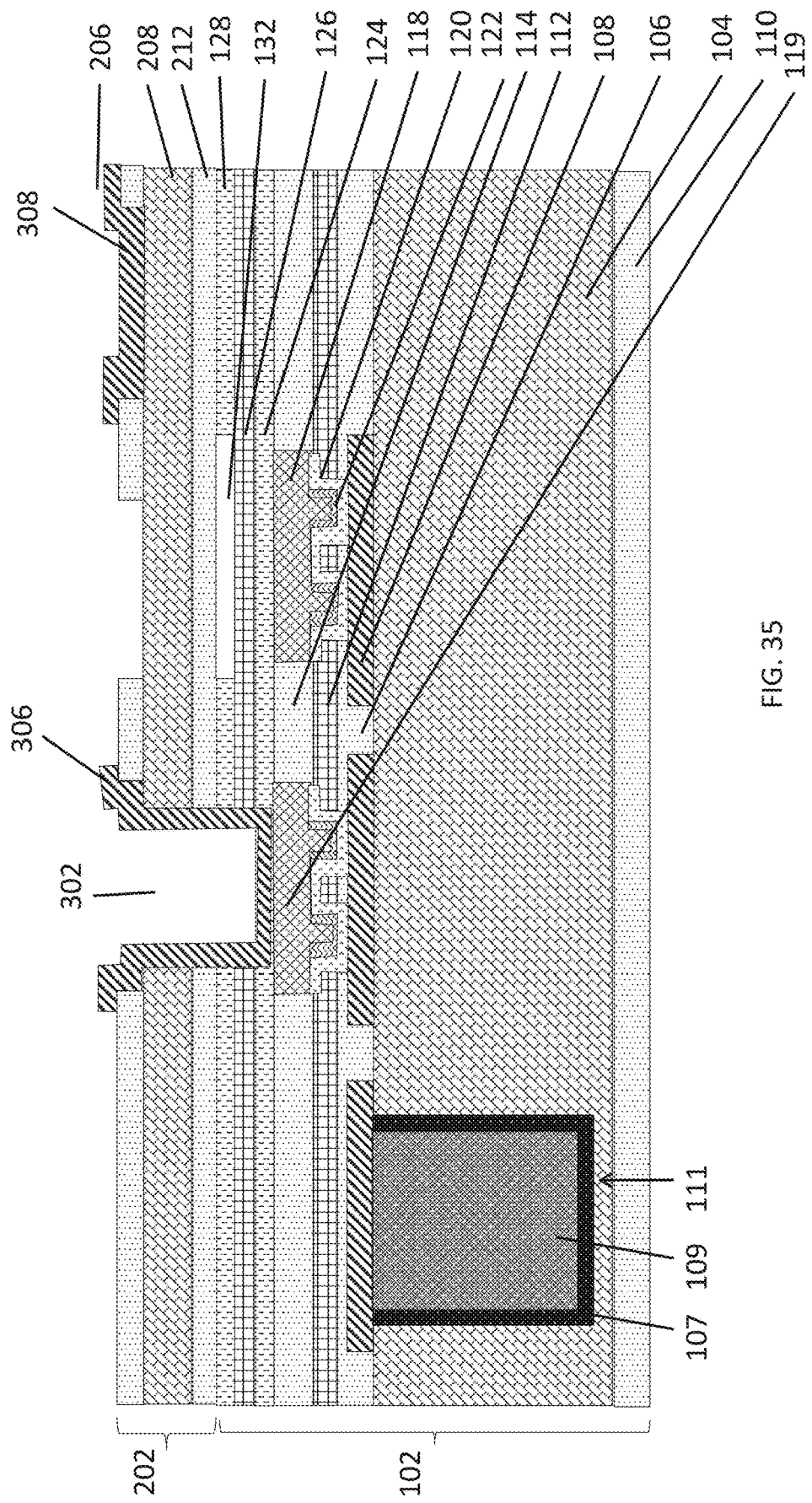

In FIG. 35, a portion of the BOX layer 206 above the cavity 132 is etched using any suitable etching agent.

Figure 36:
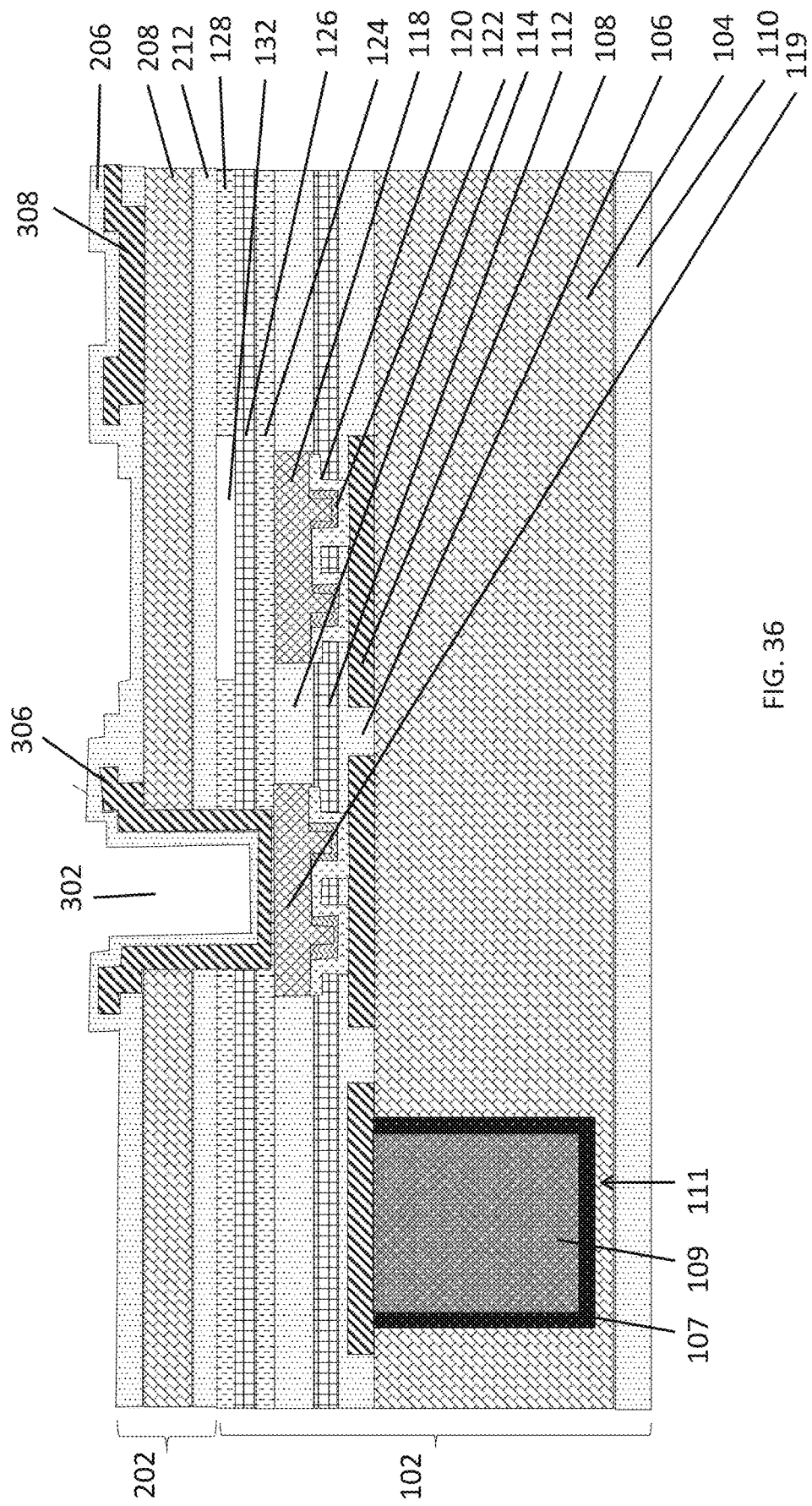

In FIG. 36, further material is added to the BOX layer 206. The material is formed on the metal 306 and the metal 308 and lines the opening 302. Etching the BOX layer 206 (as shown in FIG. 35) above the cavity 132 before this addition of material may help to reduce how much material is disposed above the cavity 132 and improve the acoustic performance of the ultrasonic transducer that includes the cavity 132. For example, the thickness of material above the cavity 132 may be controlled to be approximately 6 microns.

Figure 37:
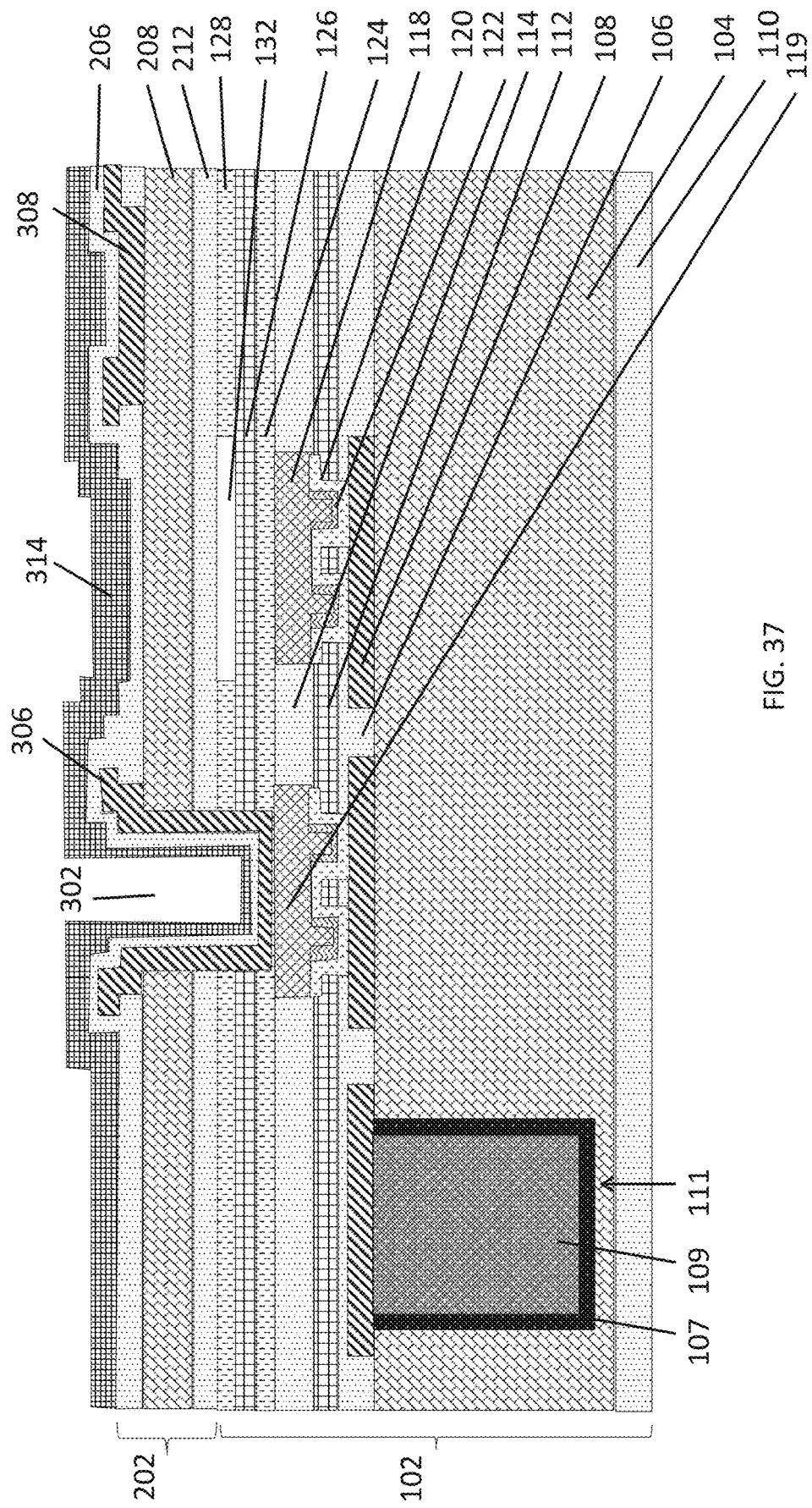

In FIG. 37, passivation material 314 (e.g., polyimide) is formed on the second substrate 202. The passivation material 314 is formed on the BOX layer 206 and lines the opening 302.

Figure 38:
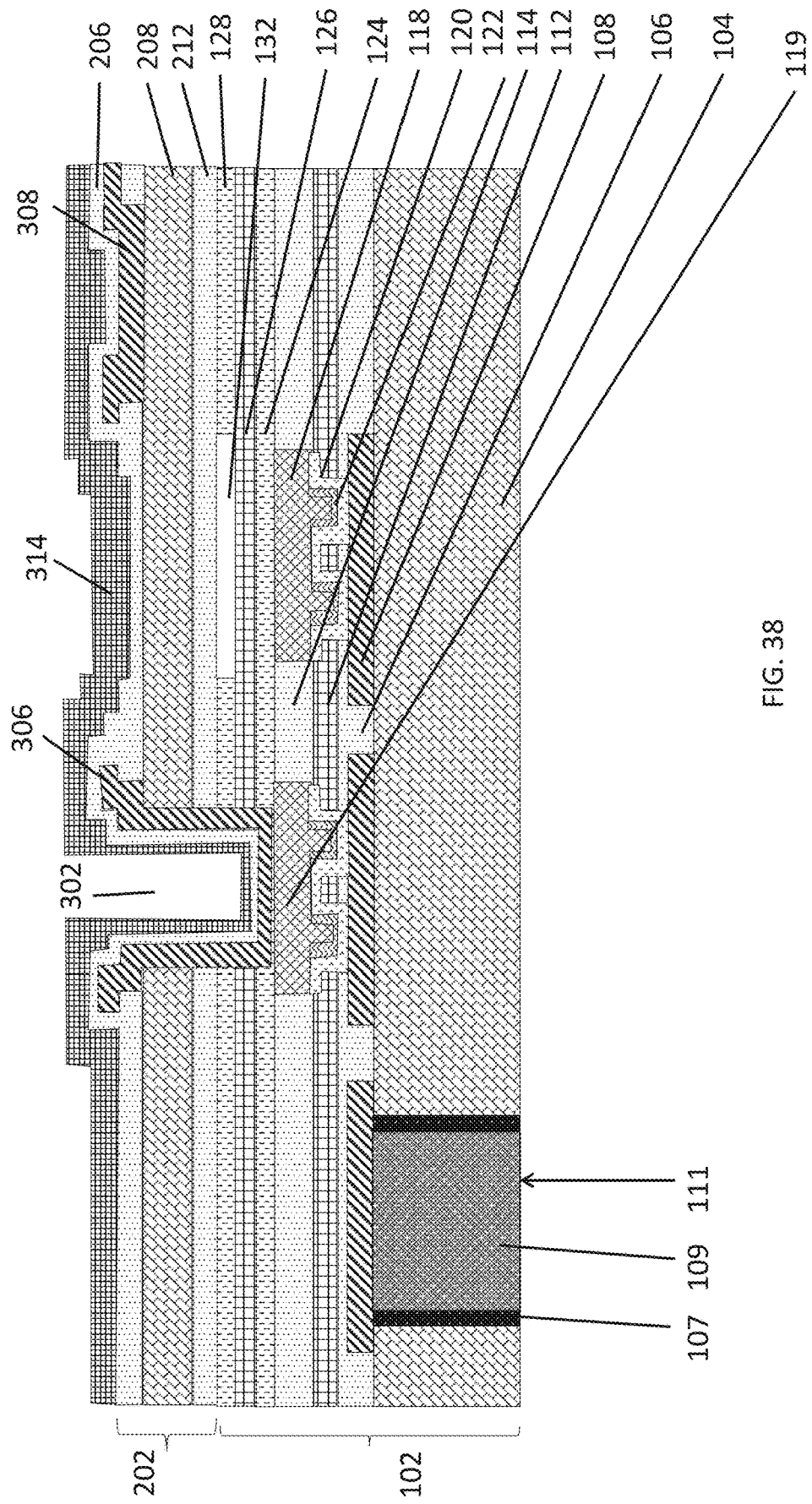

In FIG. 38, the insulating layer 110 of the first substrate 102 is removed and the base layer 104 is thinned, in any suitable manner. For example, grinding, etching, or any other suitable technique or combination of techniques may be used. Ultraviolet release grinding tape may be used to handle the substrates during grinding of the first substrate. For example, the ultraviolet release grinding tape may adhere the top of the substrate 202 to a surface during grinding of the first substrate 102. As a result of thinning the base layer 104, the TSV 111 is exposed. Therefore, the TSV 111 may be coupled (e.g., through an interposer, not shown) to an external device (not shown), thereby enabling transmission of electrical signals from the external device, to the TSV 111, to the metallization 108, and to circuitry within the first substrate 102. Again, this may obviate the need for creating the opening 303 down to the metallization 108 and wirebonding to the first substrate 102, as was shown in the process of FIGS. 1-25.

FIGS. 39-42 illustrate example cross-sections of an ultrasound transducer device during a fabrication sequence for forming the ultrasound transducer device in accordance with certain embodiments described herein. The fabrication sequence includes fabricating cavities for capacitive micromachined ultrasonic transducers (CMUTs) in a substrate that also includes integrated circuitry. The fabrication sequence of this exemplary embodiment eliminates the need for wirebond formation and further includes fabricating through-silicon vias (TSVs) in the substrate that includes the integrated circuitry using a "TSV-Last" process. It will be appreciated that the fabrication sequence shown is not limiting, and some embodiments may include additional steps and/or omit certain shown steps.

Figure 39:
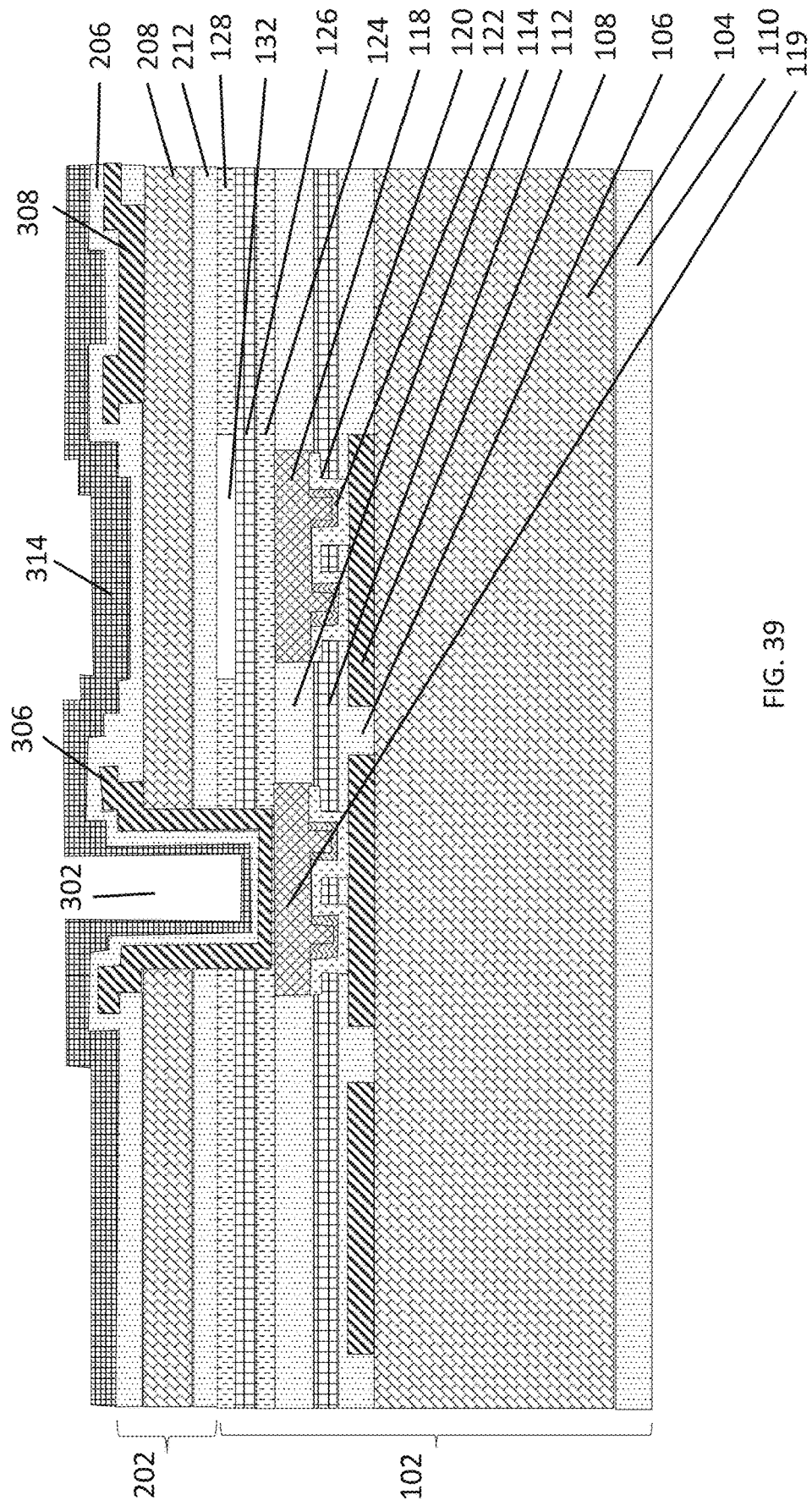
FIGS. 39-42 illustrate example cross-sections of an ultrasound transducer device during a fabrication sequence for forming the ultrasound transducer device in accordance with certain embodiments described herein. The fabrication sequence includes fabricating cavities for CMUTs in a substrate that also includes integrated circuitry. The fabrication sequence further includes fabricating TSVs in the substrate that includes the integrated circuitry using a "TSV-Last" process.

Referring to FIG. 39, a bonded structure is depicted that includes a first substrate 102 bonded to a second substrate 202. The structure shown in FIG. 39 may be formed using the processing steps shown in FIGS. 1-16 and 19-24; in other words, in this embodiment the opening 303 (as shown in FIGS. 17 and 18) is not formed.

Figure 40:
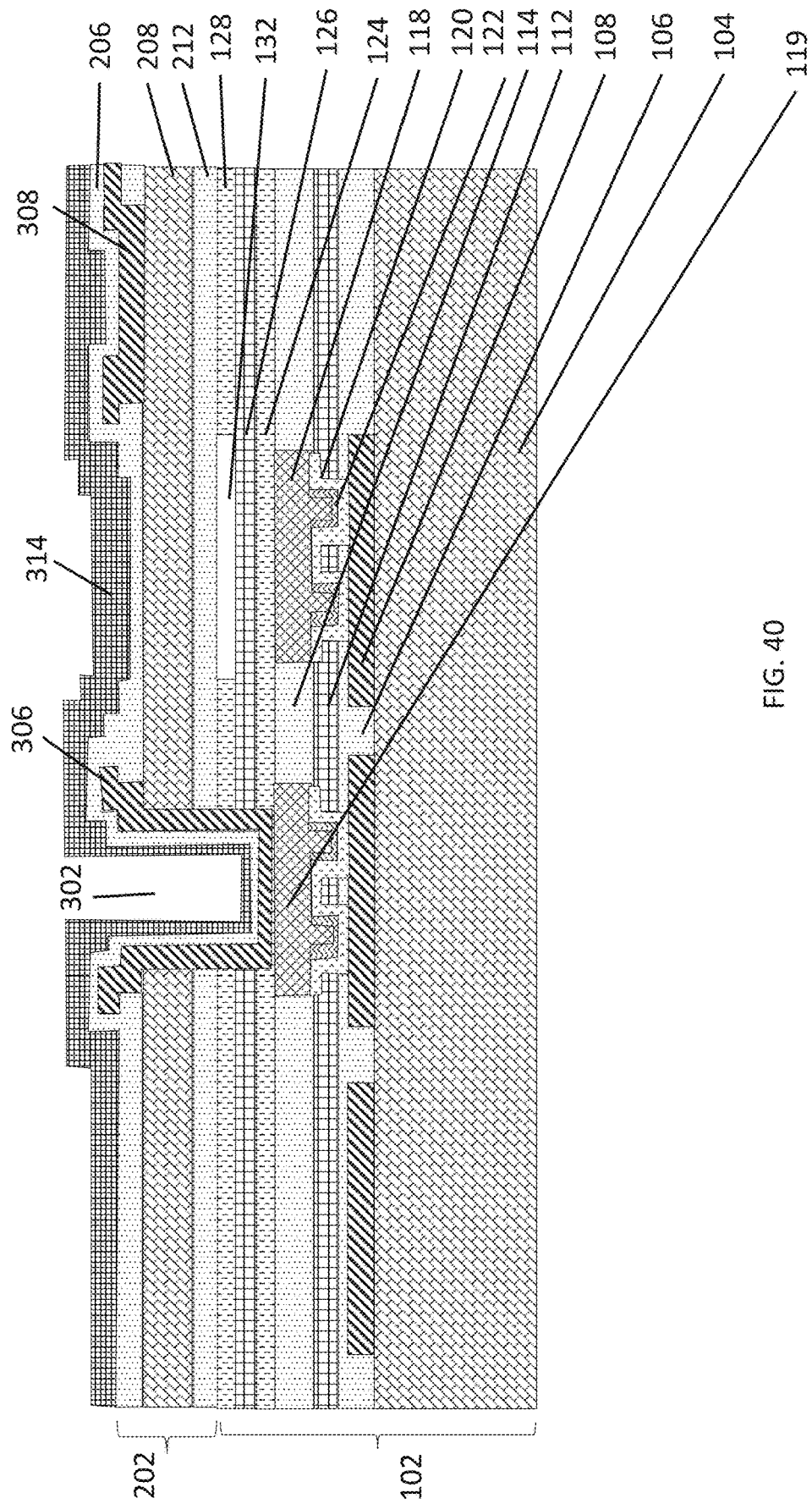

Then, as shown in FIG. 40, the insulating layer 110 of the first substrate 102 is removed and the base layer 104 is thinned, in any suitable manner. For example, grinding, etching, or any other suitable technique or combination of techniques may be used. Ultraviolet release grinding tape may be used to handle the substrates during grinding of the first substrate. For example, the ultraviolet release grinding tape may adhere the top of the substrate 202 to a surface during grinding of the first substrate 102.

Figure 41:
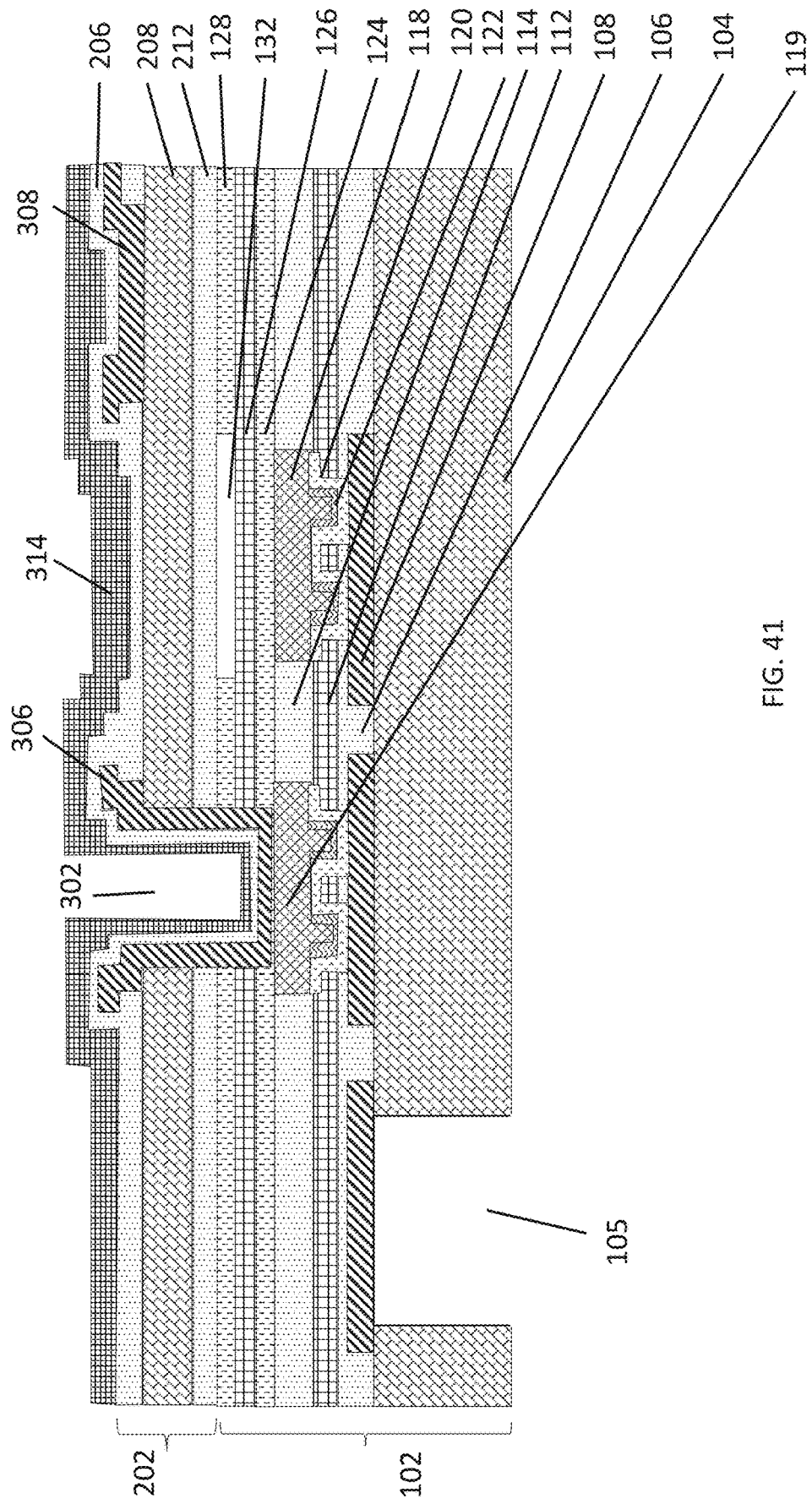

In FIG. 41, a trench 105 is etched (using any suitable etching agent) in the base layer 104.

Figure 42:
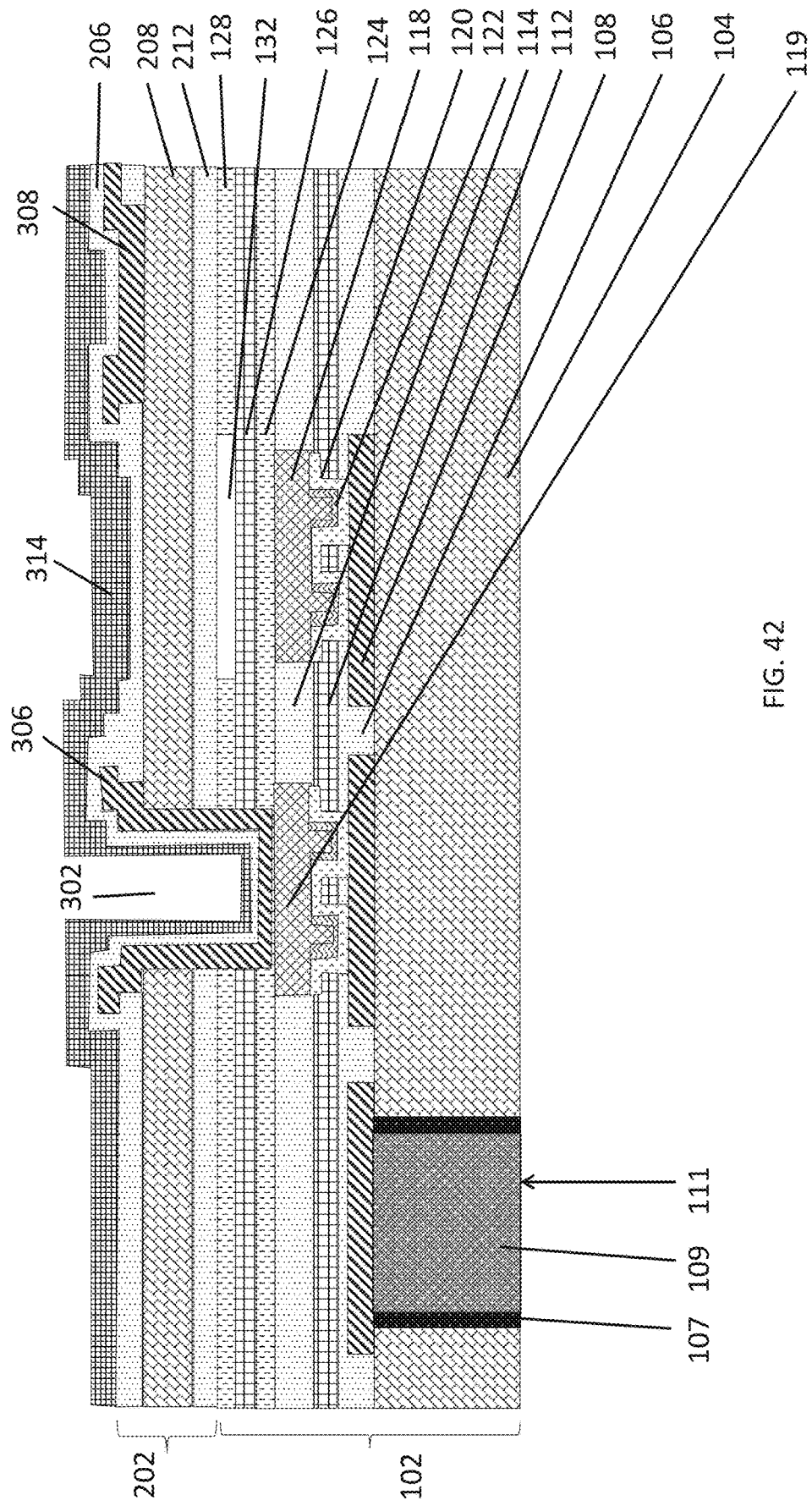

In FIG. 42, a liner material 107 (e.g., e.g., a silicon oxide layer, a barrier layer such as titanium or tantalum, and/or a seed layer such as copper) and a via material 109 (e.g., copper, doped polysilicon, or tungsten) is deposited in the trench 105 to form a through-silicon via (TSV) 111. This may be accomplished in three steps: blanket deposition of the liner material 107, followed by blanket deposition of the via material 109, followed by CMP down to the top of the first substrate 102. The TSV 111 may be coupled (e.g., through an interposer, not shown) to an external device (not shown), thereby enabling transmission of electrical signals from the external device, to the TSV 111, to the metallization 108, and to circuitry within the first substrate 102. This may obviate the need for creating the opening 303 down to the metallization 108 and wirebonding to the first substrate 102, as was shown in the process of FIGS. 1-25. The TSV 111 is formed after FEOL processes and BEOL processes. This may be considered a "TSV-Last" process.

FIGS. 43-69 illustrate example cross-sections of an ultrasound transducer device during a fabrication sequence for forming the ultrasound transducer device in accordance with certain embodiments described herein. The fabrication sequence includes fabricating cavities for capacitive micromachined ultrasonic transducers (CMUTs) by bonding two substrates together, and bonding those two substrates to a substrate that includes integrated circuitry. The fabrication sequence of this exemplary embodiment eliminates the need for wirebond formation and further includes fabricating through-silicon vias (TSVs) in the substrate that includes the integrated circuitry using a "TSV-Middle" process. It will be appreciated that the fabrication sequence shown is not limiting, and some embodiments may include additional steps and/or omit certain shown steps.

Figure 43:
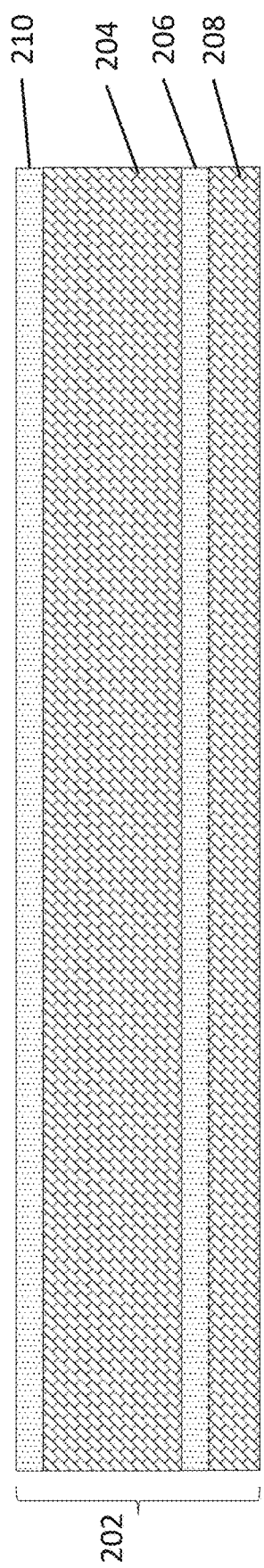
FIGS. 43-69 illustrate example cross-sections of an ultrasound transducer device during a fabrication sequence for forming the ultrasound transducer device in accordance with certain embodiments described herein. The fabrication sequence includes fabricating cavities for CMUTs by bonding two substrates together, and bonding those two substrates to a substrate that includes integrated circuitry. The fabrication sequence further includes fabricating TSVs in the substrate that includes the integrated circuitry using a "TSV-Middle" process.

As shown in FIG. 43 the second substrate 202 begins as a silicon-on-insulator (SOI) substrate that includes a handle layer 204 (e.g., a silicon handle layer), a buried oxide (BOX) layer 206, and a silicon device layer 208. An oxide layer 210 is provided on the backside of the handle layer 204. In some embodiments, the oxide layer 210 may be absent. The silicon device layer 208 may be formed of single crystal silicon and may be doped in some embodiments. In some embodiments, the silicon device layer 208 may be highly doped P-type, although N-type doping may alternatively be used. When doping is used, the doping may be uniform or may be patterned (e.g., by implanting in patterned regions). The silicon device layer 208 may already be doped when the SOI wafer is procured, or may be doped by ion implantation, as the manner of doping is not limiting. In some embodiments, the silicon device layer 208 may be formed of polysilicon or amorphous silicon. In either case the silicon device layer 208 may be doped or undoped.

Figure 44:
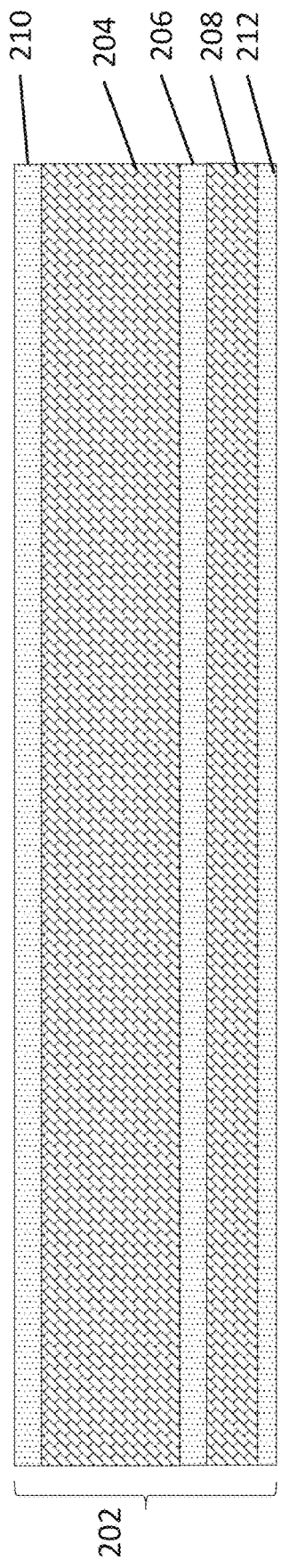

As shown in FIG. 44, an oxide layer 212 is formed on the second substrate 202. The oxide layer 212 may be a thermal silicon oxide, but it should be appreciated that oxides other than thermal oxide may alternatively be used.

Figure 45:
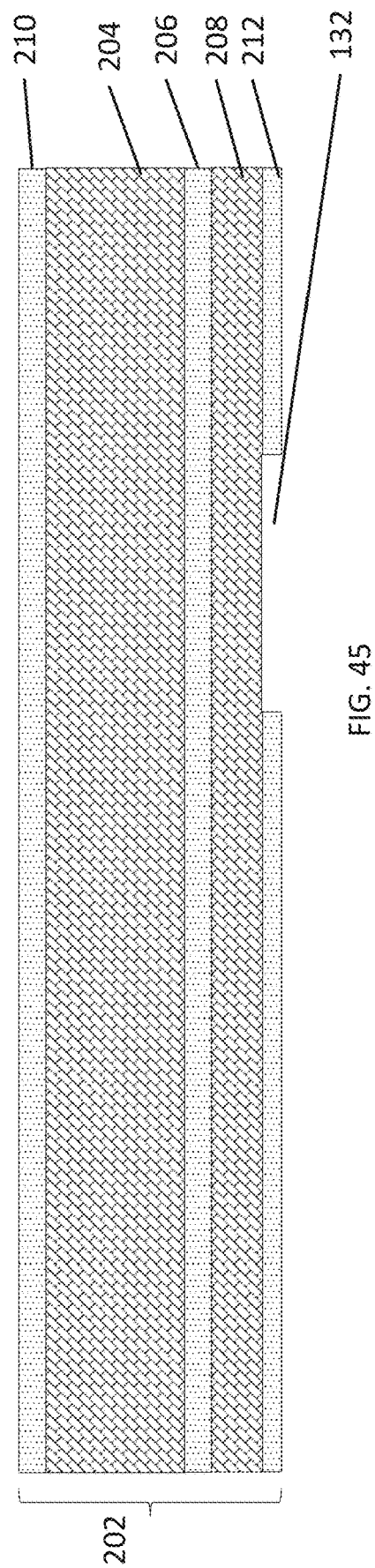

As shown in FIG. 45, the oxide layer 212 is patterned to form a cavity 132, using any suitable technique (e.g., using a suitable etch). In this non-limiting embodiment, the cavity 132 extends to the surface of the silicon device layer 208, although in alternative embodiments the cavity 132 may not extend to the surface of the silicon device layer 208. In some embodiments, the oxide layer 212 may be etched to the surface of the silicon device layer 208 and then an additional layer of oxide (e.g., thermal silicon oxide) may be formed such that the cavity 132 is defined by a layer of oxide. In some embodiments, the cavity 132 may extend into the silicon device layer 208. Also, in some embodiments structures such as isolation posts can be formed within the cavity 132.

Any suitable number and configuration of cavities 132 may be formed, as the aspects of the application are not limited in this respect. Thus, while only one cavity 132 is illustrated in the non-limiting cross-sectional view of FIG. 45, it should be appreciated that many more may be formed in some embodiments. For example, an array of cavities 132 may include hundreds of cavities, thousands of cavities, tens of thousands of cavities, or more to form an ultrasonic transducer array of a desired size.

The cavity 132 may take one of various shapes (viewed from a top side) to provide a desired membrane shape when the ultrasonic transducers are ultimately formed. For example, the cavity 132 may have a circular contour or a multi-sided contour (e.g., a rectangular contour, a hexagonal contour, an octagonal contour).

Figure 46:
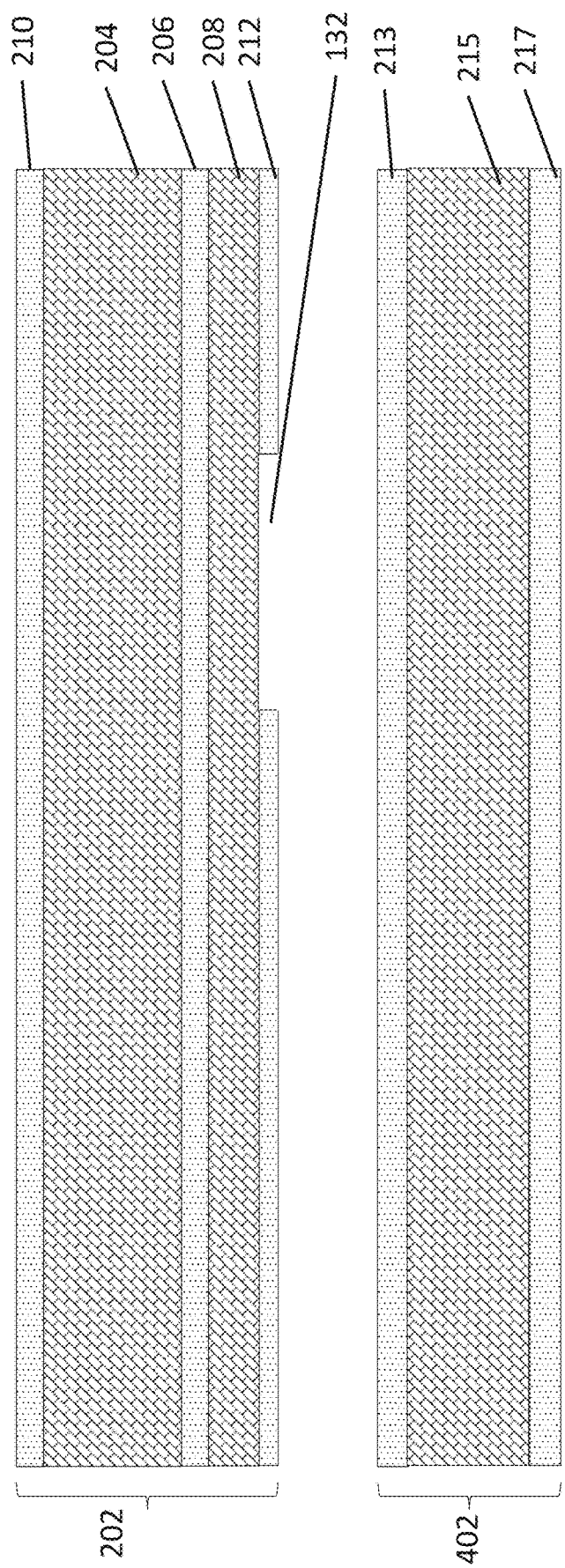

FIG. 46 shows the second substrate 202 and a third substrate 402. The third substrate 402 includes a silicon layer 215, an oxide layer 217, and an oxide layer 213.

Figure 47:
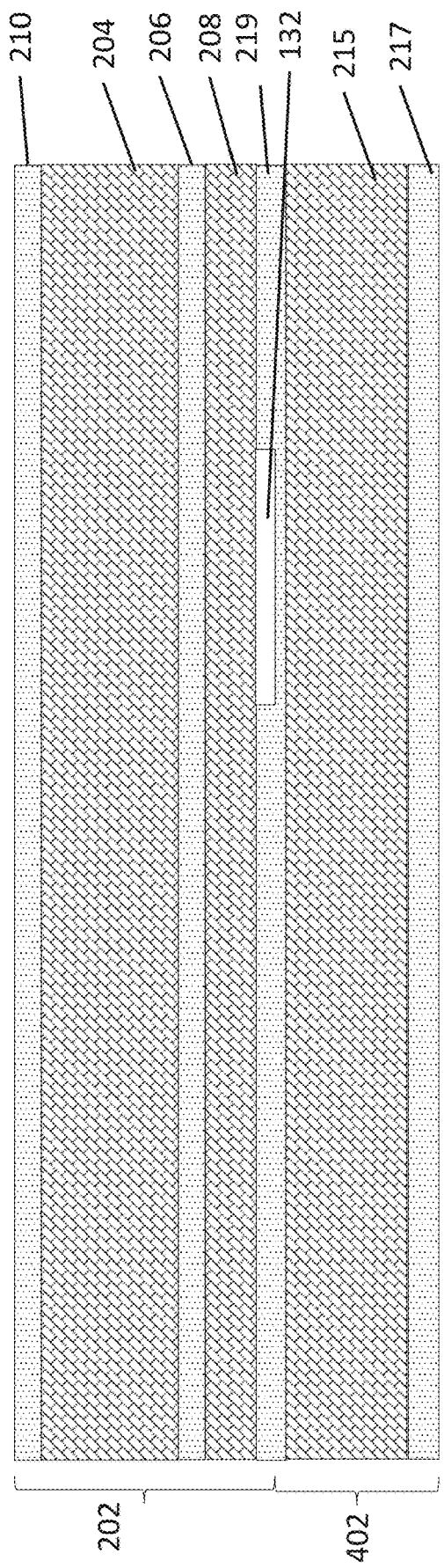

As shown in FIG. 47, the second substrate 202 is bonded to the third substrate 402. The bonding may be performed at a low temperature (e.g., a fusion bond below 450° C.), but may be followed by an anneal at a high temperature (e.g., at greater than 500° C.) to ensure sufficient bond strength. In the embodiment shown, the bond between the second substrate 202 and the third substrate 402 is an oxide-oxide (i.e., $SiO_2$—$SiO_2$) bond between the oxide layer 212 and the oxide layer 213. The combination of the oxide layer 212 and the oxide layer 213 is shown as oxide layer 219.

Figure 48:
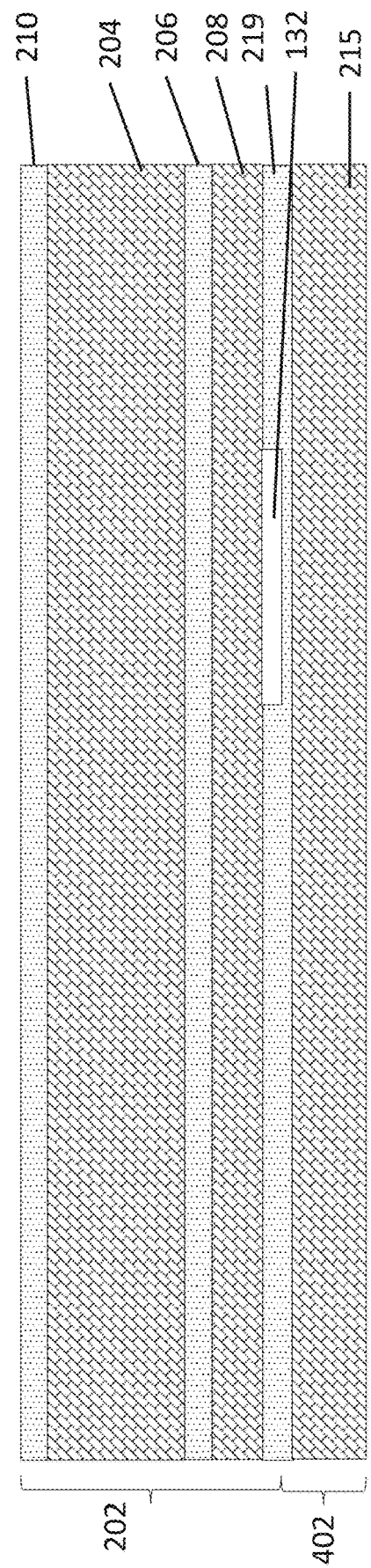

As shown in FIG. 48, the oxide layer 217 is removed and the silicon layer 215 is thinned, in any suitable manner. For example, grinding, etching, or any other suitable technique or combination of techniques may be used. As a result, the layers remaining from the third substrate 402 include the silicon layer 215 and the oxide layer 213. These layers may be thin (e.g., 40 microns, 30 microns, 20 microns, 10 microns, 5 microns, 2.5 microns, 2 microns, 1 micron, or less, including any range or value within the range less than 40 microns). However, because they are bonded to the second substrate 202 with its corresponding handle layer 204, sufficient structural integrity may be retained for this processing step and for further processing steps.

Figure 49:
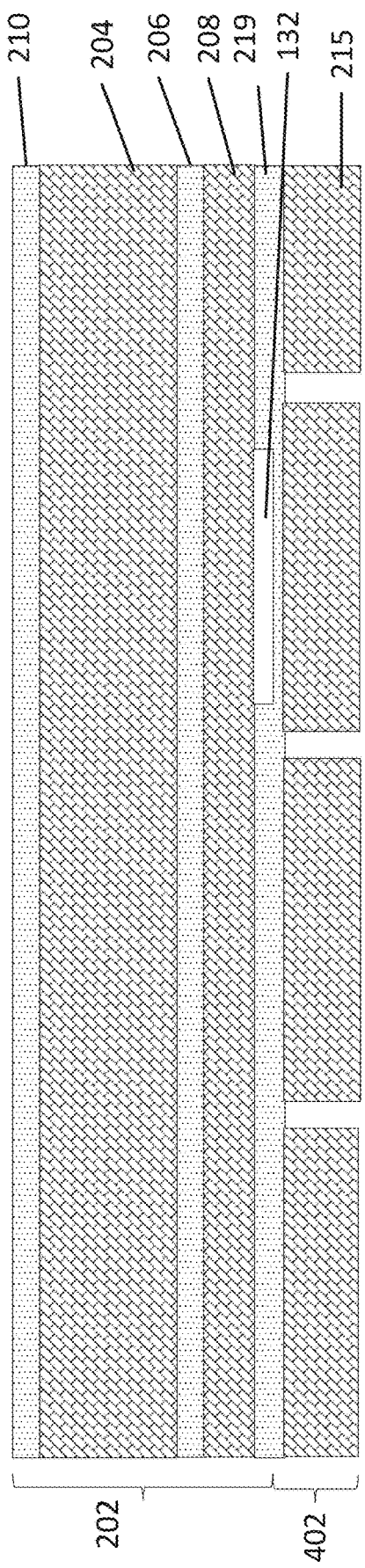

In some embodiments, it may be desirable to electrically isolate one or more ultrasonic transducers formed in the first substrate 202 and the third substrate 402. Thus, as shown in FIG. 49, isolation trenches 418 are formed in the silicon layer 215. In the illustrated embodiment, the isolation trenches 418 extend from a backside of the silicon layer 215 to the oxide layer 219, and are narrower (in the direction of left to right in the figure) than the portion(s) of the overlying oxide layer 219 to which each isolation trench 418 makes contact to prevent inadvertently punching through the oxide layer 219 into the cavity 132. Thus, the isolation trenches 418 do not impact the structural integrity of the cavity 132. However, alternative configurations are possible.

Figure 50:
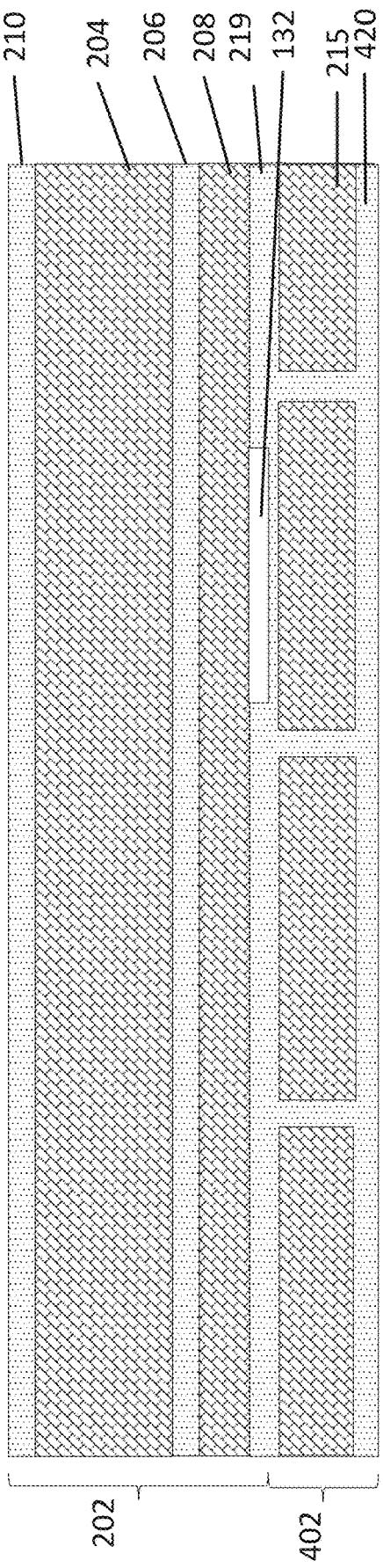

FIG. 50 illustrates that the isolation trenches 418 are filled with an insulating material 420 (e.g., thermal silicon oxide in combination with undoped polysilicon) using any suitable technique (e.g., a suitable deposition). It should be noted that in the embodiment illustrated, the insulating material 420 completely fills the isolation trenches 418 and does not simply line the isolation trenches 418, which may further contribute to the structural integrity of the device at this stage, rendering it more suitable for further processing.

Figure 51:
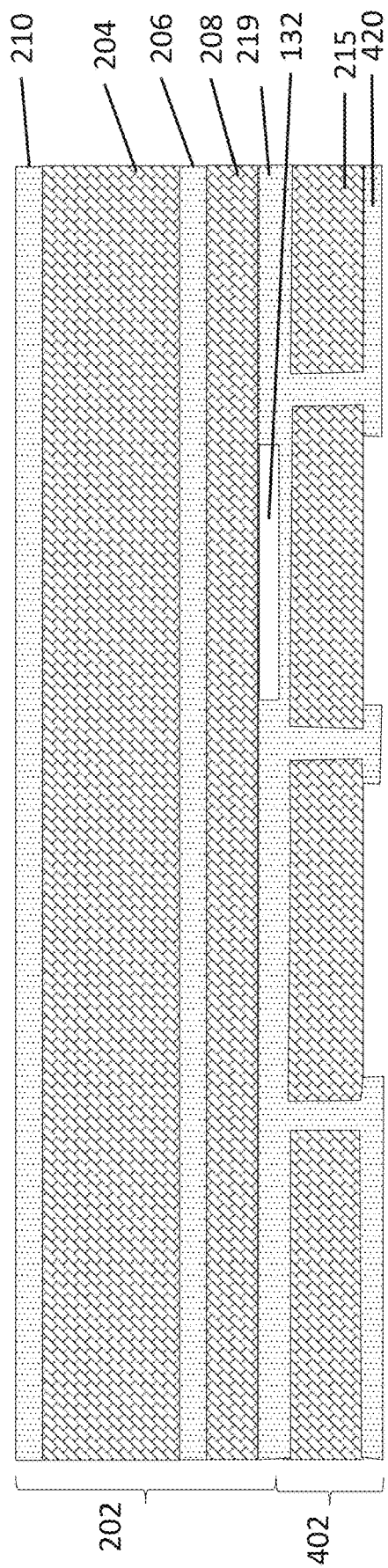

As shown in FIG. 51, the insulating material 420 is patterned (using any suitable etch technique) in preparation for forming bonding locations for later bonding of the second substrate 202 with the third substrate 402.

Figure 52:
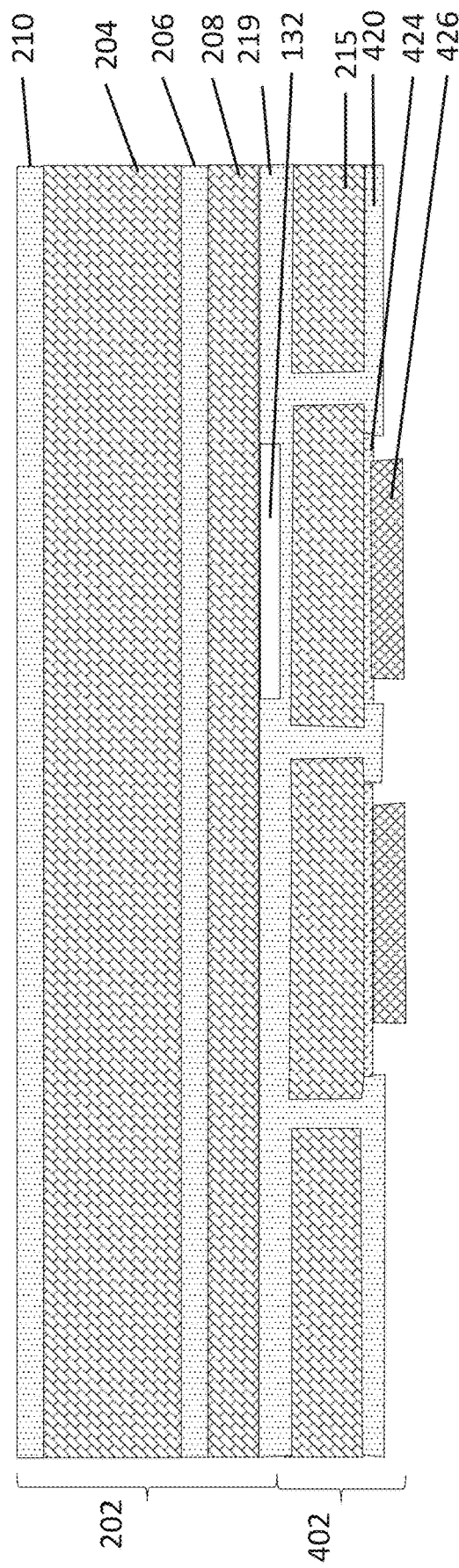

As shown in FIG. 52, bonding structures 426 are then formed on the third substrate 402 in preparation for bonding the third substrate 402 with the first substrate 102. The type of material included in the bonding structures 426 may depend on the type of bond to be formed. For example, the bonding structures 426 may include a metal suitable for thermocompression bonding, eutectic bonding, or silicide bonding. In some embodiments, the bonding structures 426 may include a conductive material so that electrical signals may be communicated between the first substrate 102 and the third substrate 402. For example, in some embodiments the bonding structures 426 may include gold and may be formed by electroplating. In some embodiments, materials and techniques used for wafer level packaging may be applied in the context of bonding the first substrate 102 with the third substrate 402. Thus, for example, stacks of metals selected to provide desirable adhesion, interdiffusion barrier functionality, and high bonding quality may be used, and the bonding structures 426 may include such stacks of metals. In FIG. 52, the bonding structures 426 are shown adhered to adhesion structures 424 on the silicon layer 215.

Figure 53:
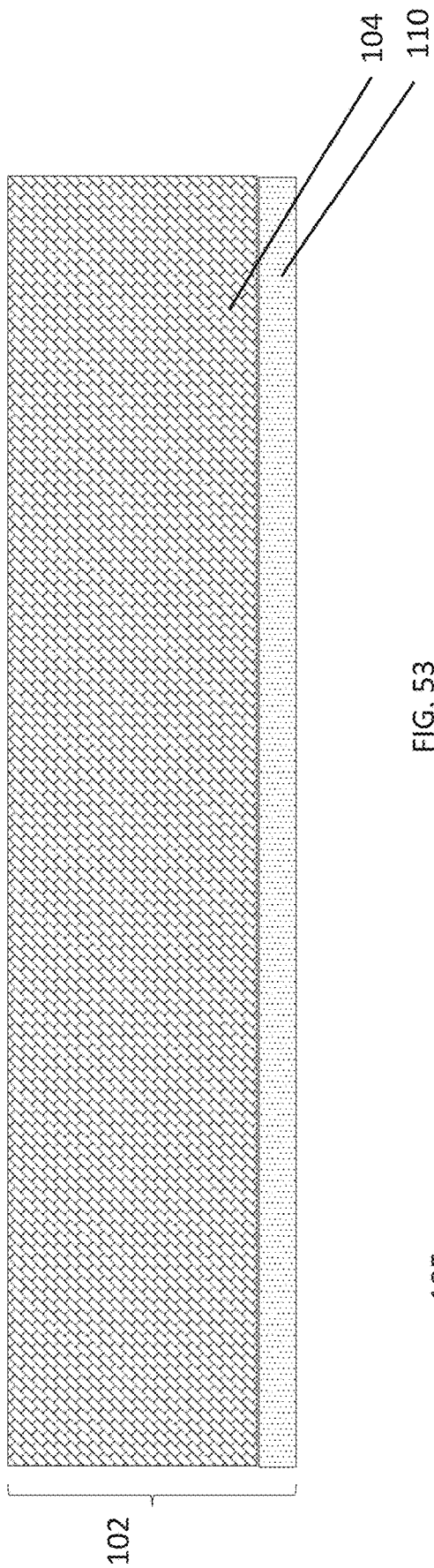

As shown in FIG. 53, a first substrate 102 includes a base layer (e.g., a bulk silicon wafer) 104 and an insulating layer 110 is formed on the backside of the base layer 104. The first substrate 102 may be a complementary metal oxide semiconductor (CMOS) substrate. Semiconductor structures (not specifically shown in FIG. 53) such as transistors may be formed in the base layer 104 as part of front-end-of-line (FEOL) processes.

Figure 54:
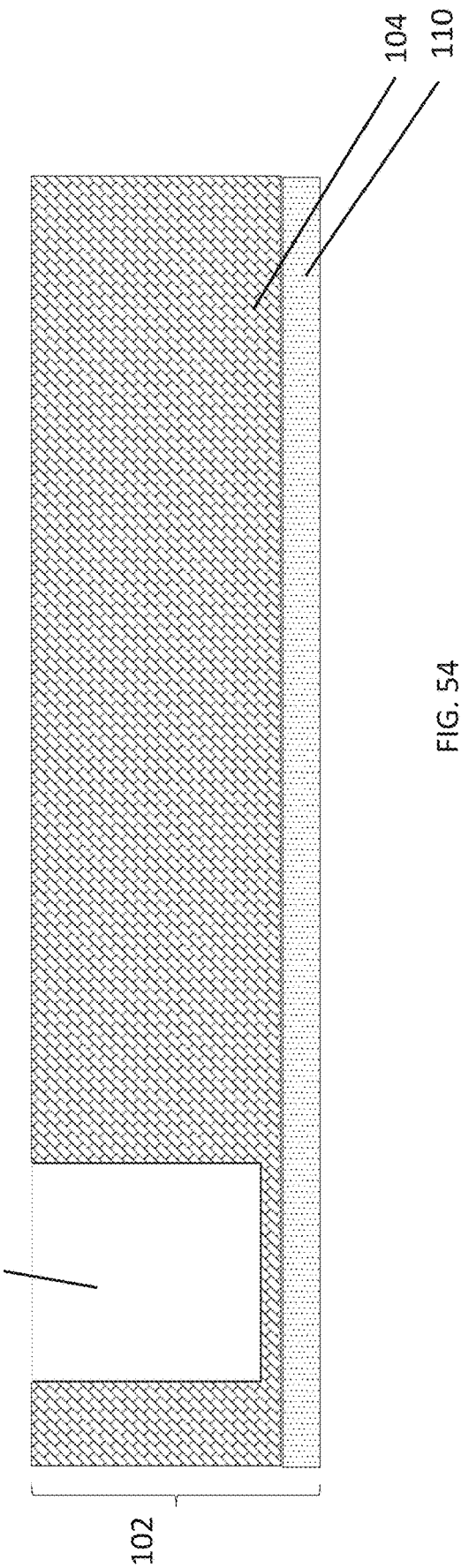

In FIG. 54, a trench 105 is etched (using any suitable etching agent) in the base layer 104.

Figure 55:
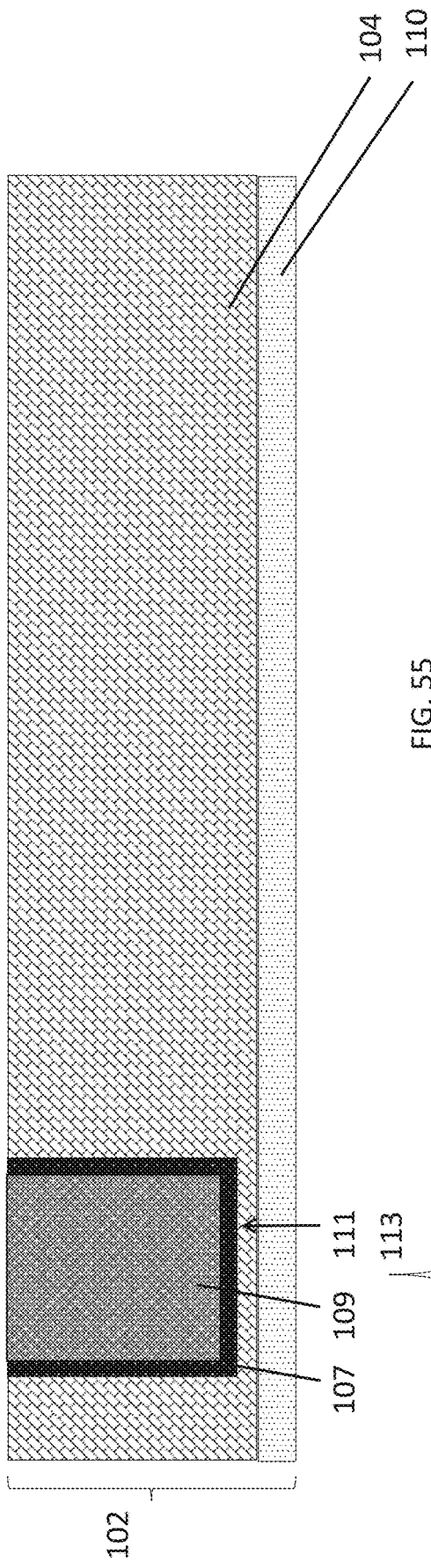

In FIG. 55, a liner material 107 (e.g., e.g., a silicon oxide layer, a barrier layer such as titanium or tantalum, and/or a seed layer such as copper) and a via material 109 (e.g., copper, doped polysilicon, or tungsten) is deposited in the trench 105 to form a through-silicon via (TSV) 111. This may be accomplished in three steps: blanket deposition of the liner material 107, followed by blanket deposition of the via material 109, followed by CMP down to the top of the first substrate 102.

Figure 56:
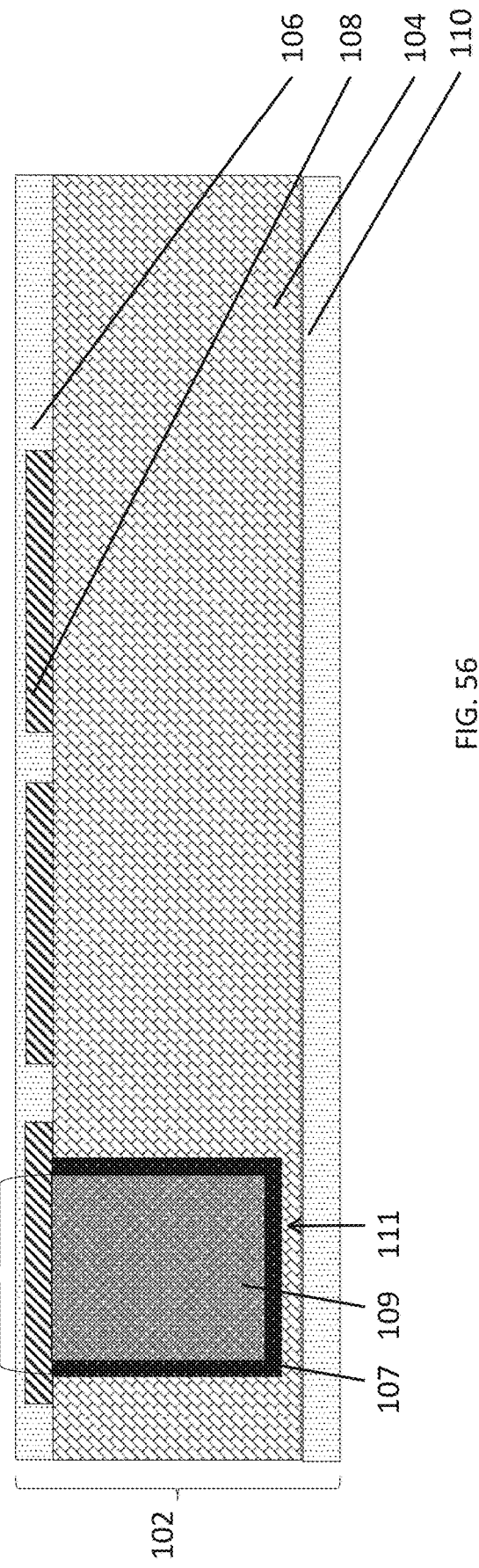

In FIG. 56, metallization 108 and an insulating layer 106 are formed on the first substrate 102 as part of back-end-of-line (BEOL) processes. The metallization 108 may be formed of aluminum, copper, or any other suitable metallization material, and may represent at least part of an integrated circuit formed in the second substrate 102. For example, the metallization 108 may serve as routing layers, may be patterned to form one or more electrodes, or may be used for other functions. In practice, the first substrate 102 may include more than one metallization layer and/or post-processed redistribution layer, but for simplicity only one metallization is illustrated. A portion 113 of the metallization 108 is formed in contact with the TSV 111. The steps shown in FIGS. 53-56 for forming the first substrate 102 may be performed at a commercial foundry. The TSV 111 is formed after FEOL processes but before BEOL processes. This may be considered a "TSV-Middle" process.

Figure 57:
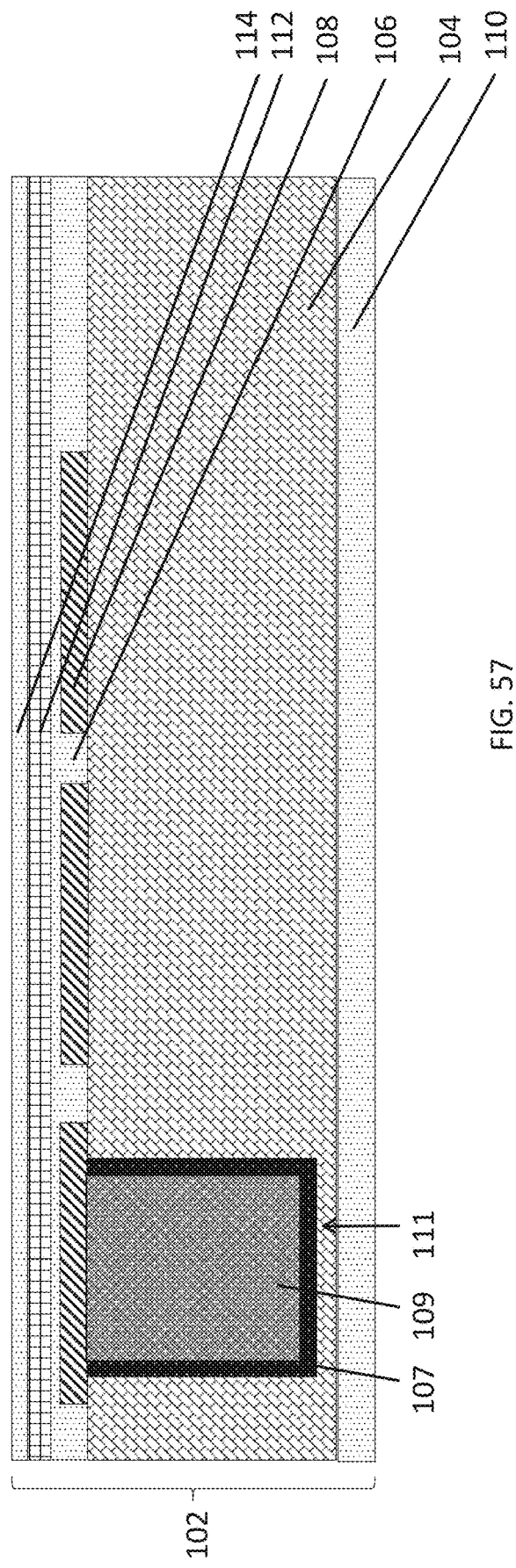

As shown in FIG. 57, layers 112 and 114 are formed on the first substrate 102. The layer 112 may be, for example, a nitride layer and may be formed by plasma enhanced chemical vapor deposition (PECVD). The layer 114 may be an oxide layer, for example formed by PECVD of oxide.

Figure 58:
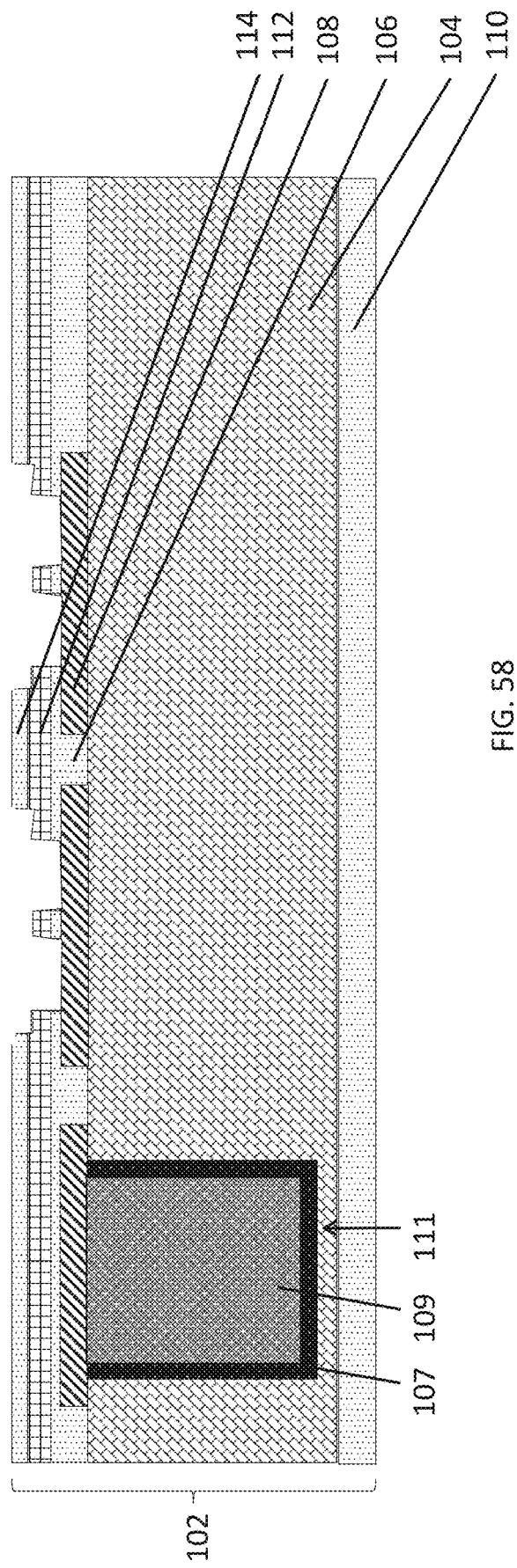

In FIG. 58, openings 116 are formed from the layer 114 to the metallization 108. Such openings are formed, for example, by patterning a photoresist layer (not shown) followed by etching exposed regions of layers 114 and 112 in preparation for forming bonding points.

Figure 59:
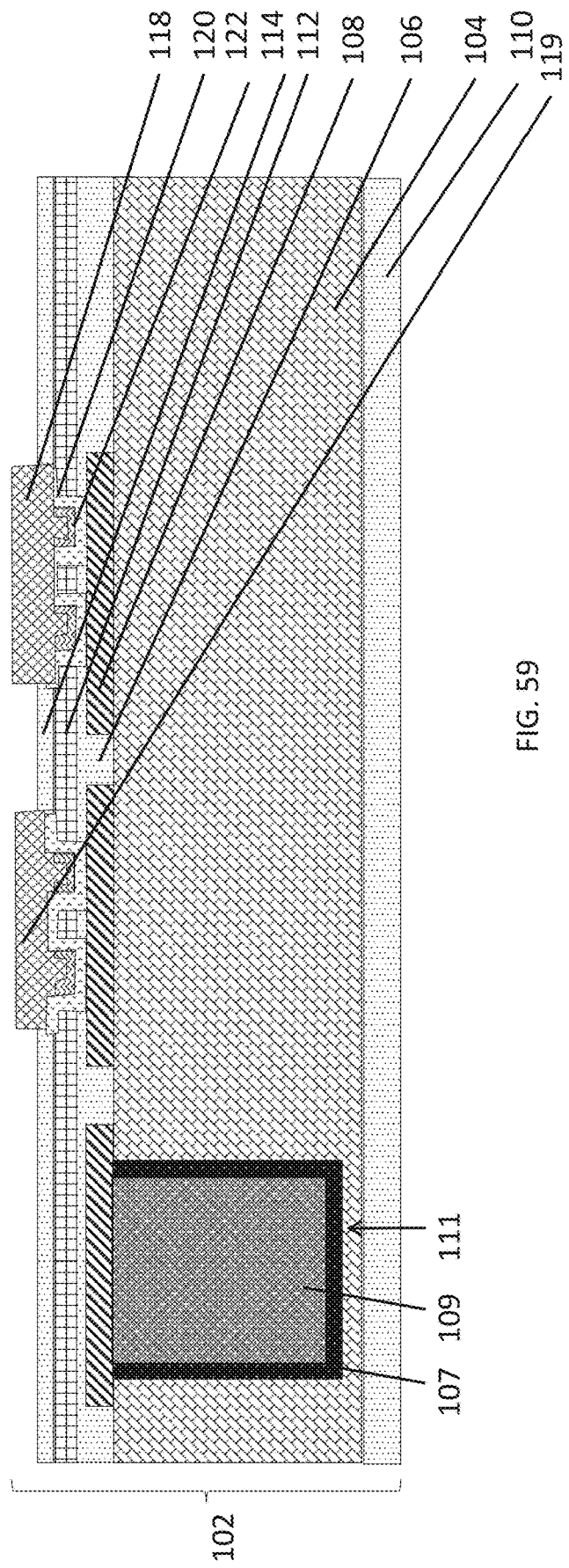
Figure 60:
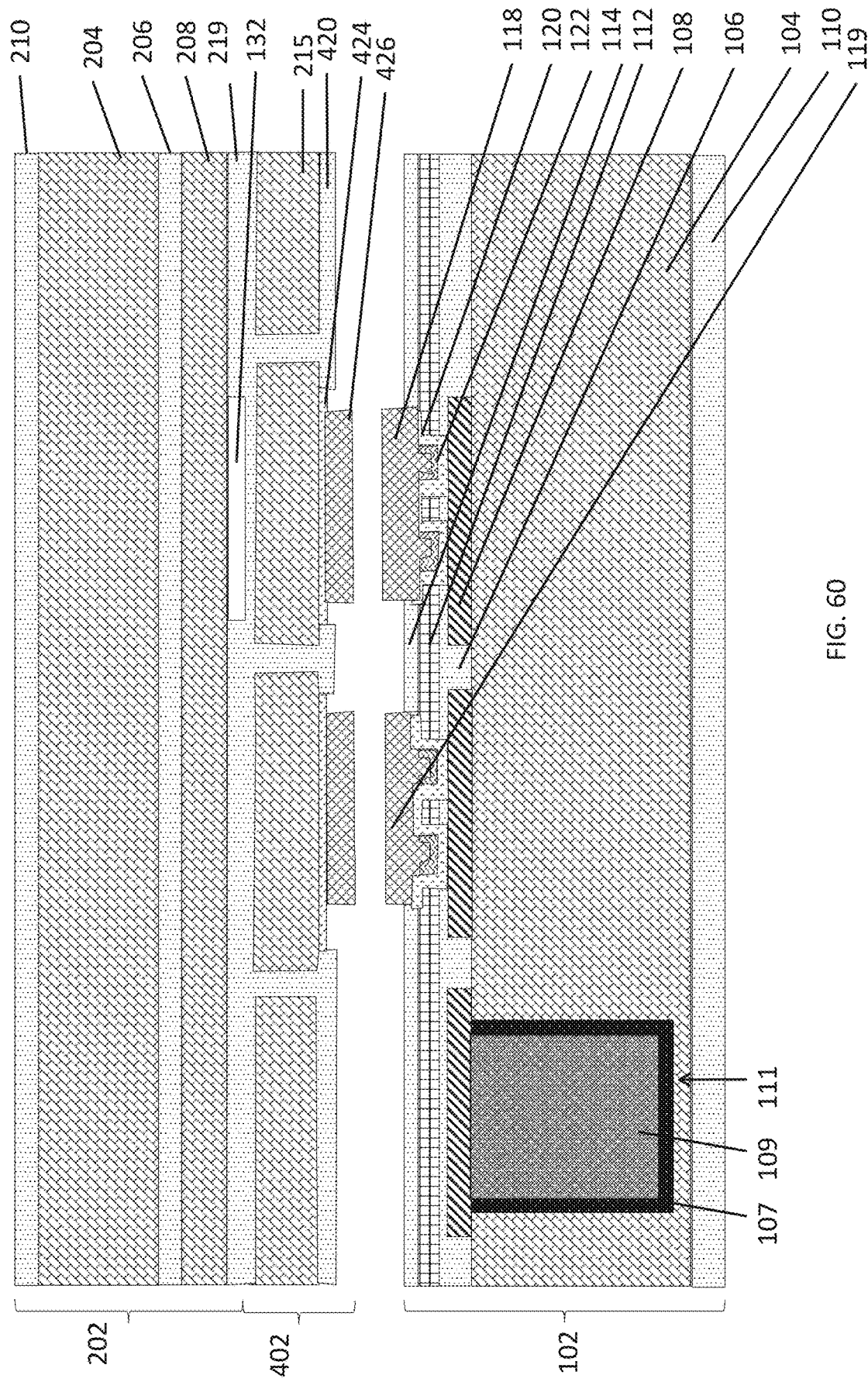
Figure 61:
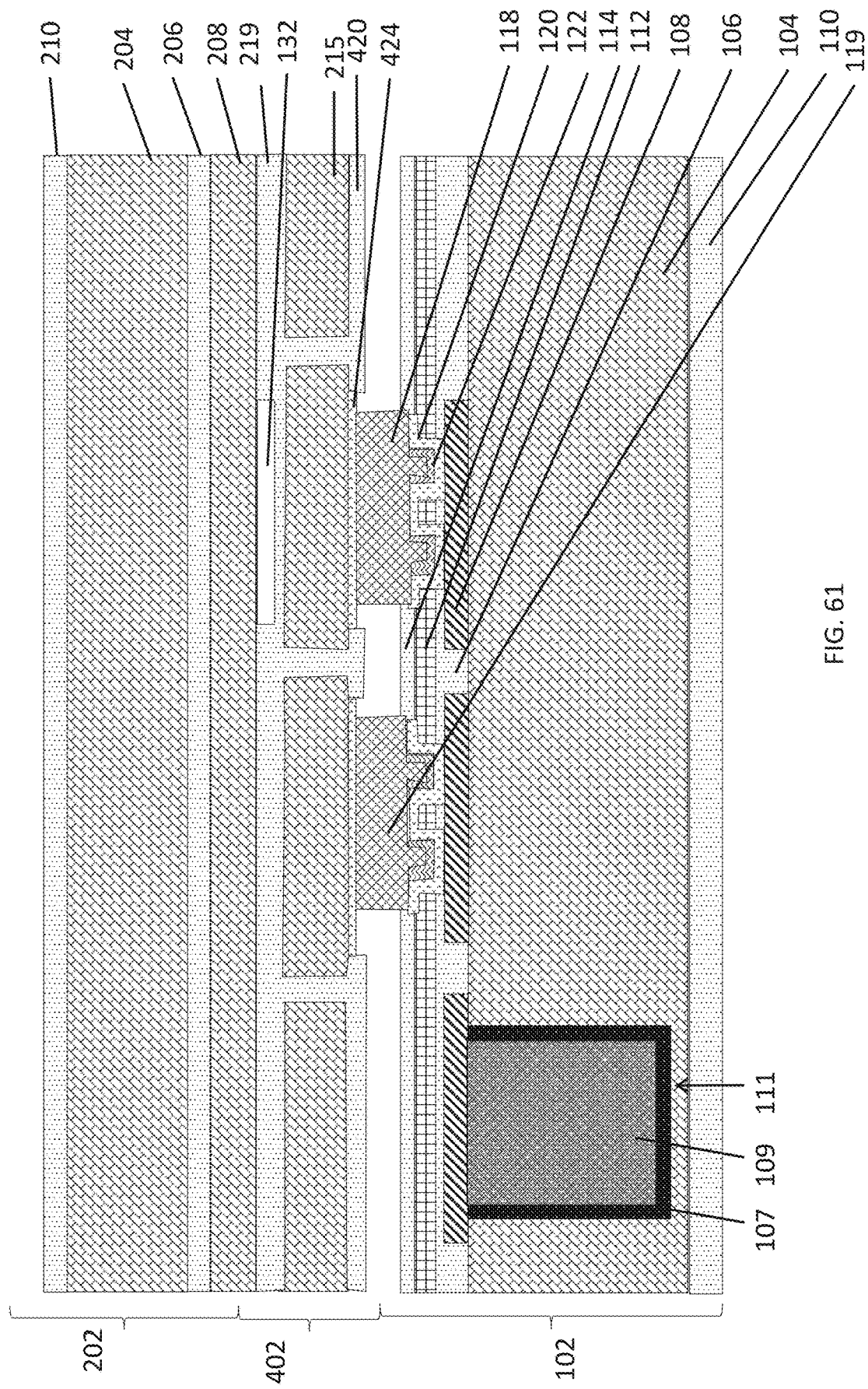

In FIG. 59, bonding structures 436 are formed on the first substrate 102 (by suitable deposition and patterning). The bonding structures 436 are shown adhered to the metallization 108 through adhesion structures 120 and 122. The bonding structures 436 may include any suitable material for bonding with the bonding structures 426 on the third substrate 402. In some embodiments a low temperature eutectic bond may be formed, and in such embodiments the bonding structures 426 and the bonding structures 436 may form eutectic pairs. For example, the bonding structures 426 and the bonding structures 436 may form indium-tin (In—Sn) eutectic pairs, gold-tin (Au—Sn) eutectic pairs, aluminum-germanium (Al—Ge) eutectic pairs, or tin-silver-copper (Sn—Ag—Cu) combinations. In the case of Sn—Ag—Cu, two of the materials may be formed on the third substrate 402 as the bonding structures 426 with the remaining material formed as the bonding structures 436. The bonding structures 436 (and other bonding structures discussed herein with similar forms) may not be shown to scale, for example, downward protrusions shown in the bonding structure 436 may be substantially smaller in height than the height of the rest of the bonding structure 436, As shown in FIGS. 60-61, the first substrate 102 and the third substrate 402 are then bonded together. Such bonding may, in some embodiments, involve only the use of low temperature (e.g., below 450° C.) which may prevent damage to the metallization 108 and other components on the first substrate 102.

In the non-limiting example illustrated, the bond is a eutectic bond, such that the bonding structures 426 and the bonding structures 436 in combination form the bonding points 118 and 119. The bonding points 118 and 119 form electricals contact between the first substrate 102 and the third substrate 402. As a further non-limiting example, a thermocompression bond may be formed using Au as the bonding material. For instance, the bonding structures 426 may include seed layers (formed by sputtering or otherwise) of Ti/TiW/Au with plated Au formed thereon, and the bonding structures 436 may include a seed layer (formed by sputtering or otherwise) of TiW/Au with plated Ni/Au formed thereon. The layers of titanium may serve as adhesion layers. The TiW layers may serve as adhesion layers and diffusion barriers. The nickel may serve as a diffusion barrier. The Au may form the bond. Other bonding materials may alternatively be used.

Figure 62:
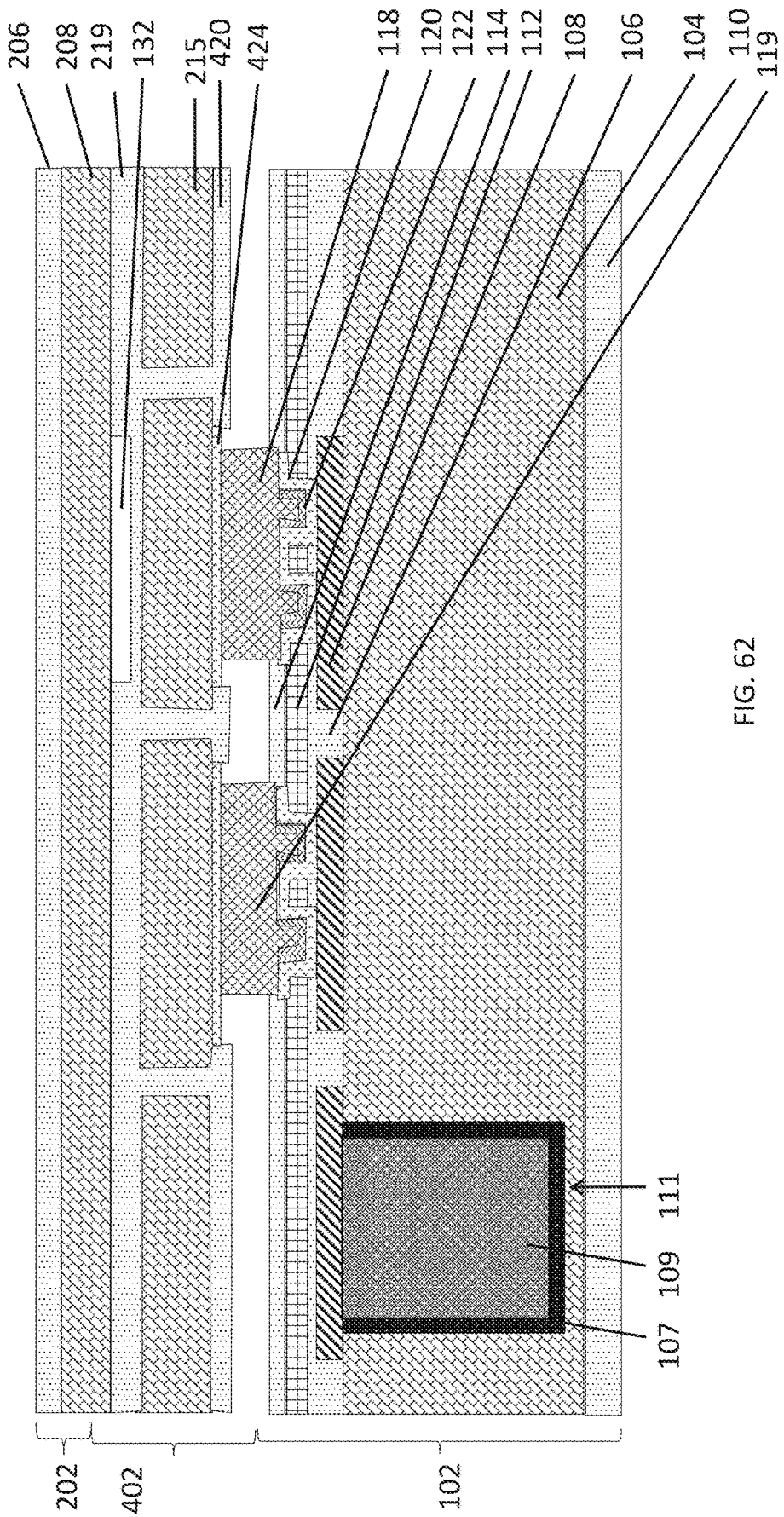

In FIG. 62 the oxide layer 210, the handle layer 204, and the BOX layer 206 are removed. For example, grinding, etching, or any other suitable technique or combination of techniques may be used.

Figure 63:
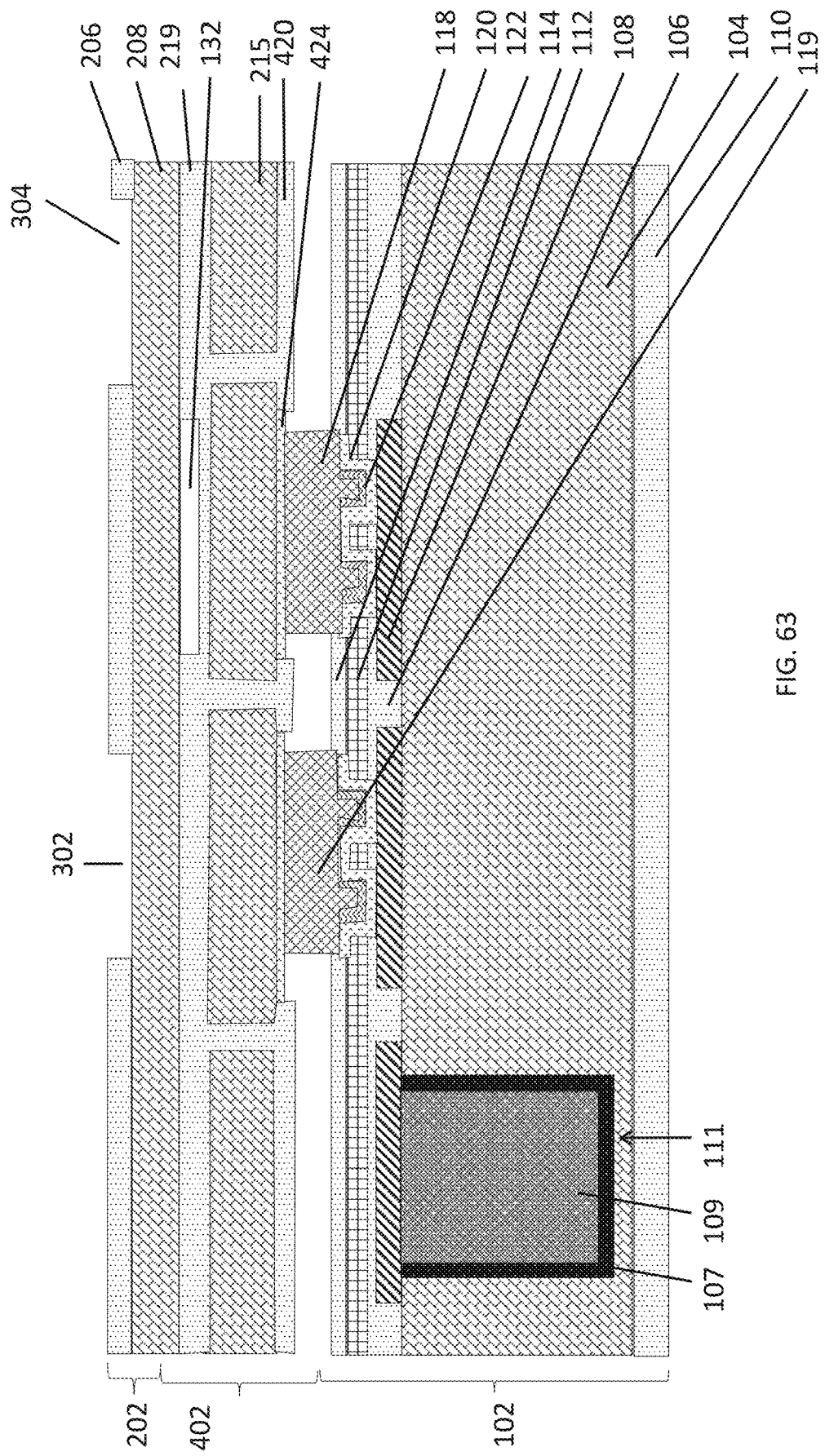
Figure 64:
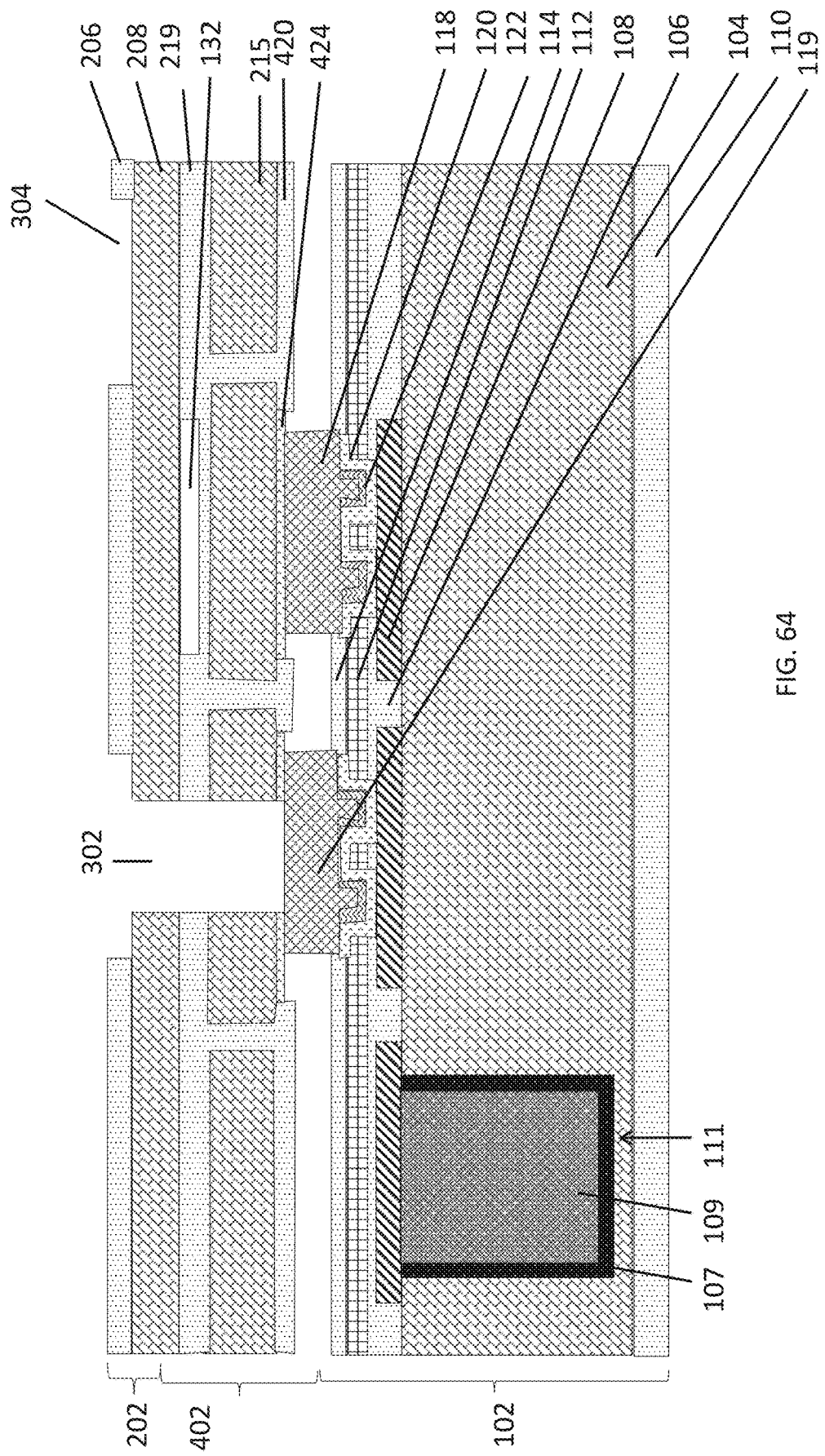

In FIGS. 63-64, an opening 302 is formed in the BOX layer 206, the silicon device layer 208, the oxide layer 212, the third insulating layer 128, the second insulating layer 126, and the first insulating layer 124. An opening 304 is formed in the BOX layer 206. The opening 302 and the opening 304 may be formed using any suitable patterning and etching agents. As will be described further below, the opening 302 and the opening 304 will be used to facilitate electrical contact between the first substrate 102 and top membranes of CMUTs.

Figure 65:
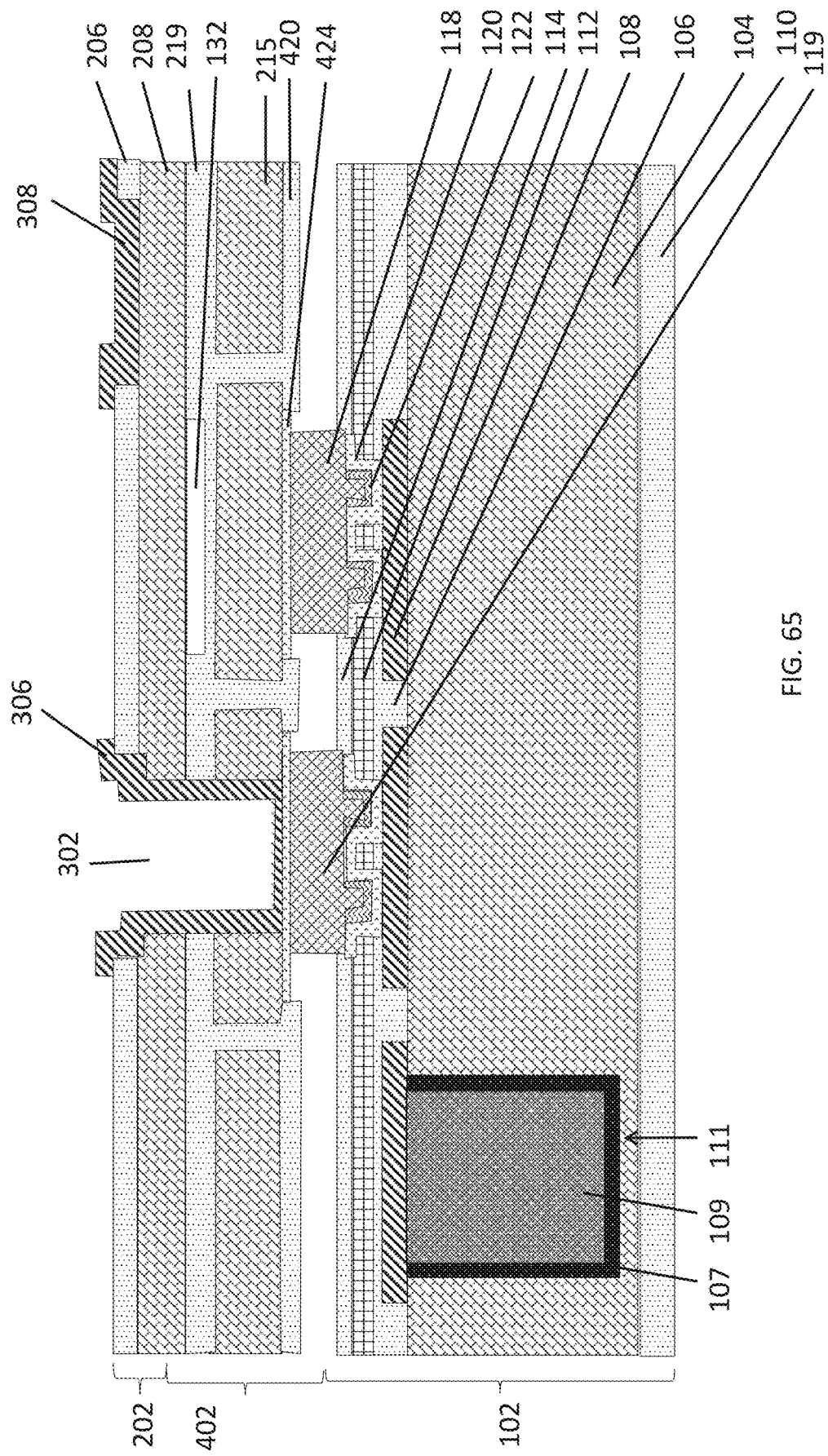

In FIG. 65, metal 306 is deposited inside the opening 302 such that the metal 306 lines the opening 302 and is deposited on portions of the silicon device layer 208 adjacent to the opening 302. Metal 308 is deposited on the opening 304 such that the metal 308 fills the opening 304 and is deposited on portions of the silicon device layer 208 adjacent to the opening 304. The metal 308 and metal 306 may include, for example, aluminum.

Figure 66:
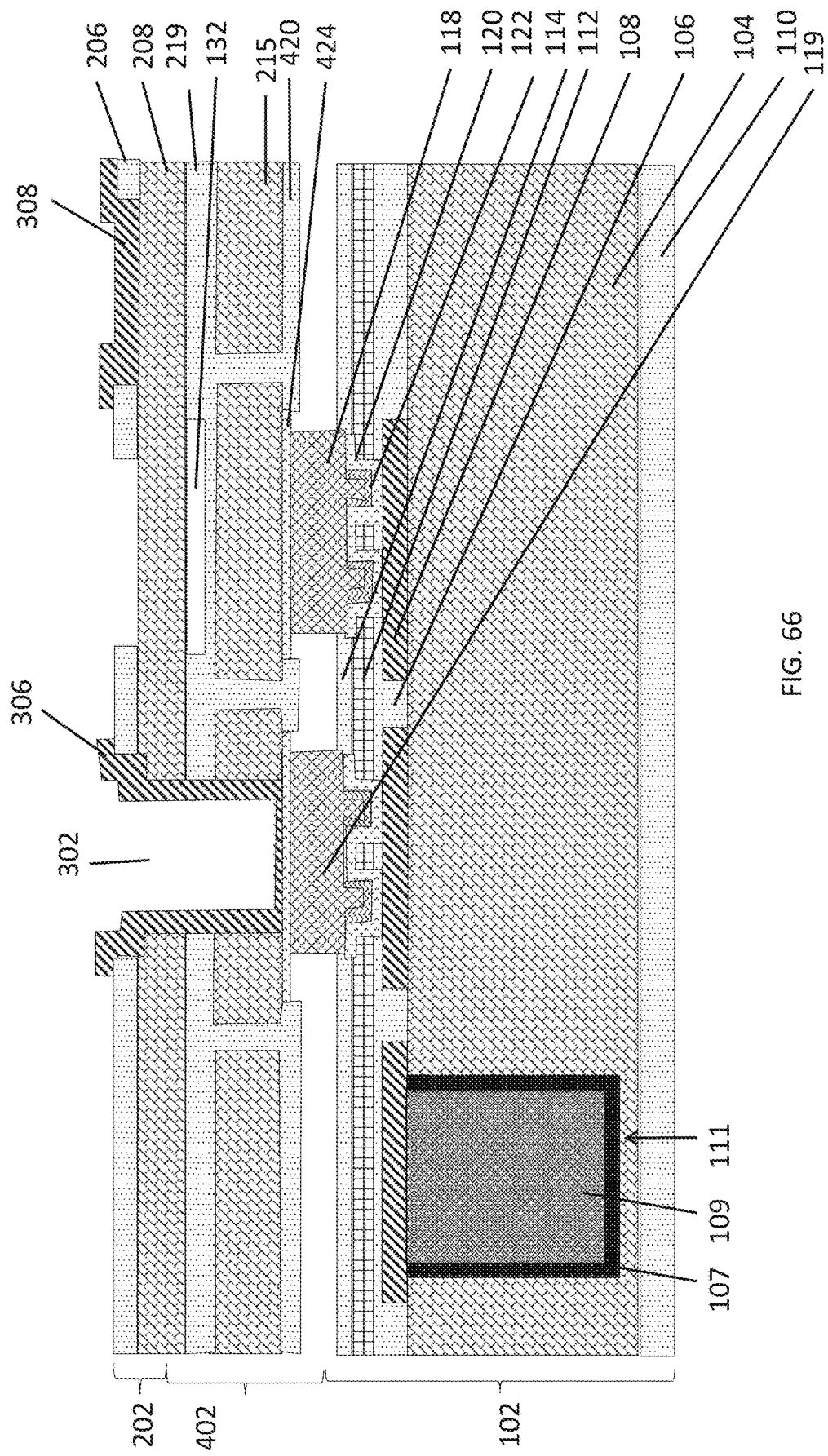

In FIG. 66, a portion of the BOX layer 206 above the cavity 132 is etched using any suitable etching agent.

Figure 67:
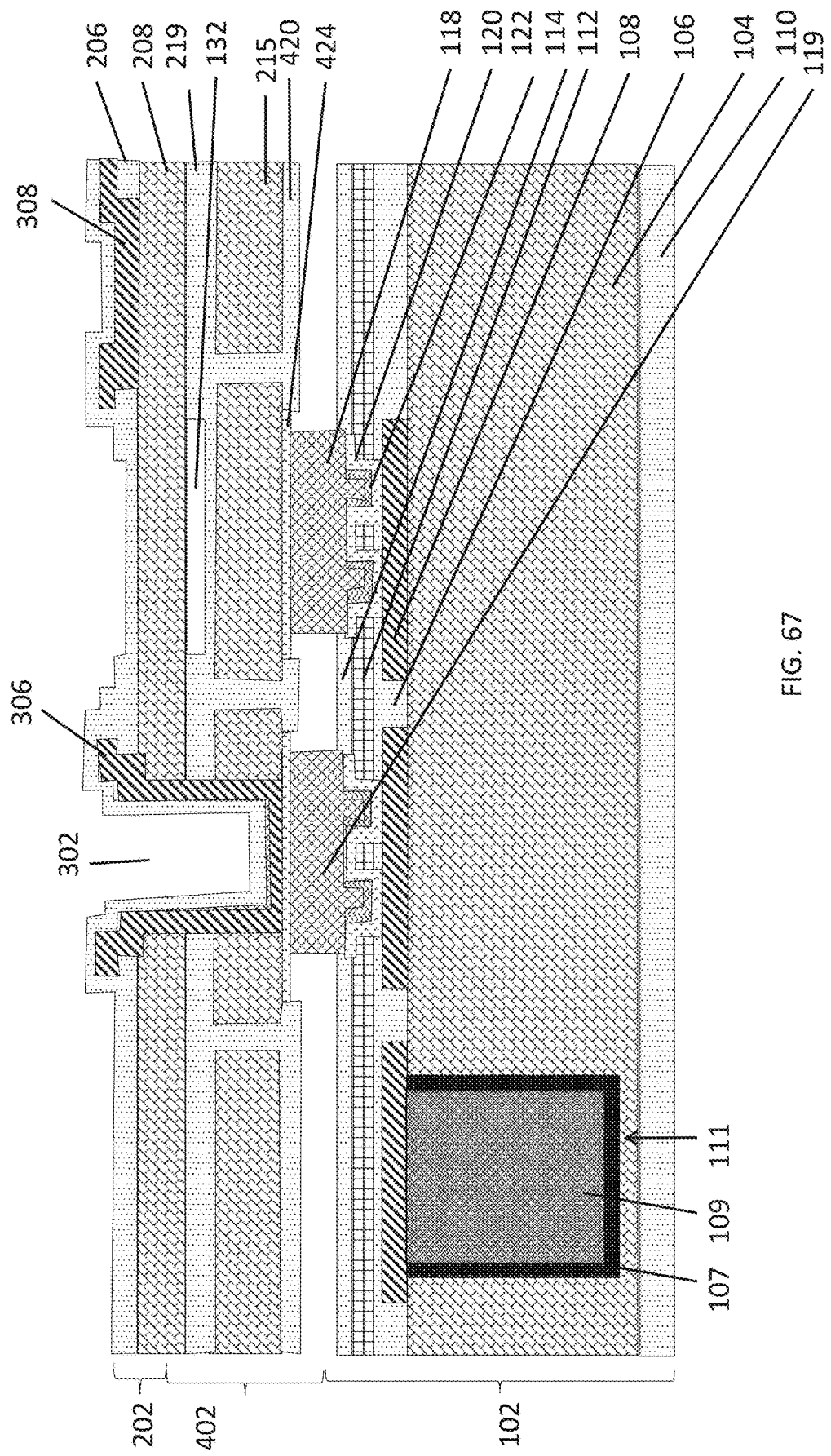

In FIG. 67, further material is added to the BOX layer 206. The material is formed on the metal 306 and the metal 308 and lines the opening 302. Etching the BOX layer 206 (as shown in FIG. 66) above the cavity 132 before this addition of material may help to reduce how much material is disposed above the cavity 132 and improve the acoustic performance of the ultrasonic transducer that includes the cavity 132. For example, the thickness of material above the cavity 132 may be controlled to be approximately 6 microns.

Figure 68:
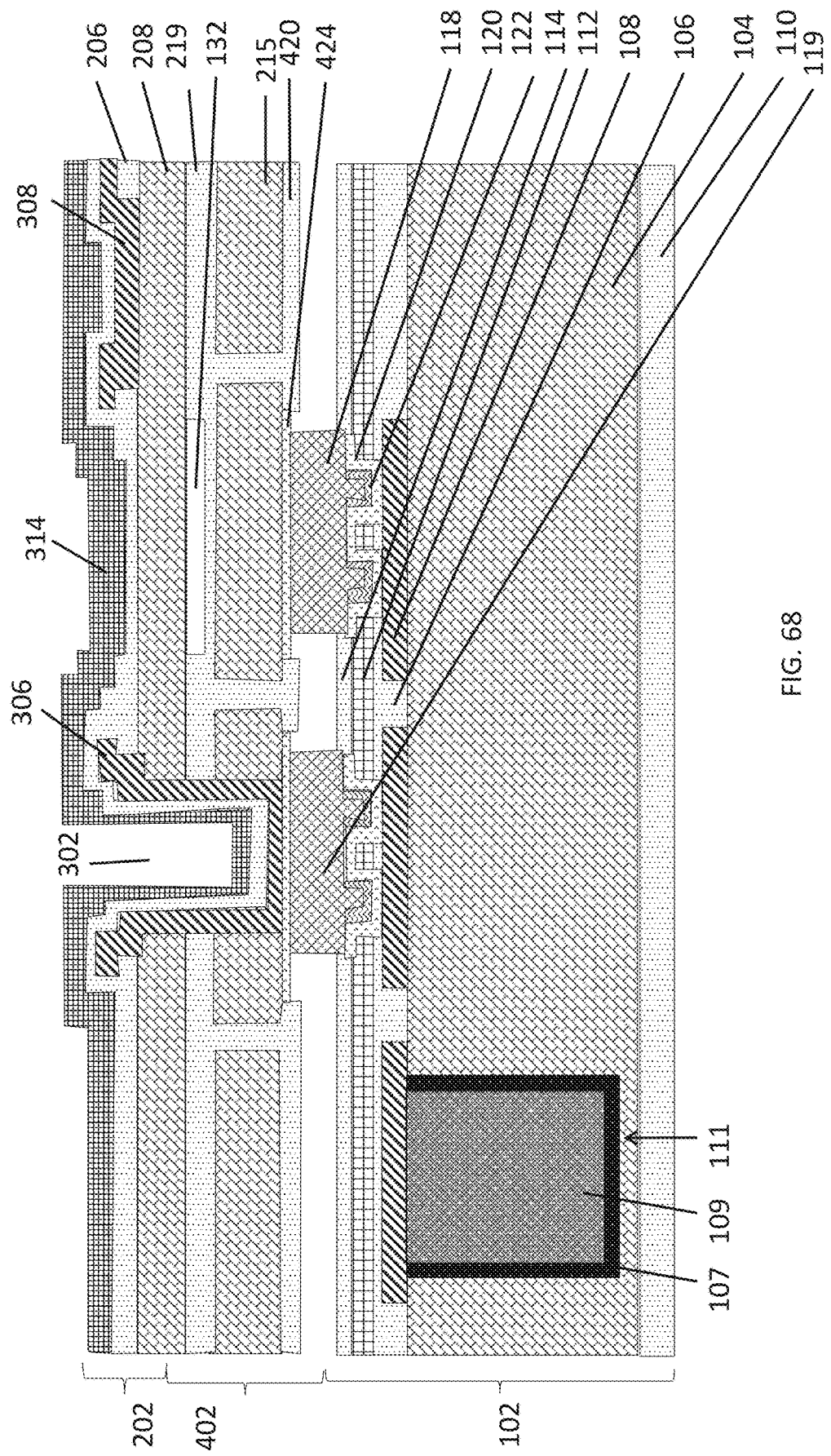

In FIG. 68, passivation material 314 (e.g., polyimide) is formed on the second substrate 202. The passivation material 314 is formed on the BOX layer 206 and lines the opening 302.

Figure 69:
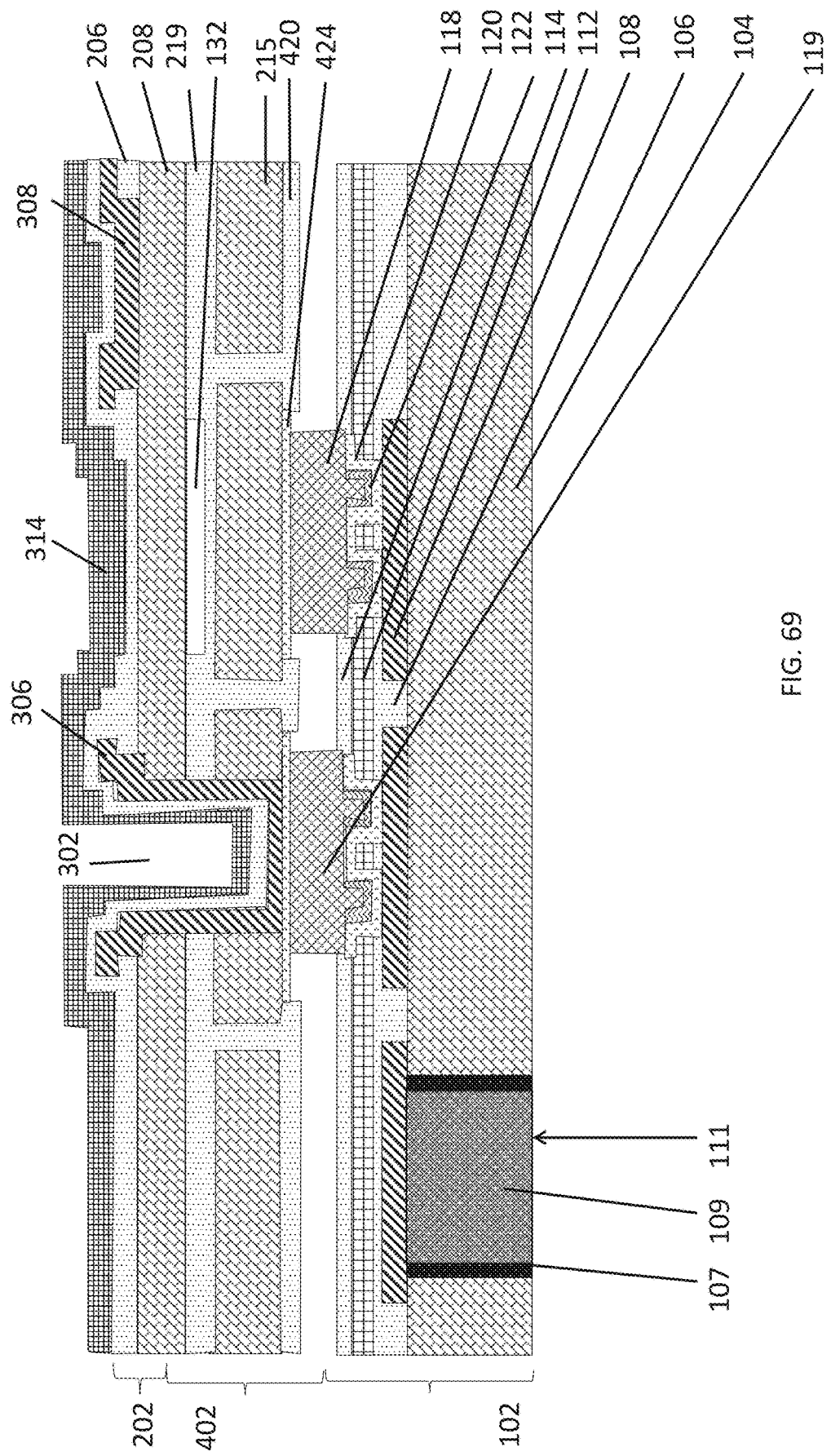

In FIG. 69, the insulating layer 110 of the first substrate 102 is removed and the base layer 104 is thinned, in any suitable manner. For example, grinding, etching, or any other suitable technique or combination of techniques may be used. Ultraviolet release grinding tape may be used to handle the substrates during grinding of the first substrate. For example, the ultraviolet release grinding tape may adhere the top of the substrate 202 to a surface during grinding of the first substrate 102. As a result of thinning the base layer 104, the TSV 111 is exposed. Therefore, the TSV 111 may be coupled (e.g., through an interposer, not shown) to an external device (not shown), thereby enabling transmission of electrical signals from the external device, to the TSV 111, to the metallization 108, and to circuitry within the first substrate 102.

The process described above may be used to produce a capacitive micromachined ultrasonic transducer (CMUT). The cavity 132 may be the micromachined cavity of the CMUT, the silicon device layer 208 above the cavity 132 may be the top membrane of the CMUT, and the silicon layer 215 below the cavity 132 may be the bottom electrode of the CMUT. Circuitry within the first substrate 102 may transmit electrical signals to the bottom electrode of the CMUT (namely, the silicon layer 215) through the metallization 108, the adhesion structures 120 and 122, the bonding point 118, and the adhesion structure 424 that are electrically connected to the silicon layer 215. Circuitry within the first substrate 102 may transmit electrical signals to the top membrane of the CMUT (namely the silicon device layer 208) though the metallization 108, the adhesion structures 120 and 122, the bonding point 119, the adhesion structures 424, and the metal 306 that are electrically connected to the silicon device layer 208. The metal 306 may electrically connect to the metal 308 and other metal structures on the silicon device layer 208 in order to distribute an electrical signal throughout portions of the silicon device layer 208 that may serve as top membranes for multiple CMUTs. For further discussion of the metal 306 and the metal 308, see FIG. 82. The above discussion of the CMUTs and the metal connections also applies to the process shown in FIGS. 70-73.

FIGS. 70-73 illustrate example cross-sections of an ultrasound transducer device during a fabrication sequence for forming the ultrasound transducer device in accordance with certain embodiments described herein. The fabrication sequence includes fabricating cavities for capacitive micromachined ultrasonic transducers (CMUTs) by bonding two substrates together, and bonding those two substrates to a substrate that includes integrated circuitry. The fabrication sequence of this exemplary embodiment eliminates the need for wirebond formation and further includes fabricating through-silicon vias (TSVs) in the substrate that includes the integrated circuitry using a "TSV-Last" process. It will be appreciated that the fabrication sequence shown is not limiting, and some embodiments may include additional steps and/or omit certain shown steps.

Figure 70:
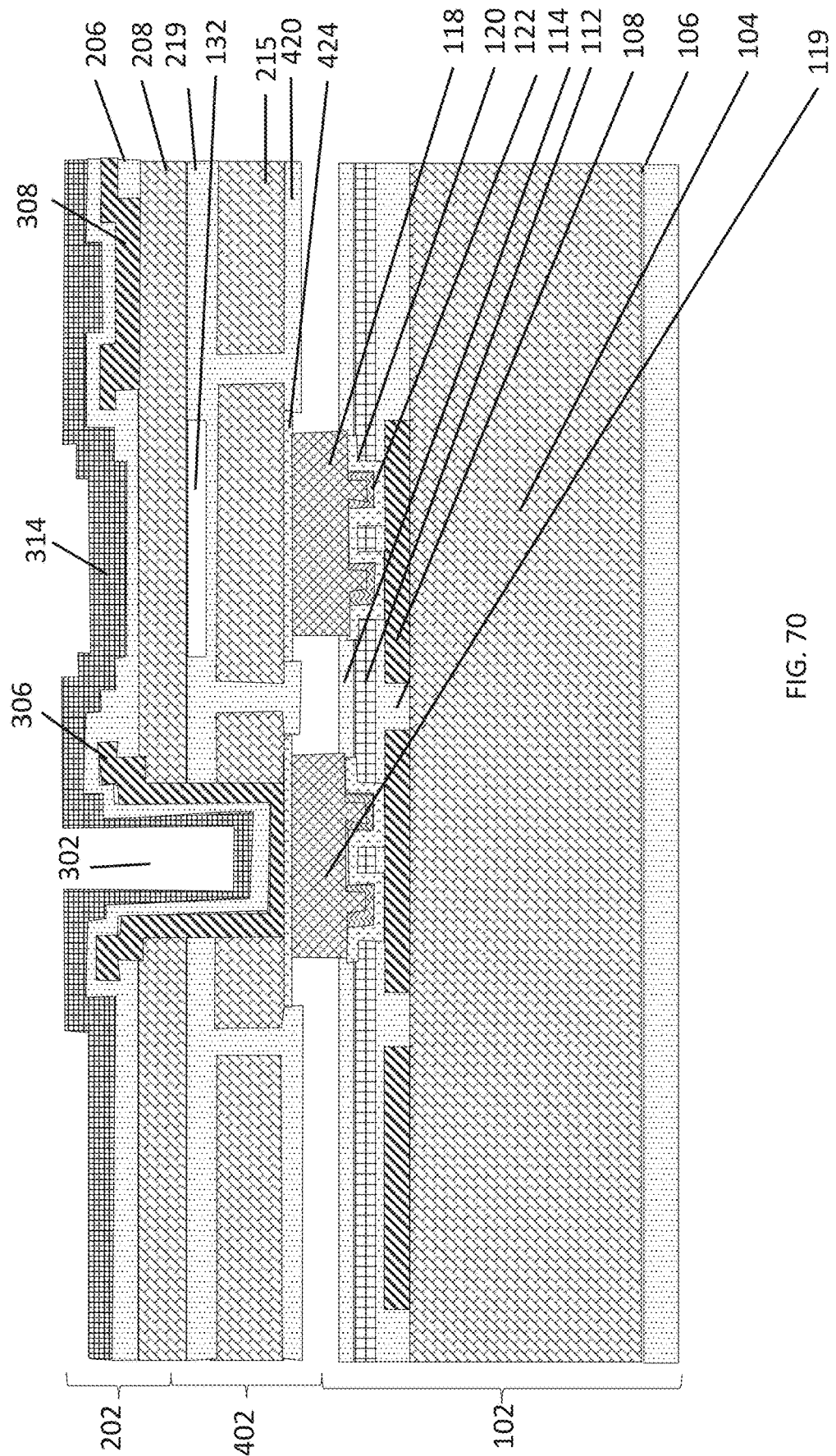
FIGS. 70-73 illustrate example cross-sections of an ultrasound transducer device during a fabrication sequence for forming the ultrasound transducer device in accordance with certain embodiments described herein. The fabrication sequence includes fabricating cavities for CMUTs by bonding two substrates together, and bonding those two substrates to a substrate that includes integrated circuitry. The fabrication sequence further includes fabricating TSVs in the substrate that includes the integrated circuitry using a "TSV-Last" process.

Referring to FIG. 70, a bonded structure is depicted that includes two bonded substrates (a second substrate 202 and a third substrate 402) bonded to a first substrate 102. The structure shown in FIG. 39 may be formed using the processing steps shown in FIGS. 43-52 and 57-61, but in this embodiment the TSV 111 (as shown in FIGS. 53-56) is not yet formed.

Figure 71:
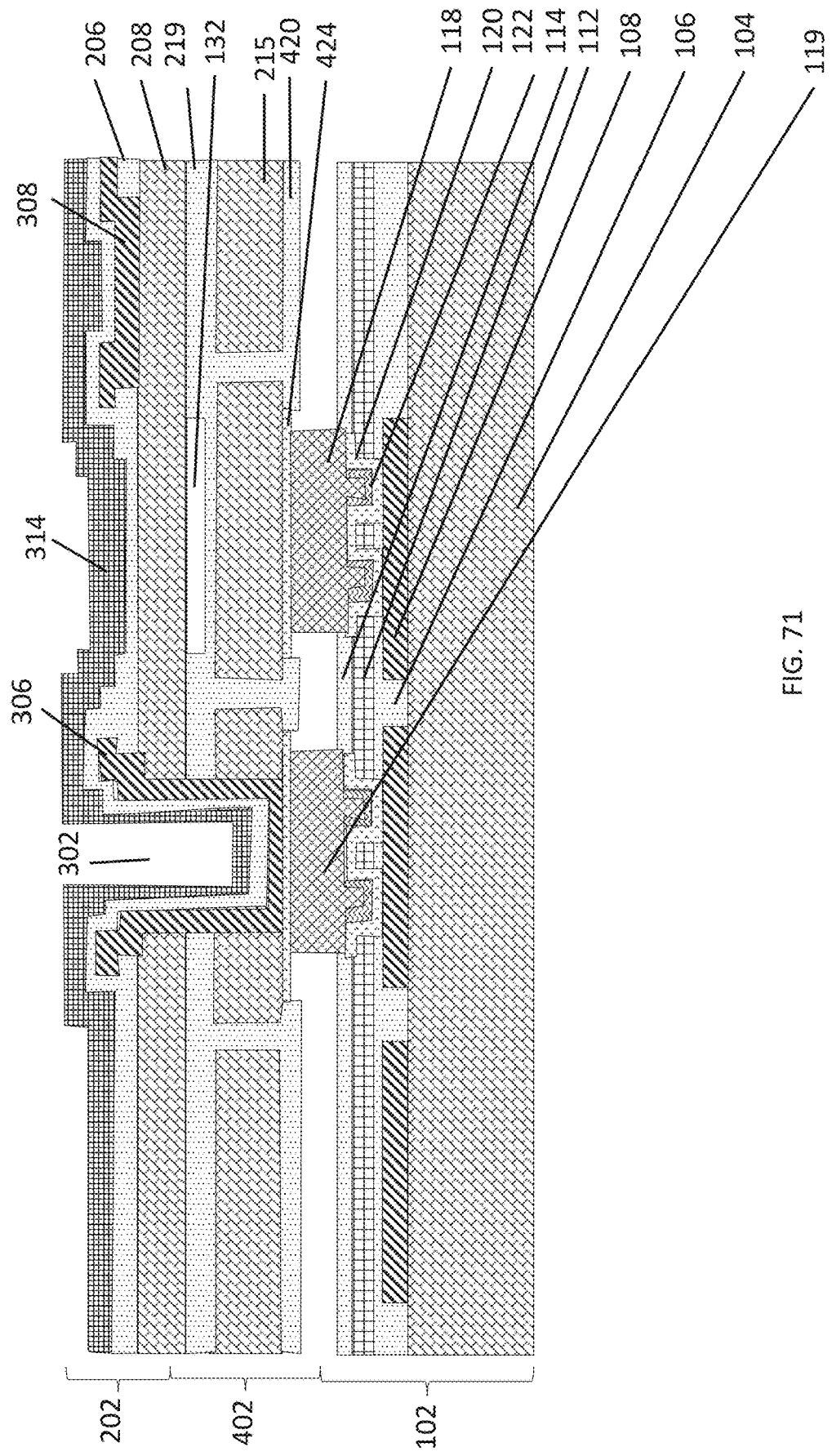

Then, as shown in FIG. 71, the insulating layer 110 of the first substrate 102 is removed and the base layer 104 is thinned, in any suitable manner. For example, grinding, etching, or any other suitable technique or combination of techniques may be used. Ultraviolet release grinding tape may be used to handle the substrates during grinding of the first substrate. For example, the ultraviolet release grinding tape may adhere the top of the substrate 202 to a surface during grinding of the first substrate 102.

Figure 72:
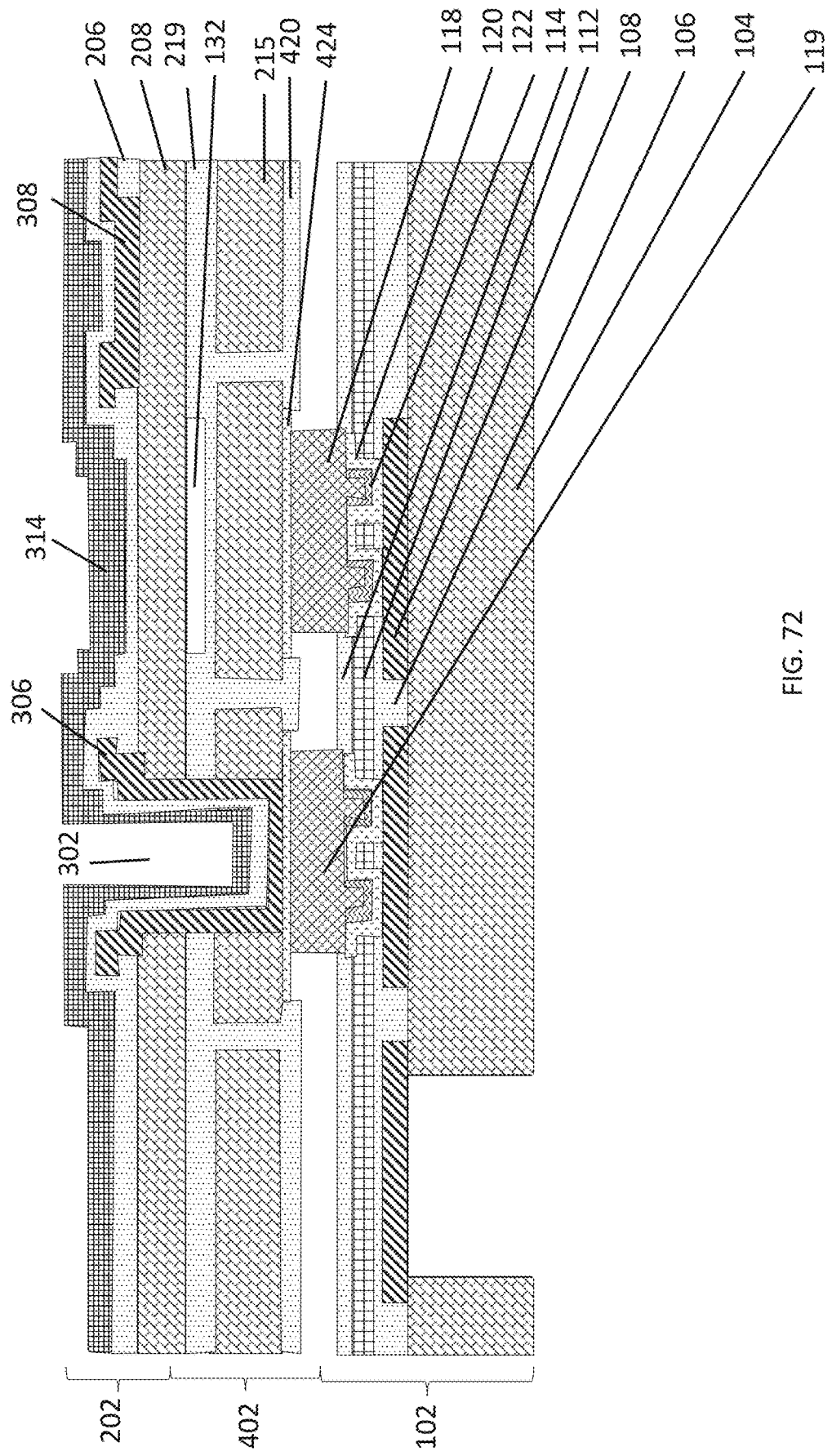

In FIG. 72, a trench 105 is etched (using any suitable etching agent) in the base layer 104.

Figure 73:
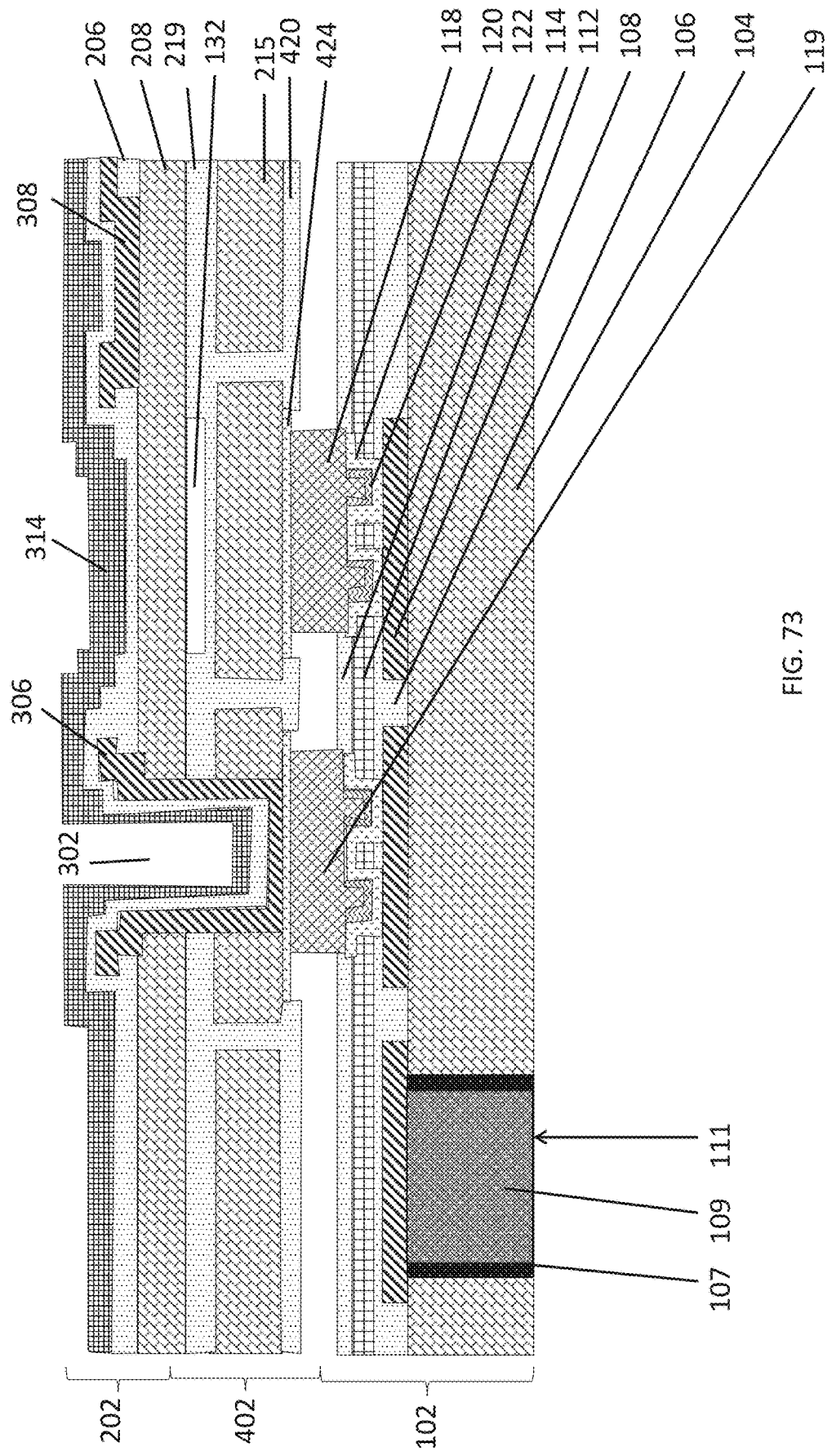

In FIG. 73, a liner material 107 (e.g., e.g., a silicon oxide layer, a barrier layer such as titanium or tantalum, and/or a seed layer such as copper) and a via material 109 (e.g., copper, doped polysilicon, or tungsten) is deposited in the trench 105 to form a through-silicon via (TSV) 111. This may be accomplished in three steps: blanket deposition of the liner material 107, followed by blanket deposition of the via material 109, followed by CMP down to the top of the first substrate 102. The TSV 111 may be coupled (e.g., through an interposer, not shown) to an external device (not shown), thereby enabling transmission of electrical signals from the external device, to the TSV 111, to the metallization 108, and to circuitry within the first substrate 102. The TSV 111 is formed after FEOL processes and BEOL processes. This may be considered a "TSV-Last" process.

In some embodiments, the process shown in FIGS. 39-73 for forming CMUT cavities by bonding two substrates together may be used without forming a TSV. In such embodiments, openings to metallization in the first substrate 102 may be created to facilitate wirebonding the first substrate to an external device. For further discussion of this process, see U.S. Pat. No. 9,067,779 titled "MICROFABRICATED ULTRASONIC TRANSDUCERS AND RELATED APPARATUS AND METHODS," granted on Jun. 30, 2015 (and assigned to the assignee of the instant application) which is incorporated by reference herein in its entirety.

Figure 74:
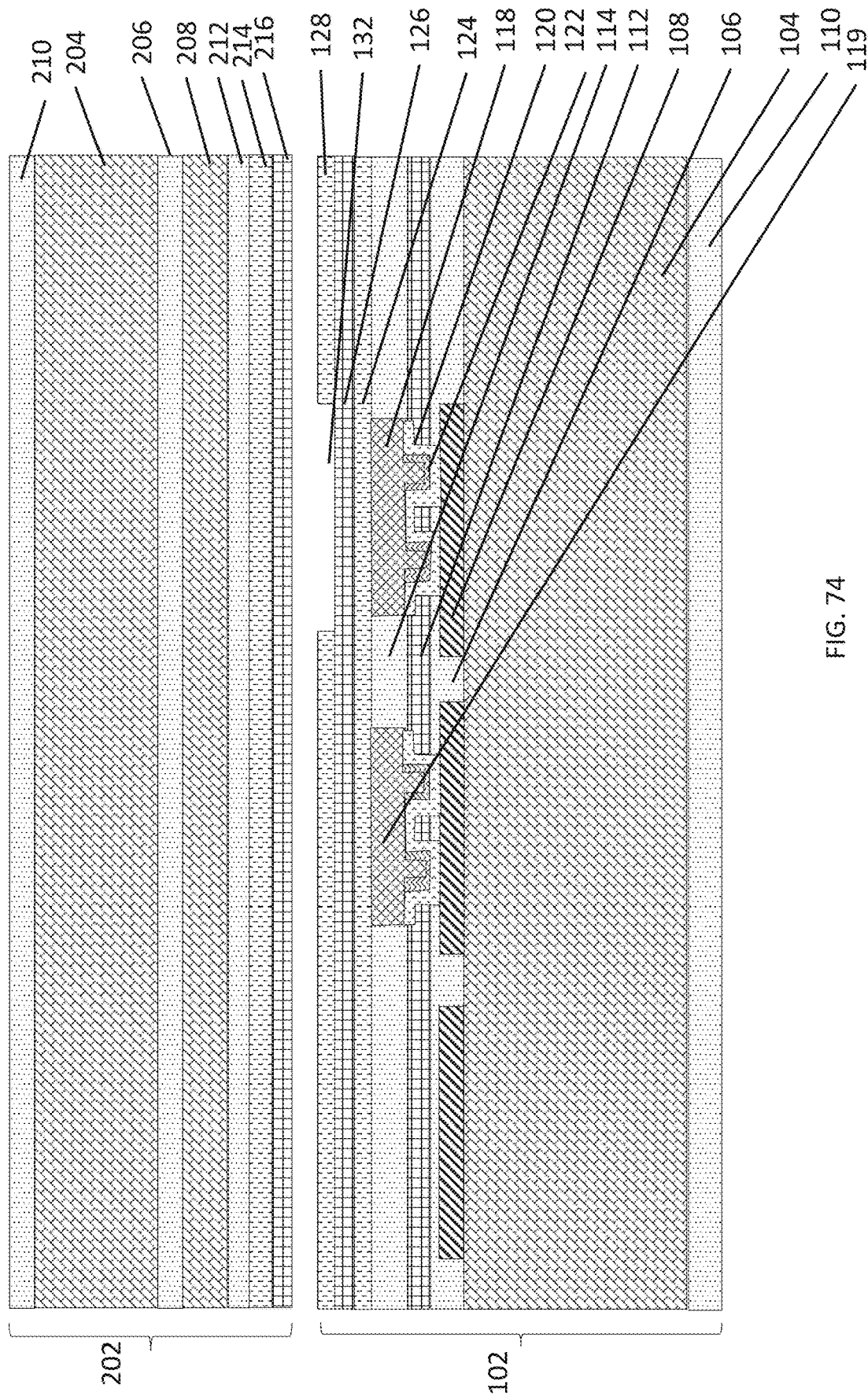
FIGS. 74 and 75 illustrate example cross-sections of an ultrasound transducer device during an alternative fabrication sequence to the sequence shown in FIGS. 1-25.
Figure 75:
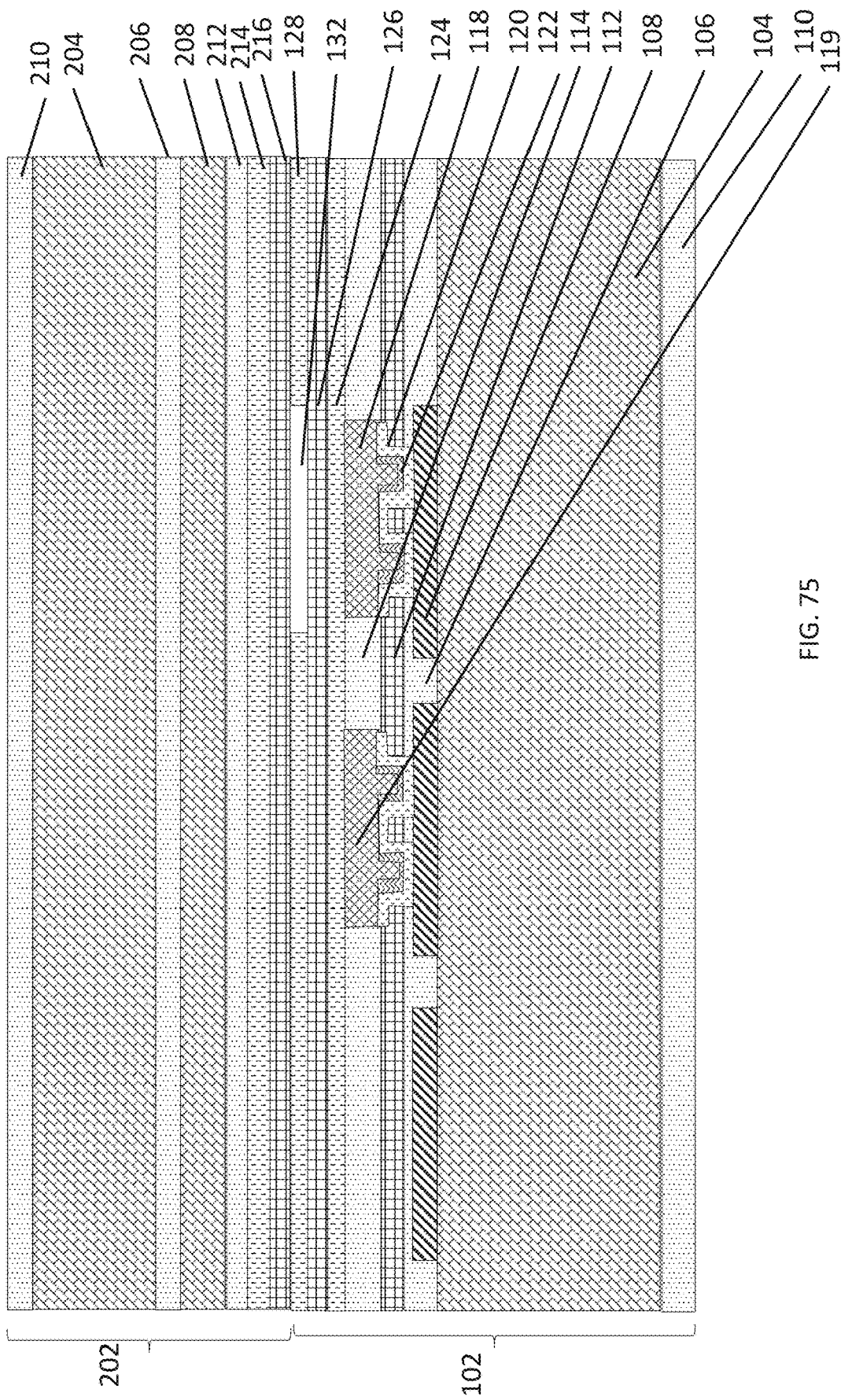

FIGS. 74 and 75 illustrate example cross-sections of an ultrasound transducer device during an alternative fabrication sequence to the sequence shown in FIGS. 1-25. FIG. 74 illustrates an additional two layers, a fourth insulating layer 214 and a fifth insulating layer 216, formed on the second substrate 202 after the fabrication step shown in FIG. 14. In particular, the fourth insulating layer 214 is formed on the oxide layer 212 and the fifth insulating layer 216 is formed on the fourth insulating layer 214. The fourth insulating layer 214 may include, for example, a high quality silicon oxide formed using atomic layer deposition (ALD). The fourth insulating layer 214 may be about 0.001 to 0.100 microns in thickness. For example, the fourth insulating layer 214 may be about 0.02 microns in thickness. The fourth insulating layer 214 may be formed using the same process as the one shown in FIG. 5 for forming the first insulating layer 124. The fifth insulating layer 216 may include aluminum oxide ($Al_2O_3$) formed, for example, by atomic layer deposition (ALD). The fifth insulating layer 216 may be, for example, about 0.005 to 0.100 microns in thickness. For example, the fifth insulating layer 216 may be about 0.03 microns in thickness. The fifth insulating layer 216 may be formed using the same process as the one shown in FIG. 6 for forming the second insulating layer 126. FIG. 75 illustrates bonding of the first substrate 102 and the second substrate 202. Such bonding may, in some embodiments, involve only the use of low temperature (e.g., below 450° C.) which may prevent damage to circuitry on the first substrate 102. In embodiments in which the third insulating layer 128 includes an oxide and the fifth insulating layer 216 includes an oxide, the bond may be an oxide-oxide bond, namely a bond between the third insulating layer 128 (i.e., oxide) and the fifth insulating layer 216 (i.e., oxide). For example, if the third insulating layer 128 includes silicon oxide and the fifth insulating layer 216 includes aluminum oxide, the bond may be a silicon oxide-aluminum oxide bond. In embodiments in which the fifth insulating layer 216 includes aluminum oxide and the second insulating layer 126 includes aluminum oxide, both the top and bottom of the cavity 132 may include aluminum oxide, which as discussed above may help to reduce charging of the top of the cavity (i.e., the top membrane of the cavity) if the top of the cavity contacts the bottom of the cavity during device operation. The remainder of the fabrication sequence may proceed in a similar manner as shown in FIGS. 16-25.

Figure 76:
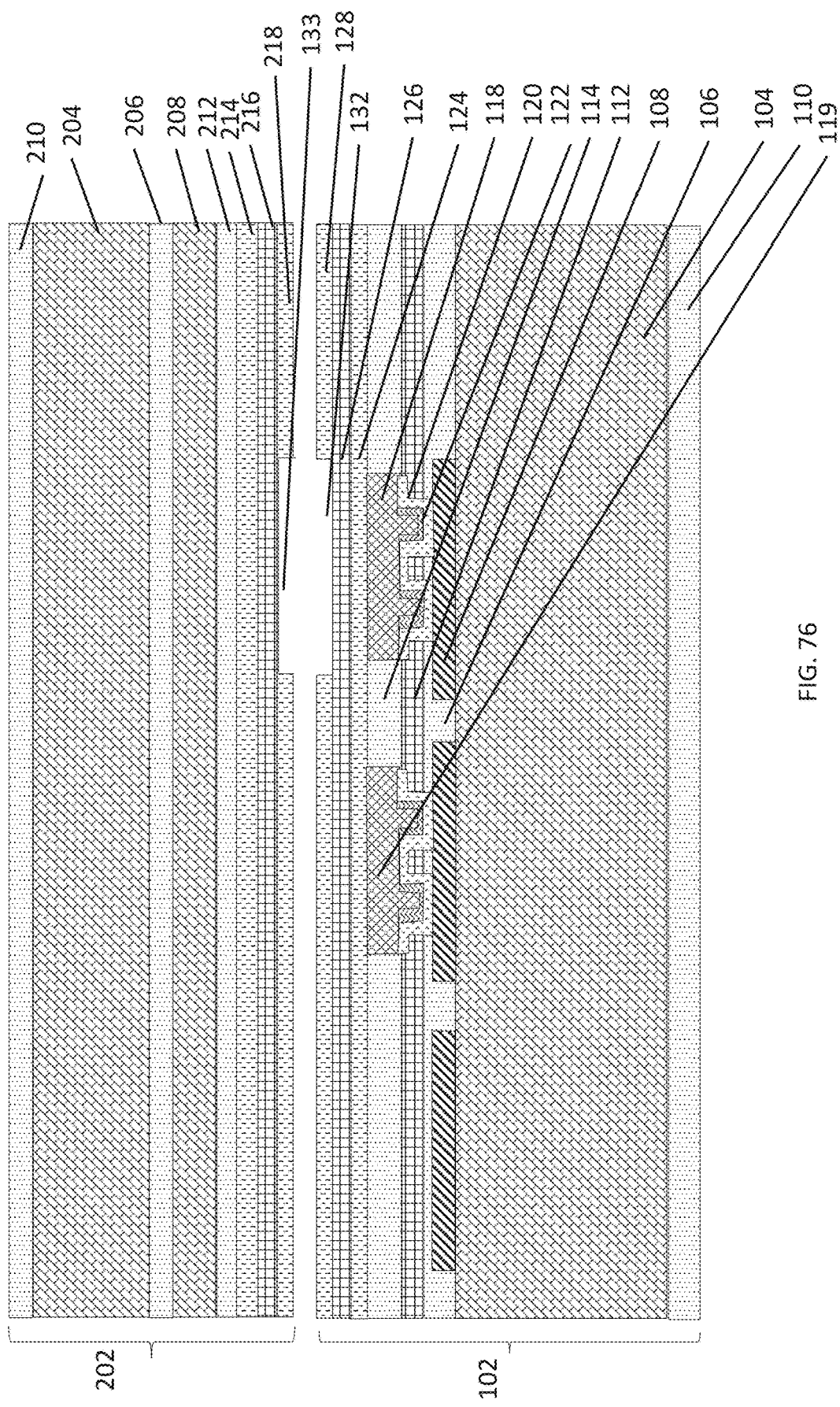
FIGS. 76 and 77 illustrate example cross-sections of an ultrasound transducer device during an alternative fabrication sequence to the sequence shown in FIGS. 1-25.
Figure 77:
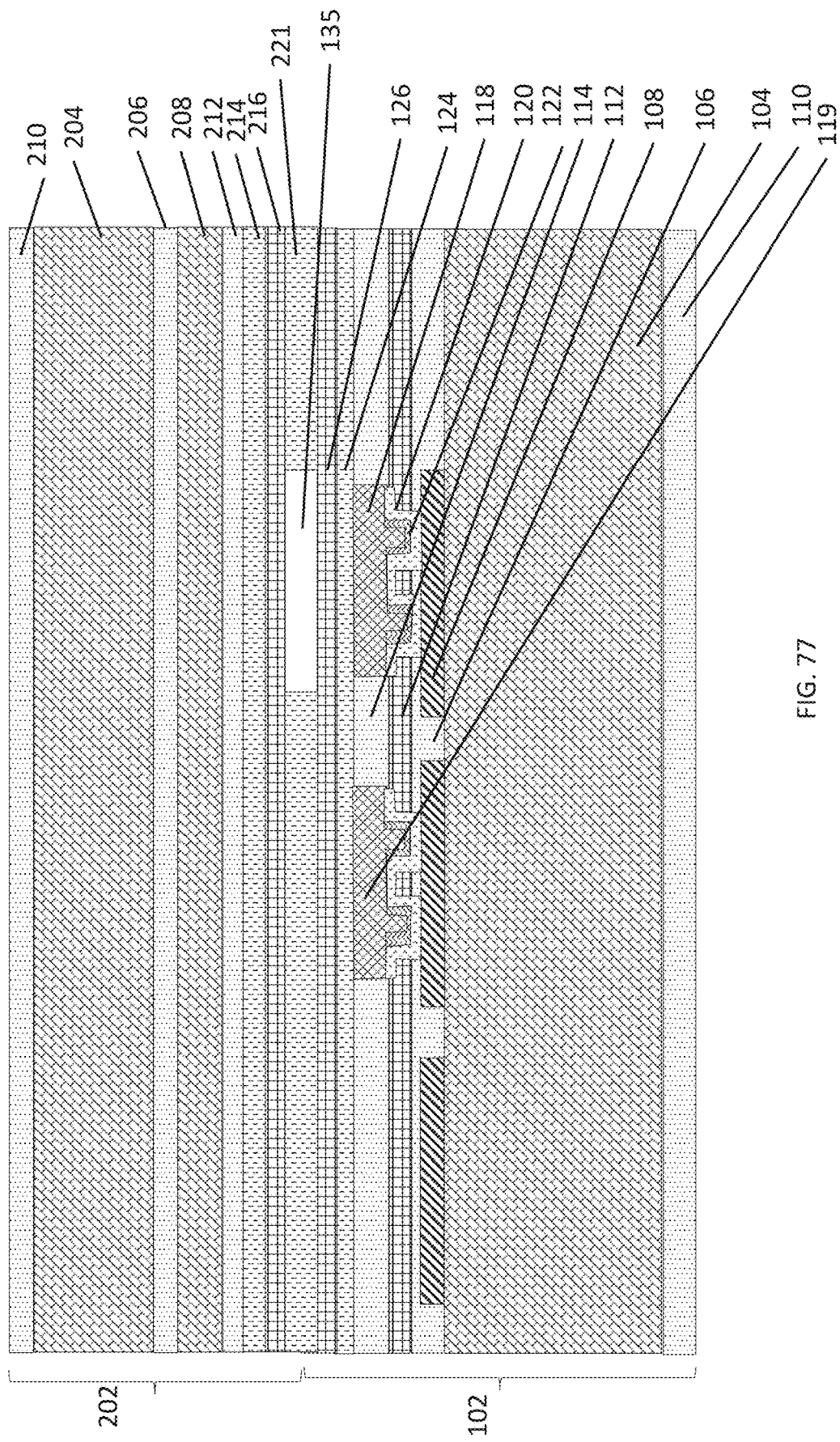

FIGS. 76 and 77 illustrate example cross-sections of an ultrasound transducer device during an alternative fabrication sequence to the sequence shown in FIGS. 1-25. FIG. 76 illustrates an additional three layers, a fourth insulating layer 214, a fifth insulating layer 216, and a sixth insulating layer 218, formed on the second substrate 202. The fourth insulating layer 214 and the fifth insulating layer 216 may be formed in a similar manner as described in FIG. 74. In one embodiment, the sixth insulating layer 218 has an etch selectivity with respect to the fifth insulating layer 216 and may include, for example, silicon oxide formed using plasma-enhanced chemical vapor deposition (PECVD). The third insulating layer 218 may be, for example, about 0.001 to 0.3 microns in thickness. For example, the sixth insulating layer 218 may be about 0.2 microns in thickness. The sixth insulating layer 218 may be formed using the same process as the one shown in FIG. 7 for forming the third insulating layer 128. The sixth insulating layer 218 may be patterned using resist and etching to form a cavity 133 in a similar manner as shown in FIGS. 8-9. FIG. 77 illustrates bonding of the first substrate 102 and the second substrate 202. Such bonding may, in some embodiments, involve only the use of low temperature (e.g., below 450° C.) which may prevent damage to circuitry on the first substrate 102. In embodiments in which the third insulating layer 128 includes an oxide and the sixth insulating layer 218 includes an oxide, the bond may be an oxide-oxide bond, namely a bond between the third insulating layer 128 (i.e., oxide) and the sixth insulating layer 218 (i.e., oxide). For example, if the third insulating layer 128 includes silicon oxide and the sixth insulating layer 218 includes silicon oxide, the bond may be a silicon oxide-silicon oxide bond. In FIG. 77, the combination of the third insulating layer 128 and the sixth insulating layer 218 is shown as an insulating layer 221. In embodiments in which the fifth insulating layer 216 includes aluminum oxide and the second insulating layer 126 includes aluminum oxide, both the top and bottom of the cavity 132 may include aluminum oxide, which as discussed above may help to reduce charging of the top of the cavity (i.e., the top membrane of the cavity) if the top of the cavity contacts the bottom of the cavity during device operation. In some embodiments, the first substrate 102 and the second substrate 202 may be aligned prior to bonding such that upon bonding, the cavity 132 aligns with the cavity 133, as shown in FIG. 77. In FIG. 77, the combination of the cavity 132 and the cavity 133 is shown as a cavity 135. The remainder of the fabrication sequence may proceed in a similar manner as shown in FIGS. 16-25.

It should also be noted that in the alternative fabrication sequence shown in FIGS. 76-77, the cavities 135 of the CMUTs may be formed from two separate cavities 132 and 133 in two separate insulating layers 128 and 218, whereas in other fabrication sequences described herein, the cavities 132 or 133 of the CMUTs may be formed in only one insulating layer 128 or 218. In the alternative fabrication sequence of FIGS. 76-77, the insulating layers 128 and 218 may be approximately half as thick as the insulating layer 128 or 218 in which the cavities 132 or 133 are formed in other fabrication sequences, such that the final cavities 135 of the CMUTs have a similar depth as the cavities 132 or 133 formed in the other fabrication sequences described herein. In some embodiments, a SAM layer may be disposed in both the cavities 132 and 133 such that the final cavities 135 have SAM layers on both their top and bottom surfaces. Further description of SAM layers may be found with reference to FIG. 10.

Figure 78:
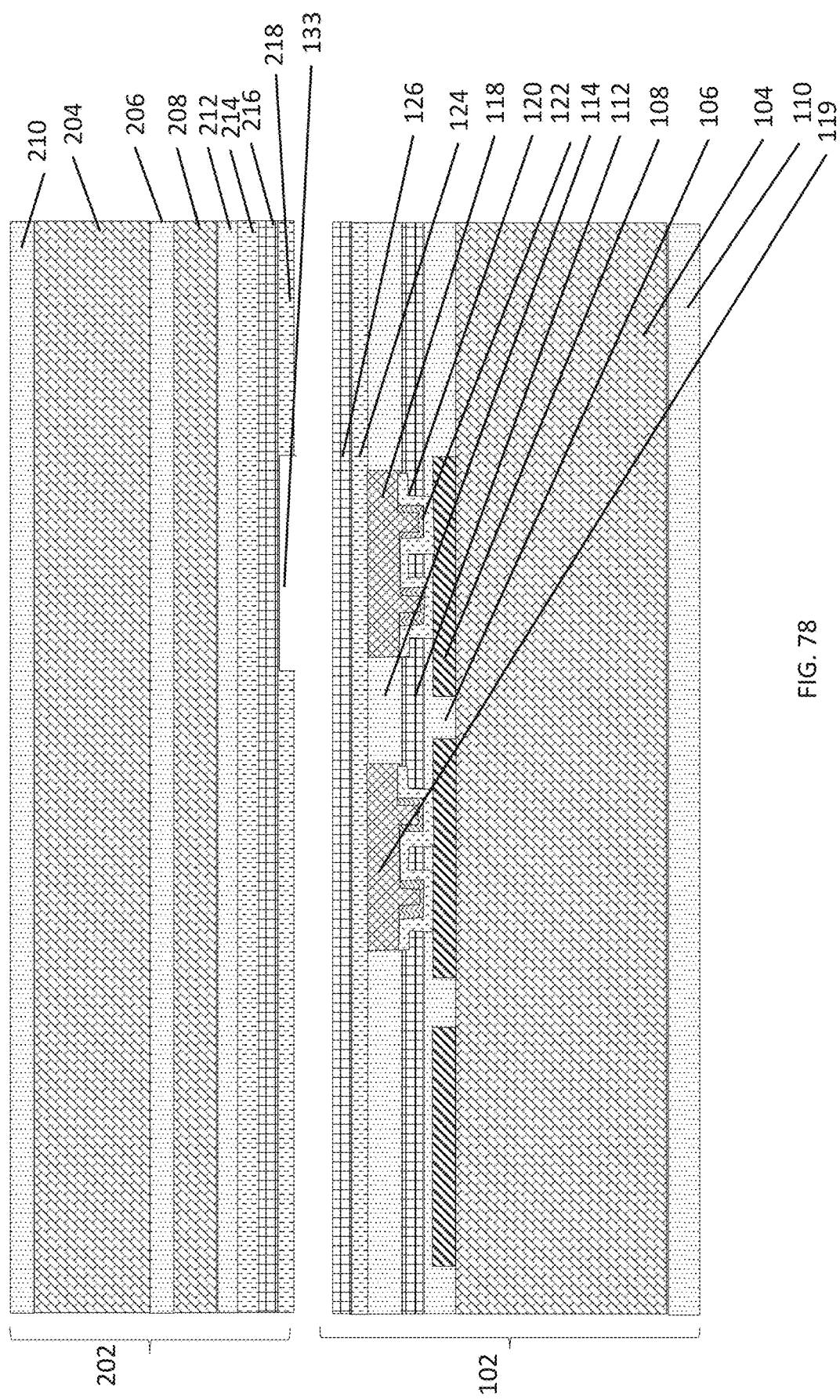
FIGS. 78 and 79 illustrate example cross-sections of an ultrasound transducer device during an alternative fabrication sequence to the sequence shown in FIGS. 1-25.
Figure 79:
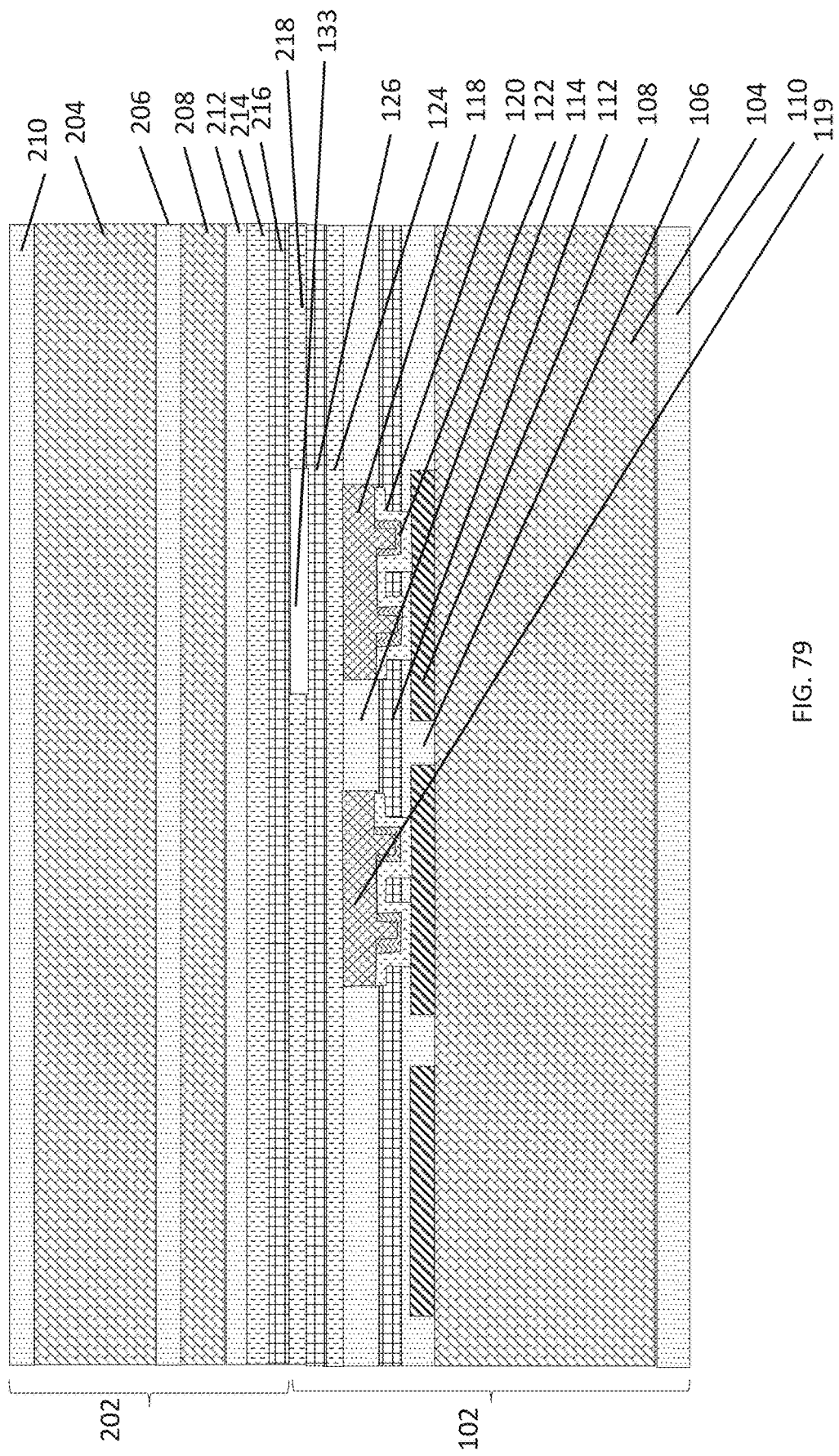

FIGS. 78 and 79 illustrate example cross-sections of an ultrasound transducer device during an alternative fabrication sequence to the sequence shown in FIGS. 1-25. The device as shown in FIG. 78 may be formed in a similar manner as discussed with reference to FIG. 77, except that the third insulating layer 128 and the cavity 132 are absent. FIG. 79 illustrates bonding of the first substrate 102 and the second substrate 202. Such bonding may, in some embodiments, involve only the use of low temperature (e.g., below 450° C.) which may prevent damage to circuitry on the first substrate 102. In embodiments in which the second insulating layer 126 includes an oxide and the sixth insulating layer 218 includes an oxide, the bond may be an oxide-oxide bond, namely a bond between the second insulating layer 126 (i.e., oxide) and the sixth insulating layer 218 (i.e., oxide). For example, if the second insulating layer 126 includes aluminum oxide and the sixth insulating layer 218 includes silicon oxide, the bond may be an aluminum oxide-silicon oxide bond. In embodiments in which the fifth insulating layer 216 includes aluminum oxide and the second insulating layer 126 includes aluminum oxide, both the top and bottom of the cavity 133 (which may be the cavity of a CMUT) may include aluminum oxide, which as discussed above may help to reduce charging of the top of the cavity (i.e., the top membrane of the cavity) if the top of the cavity contacts the bottom of the cavity during device operation. The remainder of the fabrication sequence may proceed in a similar manner as shown in FIGS. 16-25.

Figure 80:
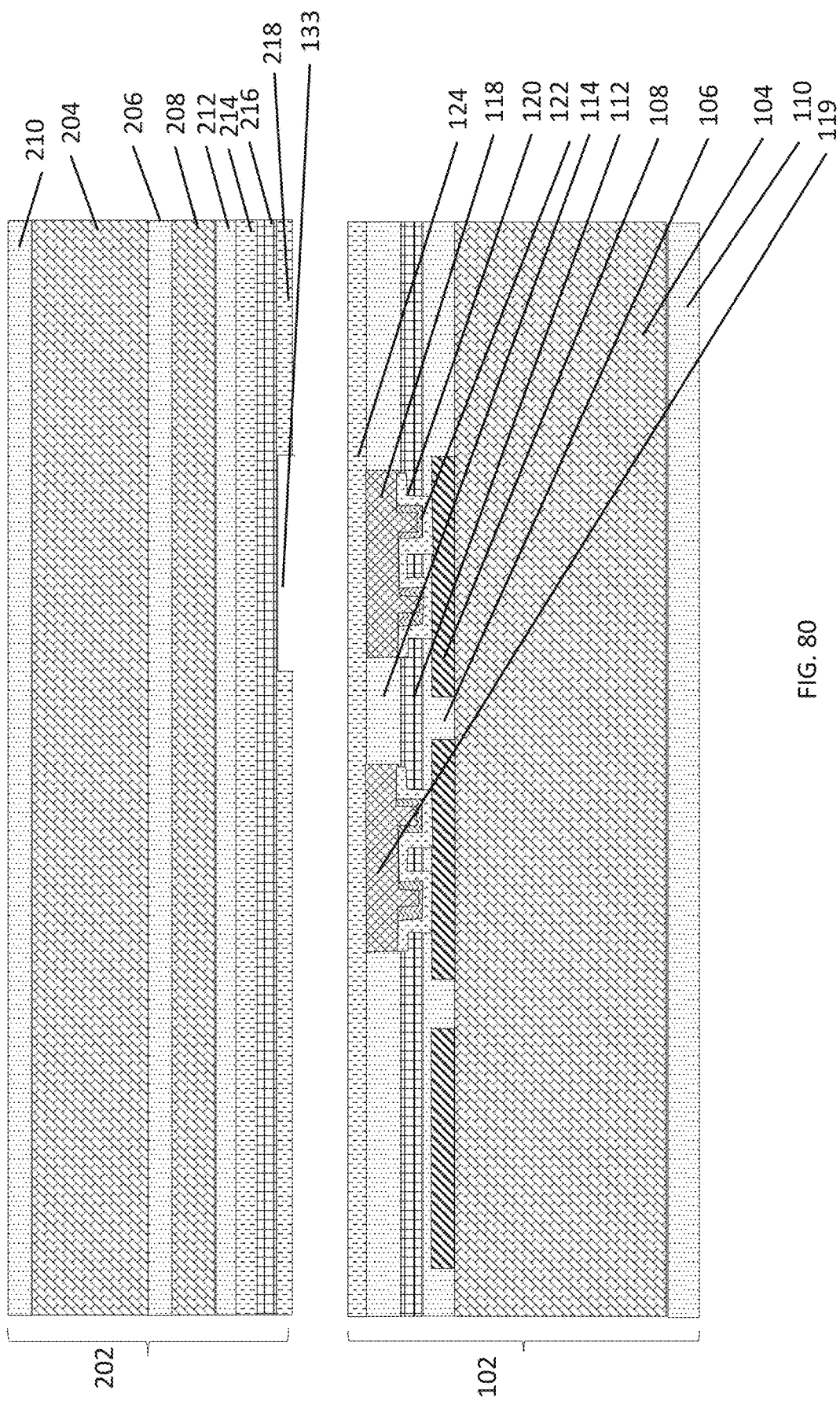
FIGS. 80 and 81 illustrate example cross-sections of an ultrasound transducer device during an alternative fabrication sequence to the sequence shown in FIGS. 1-25.
Figure 81:
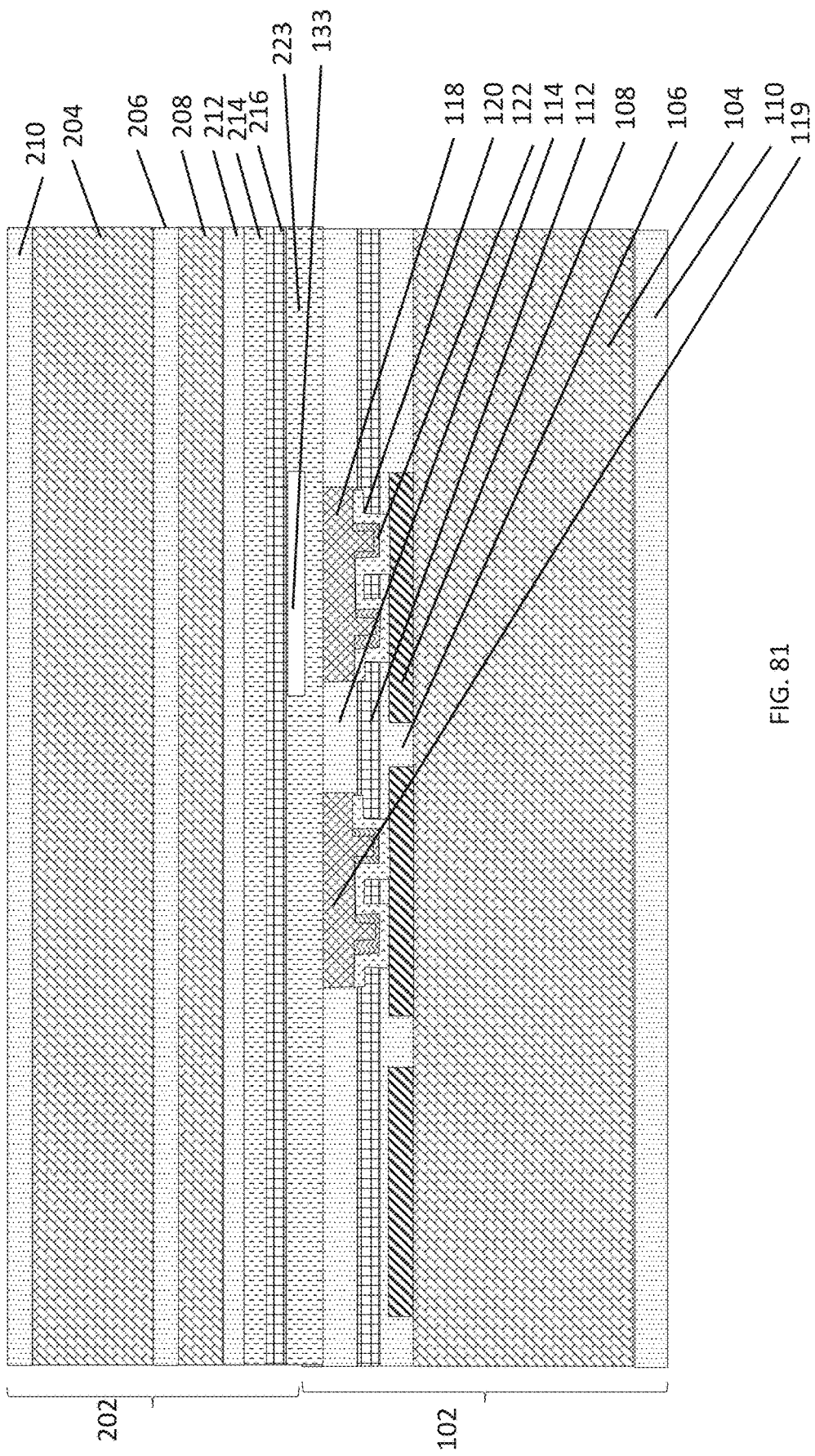

FIGS. 80 and 81 illustrate example cross-sections of an ultrasound transducer device during an alternative fabrication sequence to the sequence shown in FIGS. 1-25. The device as shown in FIG. 80 may be formed in a similar manner as discussed with reference to FIG. 77, except that the third insulating layer 128, the second insulating layer 126, and the cavity 132 are absent. FIG. 81 illustrates bonding of the first substrate 102 and the second substrate 202. Such bonding may, in some embodiments, involve only the use of low temperature (e.g., below 450° C.) which may prevent damage to circuitry on the first substrate 102. In embodiments in which the first insulating layer 124 includes an oxide and the sixth insulating layer 218 includes an oxide, the bond may be an oxide-oxide bond, namely a bond between the first insulating layer 124 (i.e., oxide) and the sixth insulating layer 218 (i.e., oxide). For example, if the first insulating layer 146 includes silicon oxide and the sixth insulating layer 218 includes silicon oxide, the bond may be a silicon oxide-silicon oxide bond. In FIG. 81, the combination of the first insulating layer 124 and the sixth insulating layer 218 is shown as an insulating layer 223. In embodiments in which the fifth insulating layer 216 includes aluminum oxide, the top of the cavity 133 (which may be the cavity of a CMUT) may include aluminum oxide, which as discussed above may help to reduce charging of the top of the cavity (i.e., the top membrane of the cavity) if the top of the cavity contacts the bottom of the cavity during device operation. The remainder of the fabrication sequence may proceed in a similar manner as shown in FIGS. 16-25.

It should be noted that certain of the alternative fabrication sequences shown in FIGS. 74-81 may result in the top membranes of CMUTs having more layers than the top membranes of CMUTs formed using the fabrication sequence of FIGS. 1-25. For example, the fabrication sequences shown in FIGS. 74-81 may result in the top membrane including an extra insulating layer 214, insulating layer 216, an/or insulating layer 218 in addition to the silicon device layer 208 and the oxide layer 212, compared with the top membrane formed using the fabrication sequence of FIGS. 1-25, in which the top membrane may include the silicon device layer 208 and the oxide layer 212 but not the additional layers. In the alternative fabrication sequences shown in FIGS. 74-81, the thicknesses of the insulating layer 214, insulating layer 216, insulating layer 218, silicon device layer 208, and/or oxide layer 212 may be controlled such that the top membrane has a similar thickness as the top membrane formed using the fabrication sequence of FIGS. 1-25.

It should be appreciated that the alternative fabrication sequences shown in FIGS. 74-81 may be applied to the fabrication sequences shown in FIGS. 26-42 as well. It should also be appreciated that while any of the above fabrication sequences may discuss forming oxide (e.g., silicon oxide or aluminum oxide) using ALD, any other process for forming these oxides may alternatively be used.

Figure 82:
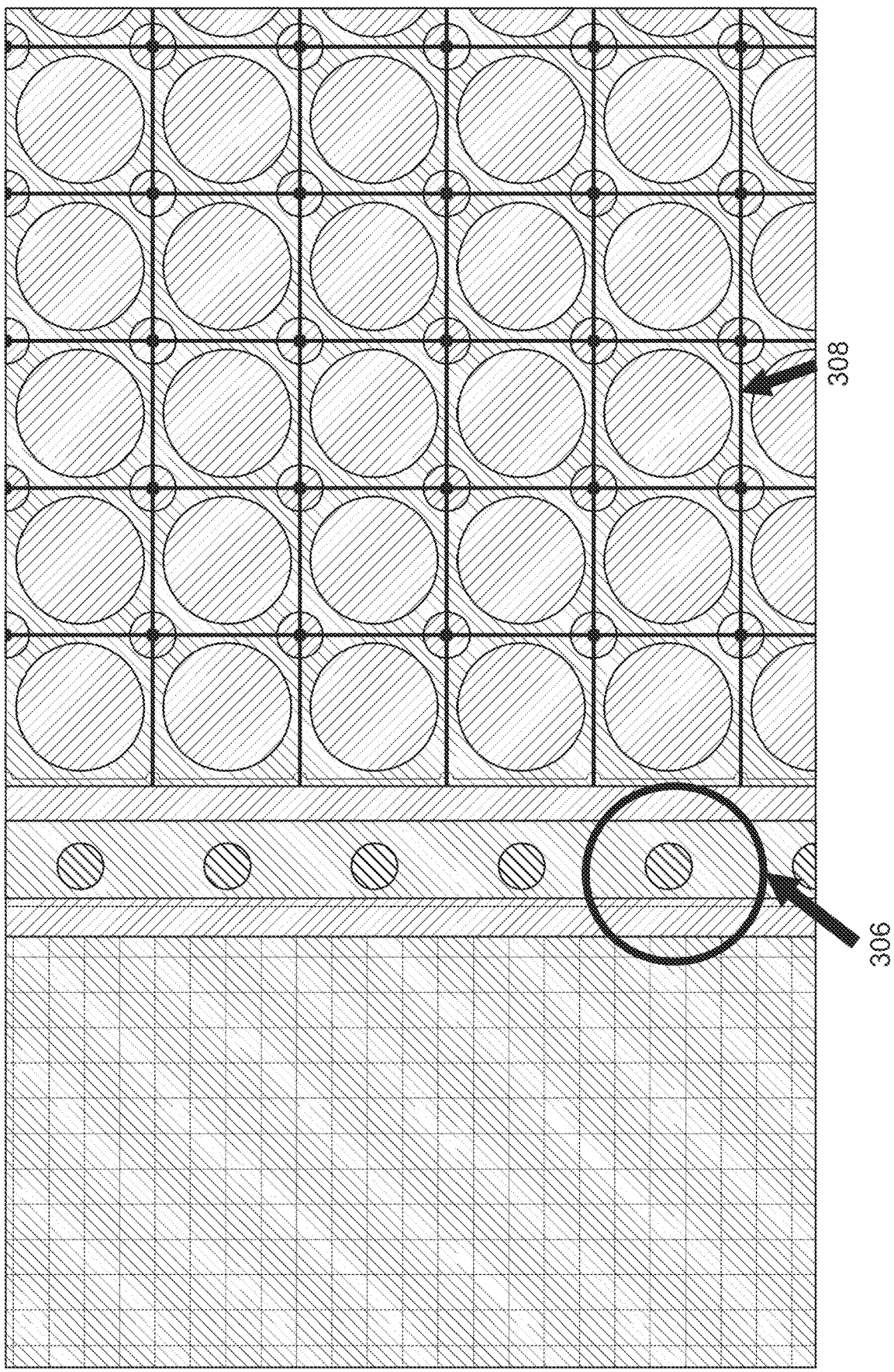
FIG. 82 shows an example top view of an ultrasound transducer device formed using any of the fabrication sequences described herein.

FIG. 82 shows an example top view of an ultrasound transducer device formed using any of the fabrication sequences described herein. FIG. 82 illustrates an example location of the metal 306 that electrically connects the bonding point/electrode on the first substrate 102 with the top membrane of one or more CMUTs. FIG. 82 further illustrates an example location of the metal 308 that distributes an electrical signal from the metal 306 to the top membranes of CMUTs at other locations of the ultrasound transducer device. The metal 306 and the metal 308 are electrically connected to each other, and may be implemented in the same or different metal layers.

Various methods for forming ultrasound transducer devices have been described and illustrated. FIGS. 83-86 illustrate alternative processes to each other for fabricating ultrasound transducer devices having sealed cavities and integrated circuitry, and making electrical connection to the integrated circuitry.

Figure 83:
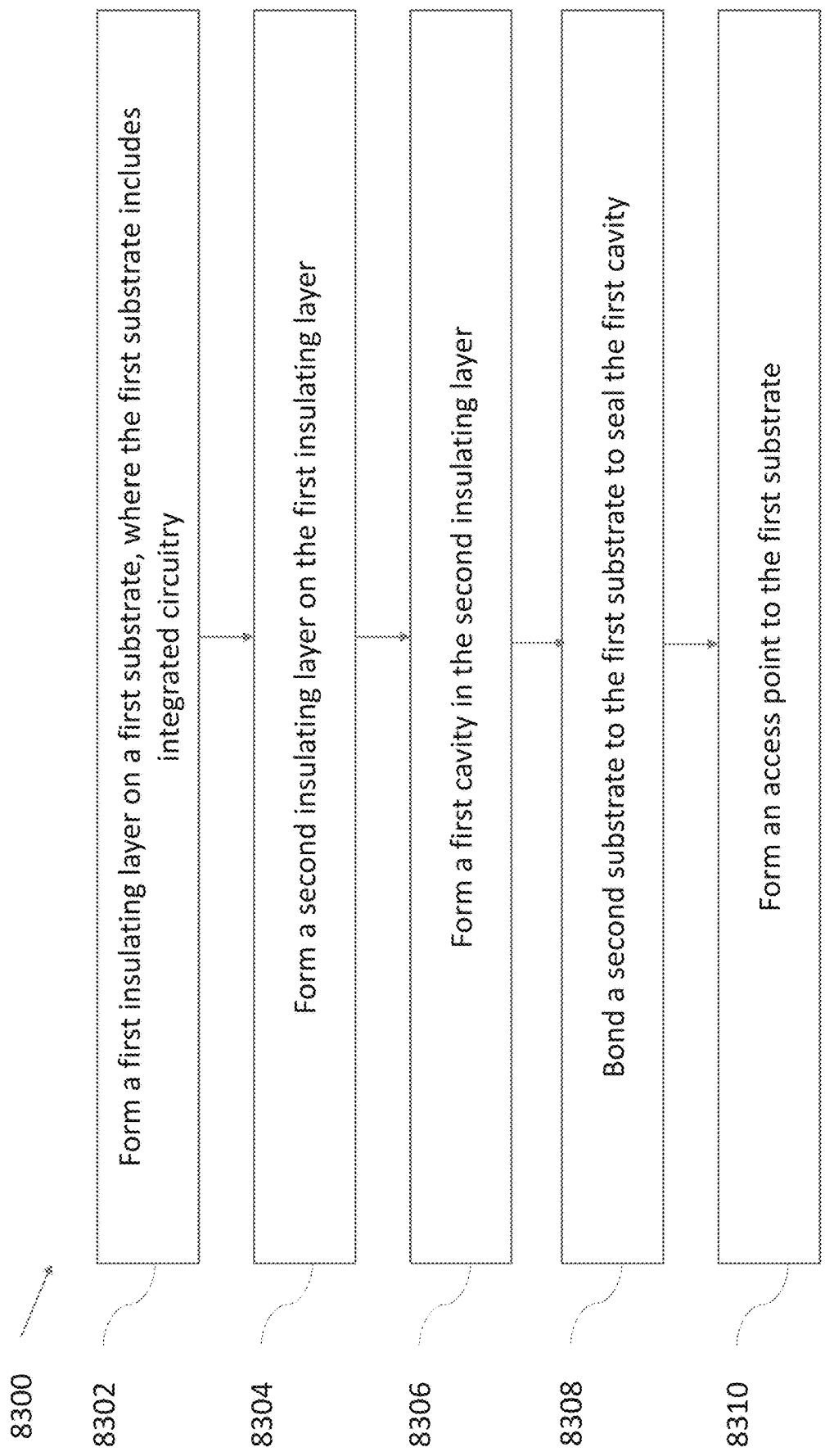
FIG. 83 illustrates an example process for fabricating an ultrasound transducer device.

FIG. 83 illustrates an example process 8300 for fabricating an ultrasound transducer device.

In act 8302, a first insulating layer is formed on a first substrate, where the first substrate includes integrated circuitry. Further description of act 8302 may be found with reference to FIG. 6. The process 8300 proceeds from act 8302 to act 8304.

In act 8304, a second insulating layer is formed on the first insulating layer. Further description of act 8304 may be found with reference to FIG. 7. The process 8300 proceeds from act 8304 to act 8306.

In act 8306, a first cavity is formed in the second insulating layer. Further description of act 8306 may be found with reference to FIG. 8-11. Further description of acts 8302, 8304, and 8306 may also be found with reference to FIGS. 74 and 76. The process 8300 proceeds from act 8306 to act 8308.

In act 8308, a second substrate is bonded to the first substrate to seal the first cavity. Further description of act 8308 may be found with reference to FIGS. 16, 75, and 77. The process 8300 proceeds from act 8308 to act 8310.

In act 8310, an access point is formed to the first substrate. The access point may be for wirebonding to the first substrate. Further description of act 8310 may be found with reference to FIG. 25.

Figure 84:
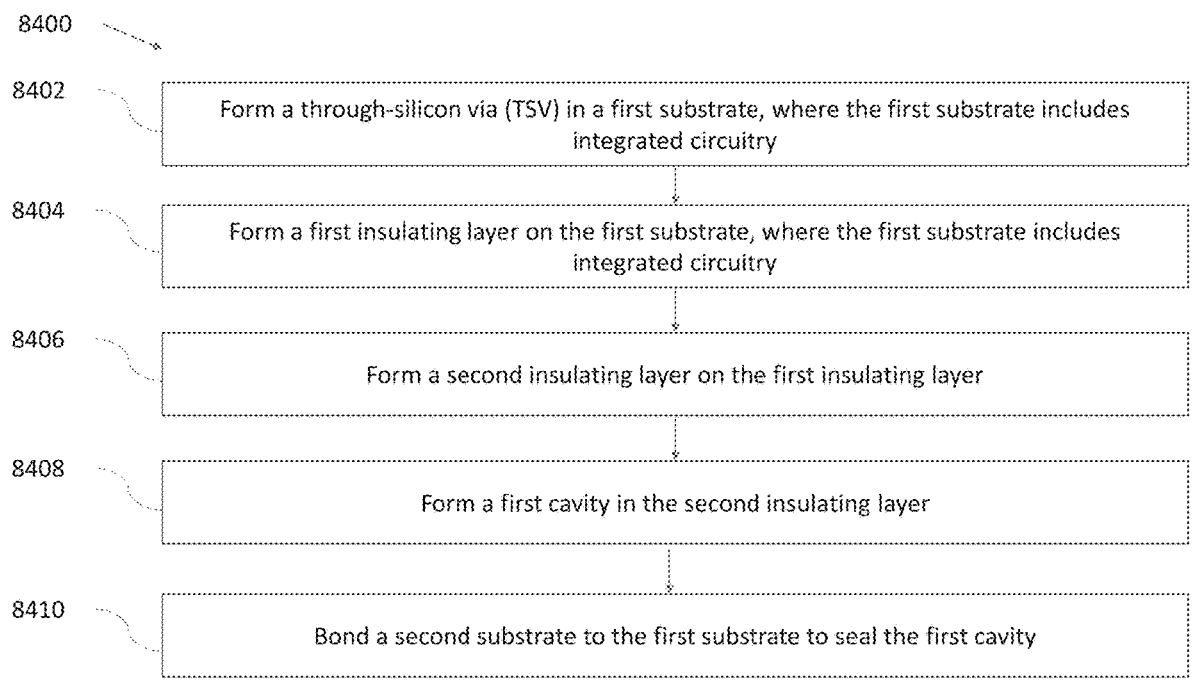
FIG. 84 illustrates another example process for fabricating an ultrasound transducer device.

FIG. 84 illustrates an example process 8400 for fabricating an ultrasound transducer device.

In act 8402, a through-silicon via (TSV) is formed in the first substrate, where the first substrate includes integrated circuitry. Further description of act 8402 may be found with reference to FIGS. 26-29. The process 8400 proceeds from act 8402 to act 8404.

In act 8404, a first insulating layer is formed on a first substrate. Further description of act 8404 may be found with reference to FIG. 6. The process 8400 proceeds from act 8404 to act 8406.

In act 8406, a second insulating layer is formed on the first insulating layer. Further description of act 8406 may be found with reference to FIG. 7. The process 8400 proceeds from act 8406 to act 8408.

In act 8408, a first cavity is formed in the second insulating layer. Further description of act 8408 may be found with reference to FIG. 8-11. Further description of acts 8404, 8406, and 8408 may also be found with reference to FIGS. 74 and 76. The process 8400 proceeds from act 8408 to act 8410.

In act 8410, a second substrate is bonded to the first substrate to seal the first cavity. Further description of act 8410 may be found with reference to FIGS. 30, 75, and 77.

Figure 85:
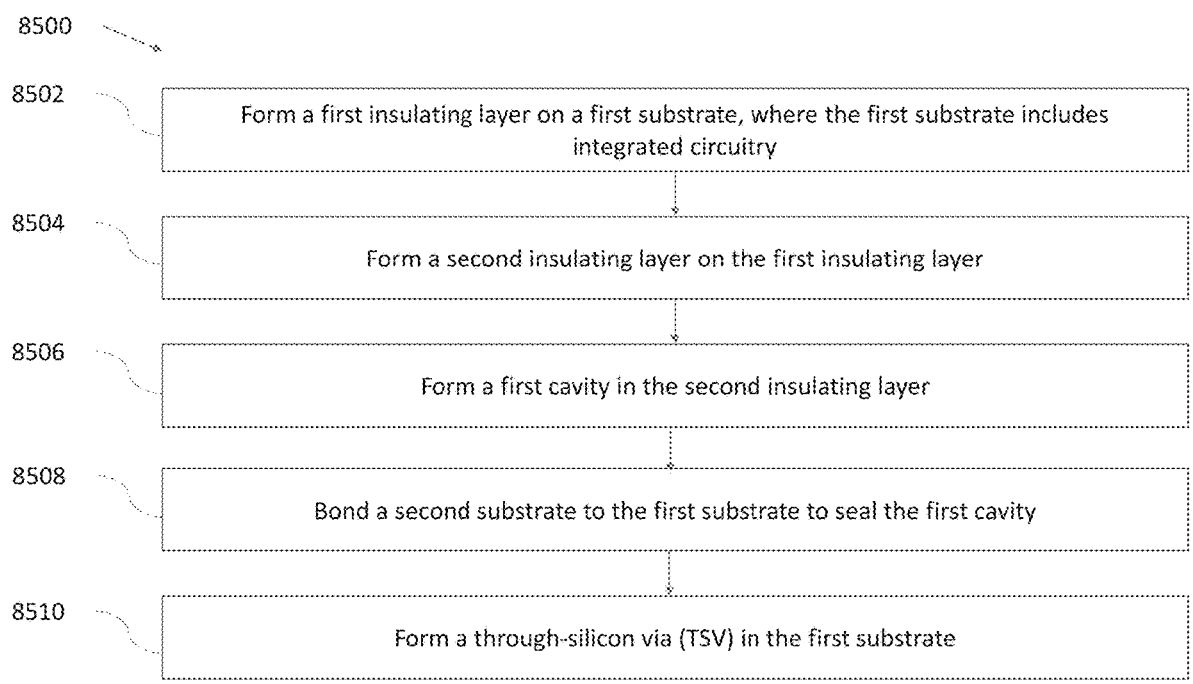
FIG. 85 illustrates another example process for fabricating an ultrasound transducer device.

FIG. 85 illustrates an example process 8500 for fabricating an ultrasound transducer device.

In act 8502, a first insulating layer is formed on a first substrate, where the first substrate includes integrated circuitry. Further description of act 8502 may be found with reference to FIG. 6. The process 8500 proceeds from act 8502 to act 8504.

In act 8504, a second insulating layer is formed on the first insulating layer. Further description of act 8504 may be found with reference to FIG. 7. The process 8500 proceeds from act 8504 to act 8506.

In act 8506, a first cavity is formed in the second insulating layer. Further description of act 8506 may be found with reference to FIG. 8-11. Further description of acts 8502, 8504, and 8506 may also be found with reference to FIGS. 74 and 76. The process 8500 proceeds from act 8506 to act 8508.

In act 8508, a second substrate is bonded to the first substrate to seal the first cavity. Further description of act 8508 may be found with reference to FIGS. 16, 75, and 77. The process 8500 proceeds from act 8508 to act 8510.

In act 8510, a through-silicon via (TSV) is formed in the first substrate. Further description of act 8510 may be found with reference to FIGS. 41-42.

Figure 86:
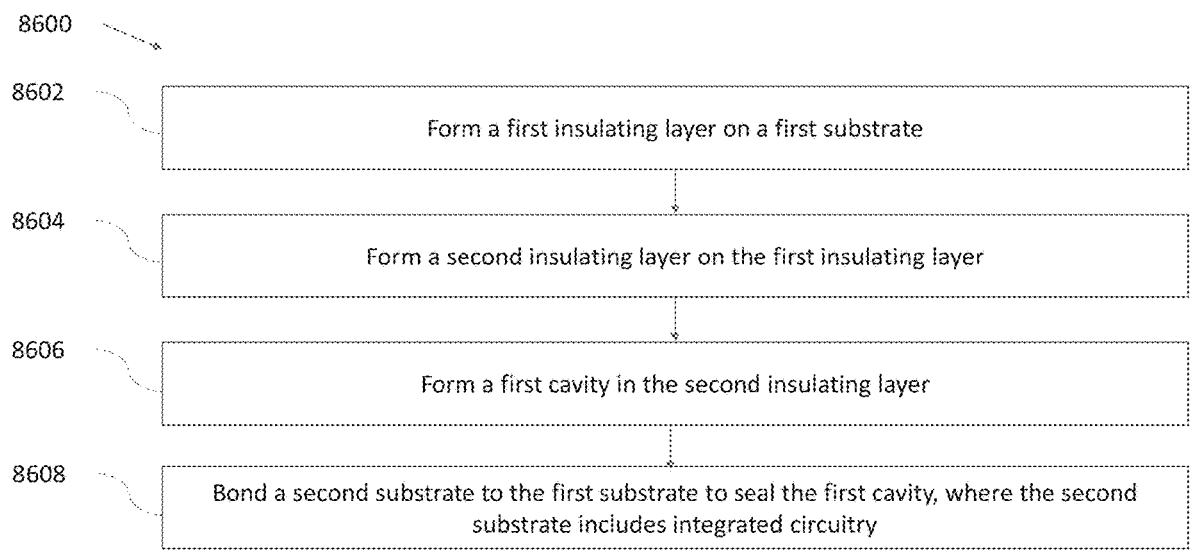
FIG. 86 illustrates another example process for fabricating an ultrasound transducer device.

FIG. 86 illustrates an example process 8600 for fabricating an ultrasound transducer device.

In act 8602, a first insulating layer is formed on a first substrate, where the first substrate includes integrated circuitry. The process 8600 proceeds from act 8602 to act 8604.

In act 8604, a second insulating layer is formed on the first insulating layer. The process 8600 proceeds from act 8604 to act 8606.

In act 8606, a first cavity is formed in the second insulating layer. Further description of acts 8602, 8604, and 8606 may be found with reference to FIGS. 76, 78, and 80. The process 8600 proceeds from act 8606 to act 8608.

In act 8608, a second substrate is bonded to the first substrate to seal the first cavity. Further description of act 8608 may be found with reference to FIGS. 77, 79, and 81.

In some embodiments, a TSV may be formed in the second substrate prior to act 8602, as described above with reference to FIGS. 26-29. In some embodiments, a TSV may be formed in the second substrate subsequent to act 8608, as described above with reference to FIGS. 41-42. In some embodiments, an access point to the second substrate may be formed subsequent to act 8608, as described above with reference to FIG. 25. The access point may be for wirebonding to the second substrate.

Various inventive concepts may be embodied as one or more processes, of which examples have been provided. The acts performed as part of each process may be ordered in any suitable way. Thus, embodiments may be constructed in which acts are performed in an order different than illustrated, which may include performing some acts simultaneously, even though shown as sequential acts in illustrative embodiments. Further, one or more of the processes may be combined and/or omitted, and one or more of the processes may include additional steps.

Various aspects of the present disclosure may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

As used herein, reference to a numerical value being between two endpoints should be understood to encompass the situation in which the numerical value can assume either of the endpoints. For example, stating that a characteristic has a value between A and B, or between approximately A and B, should be understood to mean that the indicated range is inclusive of the endpoints A and B unless otherwise noted.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Having described above several aspects of at least one embodiment, it is to be appreciated various alterations, modifications, and improvements will readily occur to those skilled in the art. Such alterations, modifications, and improvements are intended to be object of this disclosure. Accordingly, the foregoing description and drawings are by way of example only.

What is claimed is:

1. A method of fabricating an ultrasound transducer device, comprising:
    forming first and second insulating layers on a third insulating layer of a first integrated circuit substrate;
    forming a first cavity in the second insulating layer by etching the second insulating layer down to the first insulating layer; and
    bonding a second substrate to the first integrated circuit substrate to seal the first cavity, wherein
    the first insulating layer serves as an etch stop layer for the etching.

2. A method of fabricating an ultrasound transducer device, comprising:
    forming first, second, and third insulating layers on a first integrated circuit substrate, with a first cavity in the second insulating layer; and
    bonding a second substrate to the first integrated circuit substrate to seal the first cavity, wherein
    the first insulating layer is formed on the third insulating layer.

3. The method of claim 2, wherein
    the first insulating layer comprises aluminum oxide.

4. The method of claim 2, wherein
    the second insulating layer comprises silicon oxide.

5. The method of claim 4, wherein
    the second substrate comprises a silicon oxide layer, and
    the bonding of the second substrate to the first integrated circuit substrate comprises forming a silicon oxide-silicon oxide bond between the silicon oxide layer on the second substrate and the second insulating layer on the first integrated circuit substrate.

6. The method of claim 2, further comprising
    forming a fourth insulating layer on the second substrate, wherein the fourth insulating layer comprises aluminum oxide.

7. The method of claim 6, wherein
    the second insulating layer comprises silicon oxide, and
    the bonding of the second substrate to the first integrated circuit substrate comprises forming an aluminum oxide-silicon oxide bond between the fourth insulating layer on the second substrate and the second insulating layer on the first integrated circuit substrate.

8. The method of claim 6, further comprising:
    forming a fifth insulating layer on the fourth insulating layer on the second substrate; and
    forming a second cavity in the fifth insulating layer.

9. The method of claim 8, wherein
    the fifth insulating layer comprises silicon oxide.

10. The method of claim 9, wherein
    the bonding of the second substrate to the first integrated circuit substrate comprises forming a silicon oxide-silicon oxide bond between the fifth insulating layer on the second substrate and the second insulating layer on the first integrated circuit substrate.

11. The method of claim 8, wherein
    the bonding of the second substrate to the first integrated circuit substrate comprises aligning the first cavity with the second cavity.

12. The method of claim 2, wherein
    the third insulating layer comprises silicon oxide.

13. The method of claim 2, wherein
    the second substrate comprises a silicon-on-insulator (SOI) substrate.

14. The method of claim 2, wherein
    a thickness of the first insulating layer is between approximately 0.005 microns to 0.100 microns.

15. The method of claim 2, further comprising
    forming a self-assembled monolayer (SAM) on the first insulating layer within the first cavity.

16. The method of claim 2, wherein
    the forming of the first insulating layer comprises using atomic layer deposition (ALD).

17. The method of claim 2, wherein
    the forming of the second insulating layer comprises using atomic layer deposition (ALD).

18. A method of fabricating an ultrasound transducer device, comprising:
    forming first and second insulating layers on a first integrated circuit substrate, with a first cavity in the second insulating layer;
    bonding a second substrate to the first integrated circuit substrate to seal the first cavity; and
    forming a through-silicon via (TSV) in the first integrated circuit substrate using a TSV-Middle process prior to forming the first and second insulating layers.

19. A method of fabricating an ultrasound transducer device, comprising:
    forming first and second insulating layers on a first integrated circuit substrate, with a first cavity in the second insulating layer;
    bonding a second substrate to the first integrated circuit substrate to seal the first cavity; and
    forming a through-silicon via (TSV) in the first integrated circuit substrate using a TSV-Last process subsequent to bonding the second substrate to the first integrated circuit substrate.

* * * * *